(12) United States Patent
Huang et al.

(10) Patent No.: US 10,651,409 B2
(45) Date of Patent: May 12, 2020

(54) NARROWBAND NANOCOMPOSITE PHOTODETECTOR

(71) Applicant: NUtech Ventures, Lincoln, NE (US)

(72) Inventors: Jinsong Huang, Lincoln, NE (US); Fawen Guo, Lincoln, NE (US); Liang Shen, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 271 days.

(21) Appl. No.: 15/364,064

(22) Filed: Nov. 29, 2016

(65) Prior Publication Data

US 2017/0077429 A1 Mar. 16, 2017

Related U.S. Application Data

(63) Continuation-in-part of application No. 13/946,975, filed on Jul. 19, 2013, now Pat. No. 9,685,567.

(60) Provisional application No. 61/673,787, filed on Jul. 20, 2012.

(51) Int. Cl.
*H01L 51/00* (2006.01)
*H01L 51/42* (2006.01)
*H01L 31/0256* (2006.01)
*B82Y 20/00* (2011.01)

(52) U.S. Cl.
CPC ........ *H01L 51/4273* (2013.01); *H01L 51/426* (2013.01); *B82Y 20/00* (2013.01); *H01L 51/0036* (2013.01); *H01L 51/0042* (2013.01); *H01L 51/0072* (2013.01); *H01L 51/0094* (2013.01); *H01L 2031/0344* (2013.01); *H01L 2251/301* (2013.01); *H01L 2251/303* (2013.01); *H01L 2251/308* (2013.01); *Y02E 10/549* (2013.01)

(58) Field of Classification Search
CPC ............... H01L 51/4273; H01L 51/426; H01L 51/0042; H01L 2251/303; H01L 2251/301; H01L 2031/0344; H01L 51/0094; H01L 51/0036; H01L 51/0072; H01L 2251/308; H01L 31/022483; H01L 31/0392; H01L 31/02; H01L 31/022475; B82Y 20/00; Y02E 10/549
USPC ............. 250/200; 252/514, 512; 257/21, 40, 257/184; 977/773
See application file for complete search history.

(56) References Cited

U.S. PATENT DOCUMENTS

| | | | |
|---|---|---|---|
| 7,270,871 B2 | 9/2007 | Jiang et al. | |
| 9,425,420 B2 * | 8/2016 | Yang | H01L 27/302 |
| 9,685,567 B2 * | 6/2017 | Huang | H01L 31/02 |
| 2009/0072717 A1 * | 3/2009 | Yang | H01L 51/5036 |
| | | | 313/504 |
| 2010/0127247 A1 * | 5/2010 | Yang | B82Y 10/00 |
| | | | 257/40 |
| 2011/0186830 A1 | 8/2011 | Burroughes et al. | |
| 2012/0118368 A1 | 5/2012 | Huang et al. | |
| 2012/0132898 A1 | 5/2012 | Pan et al. | |
| 2013/0153866 A1 | 6/2013 | Chen et al. | |
| 2013/0161596 A1 | 6/2013 | Huang et al. | |
| 2014/0054442 A1 * | 2/2014 | Huang | H01L 31/02 |
| | | | 250/200 |
| 2014/0263945 A1 | 9/2014 | Huang et al. | |
| 2016/0204367 A1 * | 7/2016 | Forrest | H01L 51/4273 |
| | | | 257/40 |
| 2016/0218307 A1 * | 7/2016 | Huang | H01L 51/4213 |
| 2016/0254471 A1 * | 9/2016 | Forrest | H01L 51/424 |
| | | | 136/263 |
| 2018/0374650 A1 * | 12/2018 | Huang | H01G 9/2009 |

OTHER PUBLICATIONS

"External quantum efficiency", CleanEnergyWIKI, Oct. 19, 2011, 3 pages. (Year: 2011).*
Aizawa et al., Instant Low-Temperature Cross-Linking of Poly (N-vinylcalbazole) for Solution-Processed Multilayer Blue Phosphorescent Organic Light-Emitting Devices, Adv. Mater., 2014, 26: 7543-7546.
Alivisatos, "The use of nanocrystals in biological detection," Nature Biotechnology, Jan. 2004, 22: 47-52.
Armin et al., "Narrowband light detection via internal quantum efficiency manipulation of organic photodiodes," Nat. Commun., 2015, 6:6343.
Baeg et al., "Organic Light Detectors: Photodiodes and Phototransistors," Adv. Mater., 2013, 25: 4267-4295.
Carr and Chaudhary, "The identification, characterization and mitigation of defect states in organic photovoltaic devices: a review and outlook," Energy Environ. Sci., 2013, 6: 3414.
Chen et al., "Nanoparticle-assisted high photoconductive gain in composites of polymer and fullerene," Nature Nanotechnology, Sep. 2008, 3: 543-547.
Dong et al., "An Ultraviolet-to-NIR Broad Spectral Nanocomposite Photodetector with Gain," Adv. Opt. Mater., 2014, 2: 549-554.
Fang and Huang, Resolving Weak Light of Sub-picowatt per Square Centimeter by Hybrid Perovskite Photodetectors Enabled by Noise Reduction, Adv. Mater., 2015, 27: 2804-2810.
Fang et al., "Large Gain, Low Noise Nanocomposite Ultraviolet Photodetectors with a Linear Dynamic Range of 120 dB," Adv. Opt. Mater., 2014, 2: 348-353.
Gong et al., "High-Detectivity Polymer Photodetectors with Spectral Response from 300 nm to 1450 nm," Science, Sep. 2009, 325: 1665-1667.
Guo et al., "A nanocomposite ultraviolet photodetector based on interfacial trap-controlled charge injection," Nat. Nanotech., Dec. 2012, 7: 798-802.

(Continued)

*Primary Examiner* — Douglas J McGinty
(74) *Attorney, Agent, or Firm* — Fish & Richardson P.C.

(57) ABSTRACT

A photodetector includes an anode that is transparent or partially transparent to light, a cathode and an active layer disposed between the anode and the cathode. The active layer includes a nanocomposite material that has a polymer blended with nanoparticles or organic electron trapping particles. The photodetector has a low dark current when not illuminated by light and has a high conductivity when illuminated by light, in which the light passes the anode and is absorbed by the active layer. The active layer has a thickness selected such that the photodetector has a narrowband spectral response.

56 Claims, 35 Drawing Sheets

(56) References Cited

OTHER PUBLICATIONS

IUPAC, Compendium of Chemical Terminology, 2nd ed. (the "Gold Book") (1997). Online corrected version: (2006—) "Beer—Lambert law.".

Kelley et al., "Advancing the speed, sensitivity and accuracy of biomolecular detection using multi-length-scale engineering," Nat. Nanotechnol., Dec. 2014, 9: 969-980.

Konstantatos and Sargent, "Nanostructured materials for photon detection," Nature Nanotechnology, Jun. 2010, 5: 391-400.

Liu, Chapter 14: Photodetectors, In Photonic Devices, (Ed: J.-M. Liu ), Cambridge University Press, Cambridge, UK, 2005, 93 pages.

Matsumoto et al., "On-site quantitative elemental analysis of metal ions in aqueous solutions by underwater laser-induced breakdown spectroscopy combined with electrodeposition under controlled potential," Anal. Chem., 2015, 87: 1655-61.

Shen et al., "A Highly Sensitive Narrowband Nanocomposite Photodetector with Gain," Adv. Mater., 2016, 28: 2043-2048.

Shen et al., "Improving the sensitivity of a near-infrared nanocomposite photodetector by enhancing trap induced hole injection," Appl. Phys. Lett., 2015, 106: 023301.

Wei et al., "Trap Engineering of CdTe Nanoparticle for High Gain, Fast Response, and Low Noise P3HT:CdTe Nanocomposite Photodetectors," Advanced Materials, 2015, 27: 4975-4981.

Yu et al., "Formation and Stability of Size-, Shape-, and Structure-Controlled CdTe Nanocrystals: Ligand Effects on Monomers and Nanocrystals," Chem. Mater., 2003, 15: 4300-4308.

Zhou, "Single-band upconversion nanoprobes for multiplexed simultaneous in situ molecular mapping of cancer biomarkers," Nat. Commun., 2015, 6: 6938.

Arnold et al., "Broad Spectral Response Using Carbon Nanotube/Organic Semiconductor/C60 Photodetectors," NANO Letters, 2009, 9:3354-3358.

Huynh et al., "Hybrid Nanorod-Polymer Solar Cells," Science, 2002, 295:2425-2427.

Jadhav et al., "Singlet Exciton fission in Nanostructured Organic Solar Cells," NANO Letters, 2011, 11:1495-1498.

Jin et al., "Solution-Processed Ultraviolet Photodectectors Based on Colloidal ZnO Nanoparticles," NANO Letters, 2008, 8:1649-1653.

Kind et al., "Nanowire Ultraviolet Photodetectors and Optical Switches," Advanced Materials, 2002, 14:158-160.

Kline et al., "Highly Oriented Crystals at the Buried Interface in Polythiophene Thin-Film Transistors," Nature Materials, 2006, 5:222-228.

Knoll, Radiation Detection and Measurement, 3rd ed., 2000, John Wiley and Sons, Inc., 274-320.

Konstantatos et al., "Sensitive Solution-Processed Visible-Wavelength Photodetectors," Nature Photonics, 2007, 1:531-534.

Konstantatos et al., "Ultrasensitive Solution-Cast Quantum Dot Photodetectors," Nature, 2006, 442:180-183.

Li and Chou, "Solar-Blind Deep-UV Band-Pass Filter (250-350 Nm) Consisting of a Metal Nano-Grid Fabricated by Nanoimprint Lithography," Optics Express, 2010, 18:931-937.

Liang et al., "ZnO Schottky ultraviolet photodetectors," Journal of Crystal Growth, 2001, 225:110-113.

Liu, "Junction photodiodes," Photonic Devices, 2005, 966-986.

McCulloch et al., "Liquid-Crystalline Semiconducting Polymers with High Charge-Carrier Mobility," Nature Materials, 2006, 5:328-333.

Nozik et al., "Semiconductor Quantum Dots and Quantum Dot Arrays and Application of Multiple Exciton Generation to Third-Generation Photovoltaic Solar Cells," Chemical Reviews, 2010, 110:6873-6890.

Soci et al., "ZnO Nanowire UV Photodetectors with High Internal Gain," NANO Letters, 2007, 7:1003-1009.

Sukhovatkin et al., "Colloidal Quantum-Dot Photodetectors Exploiting Multiexciton Generation," Science, 2009, 324:1542.

Sun et al., "Photovoltaic Devices Using Blends of Branched CdSe Nanoparticles and Conjugated Polymers," NANO Letters, 2003, 3:961-963.

Takahashi and Watanabe, "Recent Progress in CdTe and CdZnTe Detectors," IEEE Transactions on Nuclear Science, 2001, 48:950-959.

Yoshikawa and Adachi, "Optical Constants of ZnO," Jpn. J. Appl. Phys., 1997, 36:6237.

Huang, Jinsong, et al., "Highly Efficient Red-Emission Polymer Phosphorescent Light-Emitting Diodes Based on Two Novel Tris(1-phenylisoquinolinato-C2,N)iridium(III) Derivatives", Adv. Mater., 2007, 19:739-743.

* cited by examiner

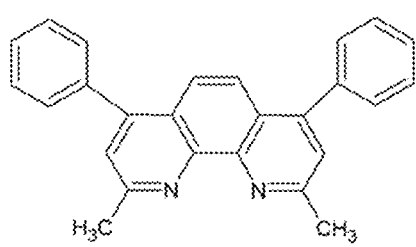
BCP
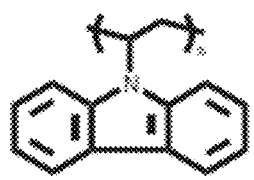
PVK
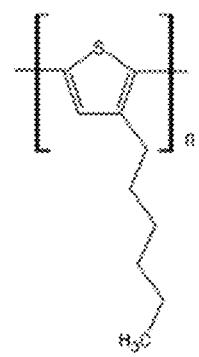
P3HT
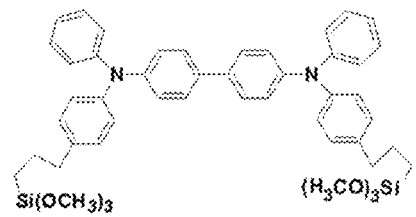
TPD-Si$_2$
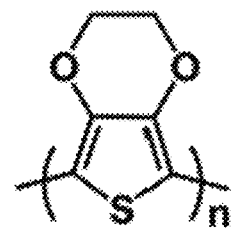
PEDOT
FIG. 3

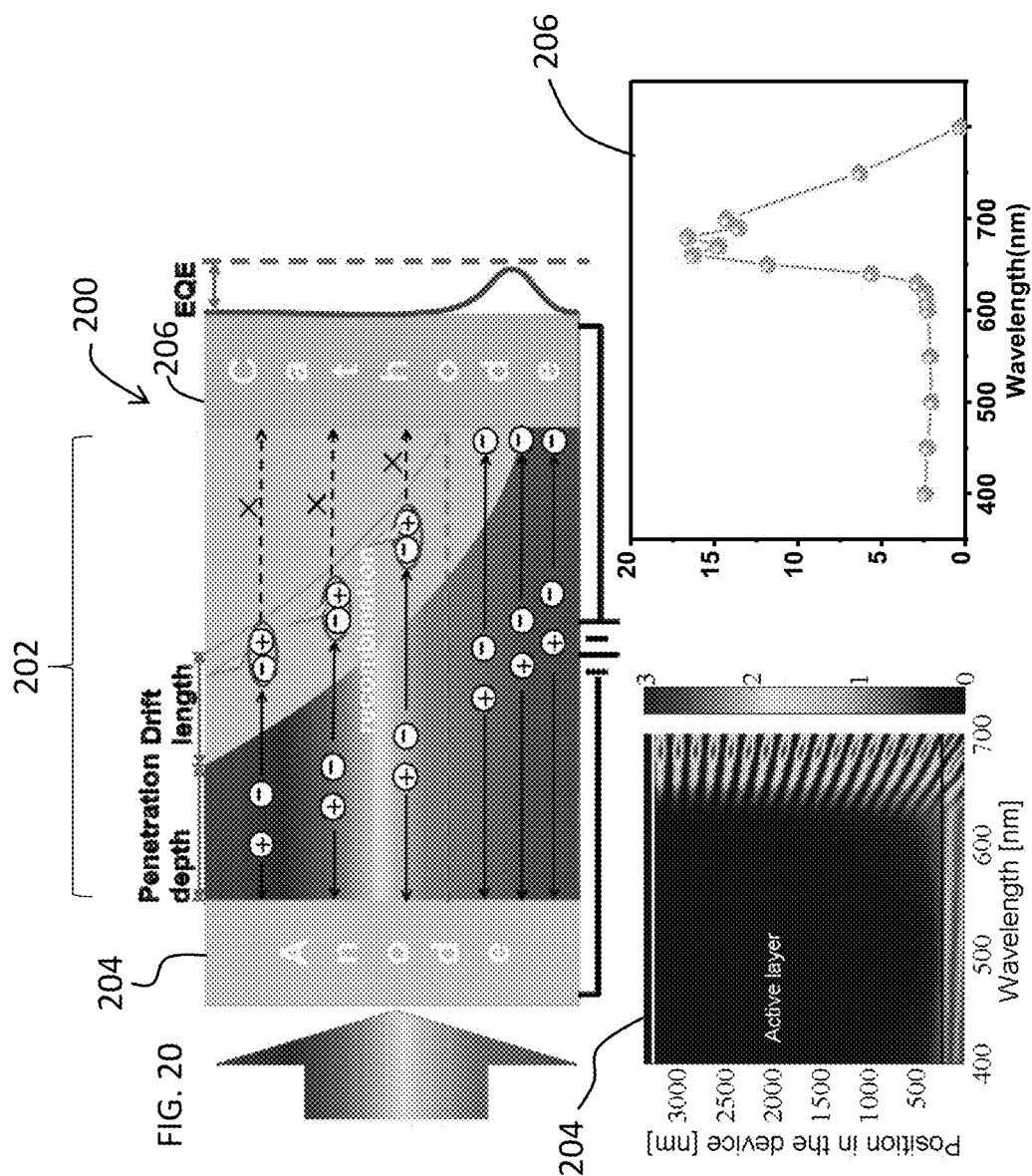

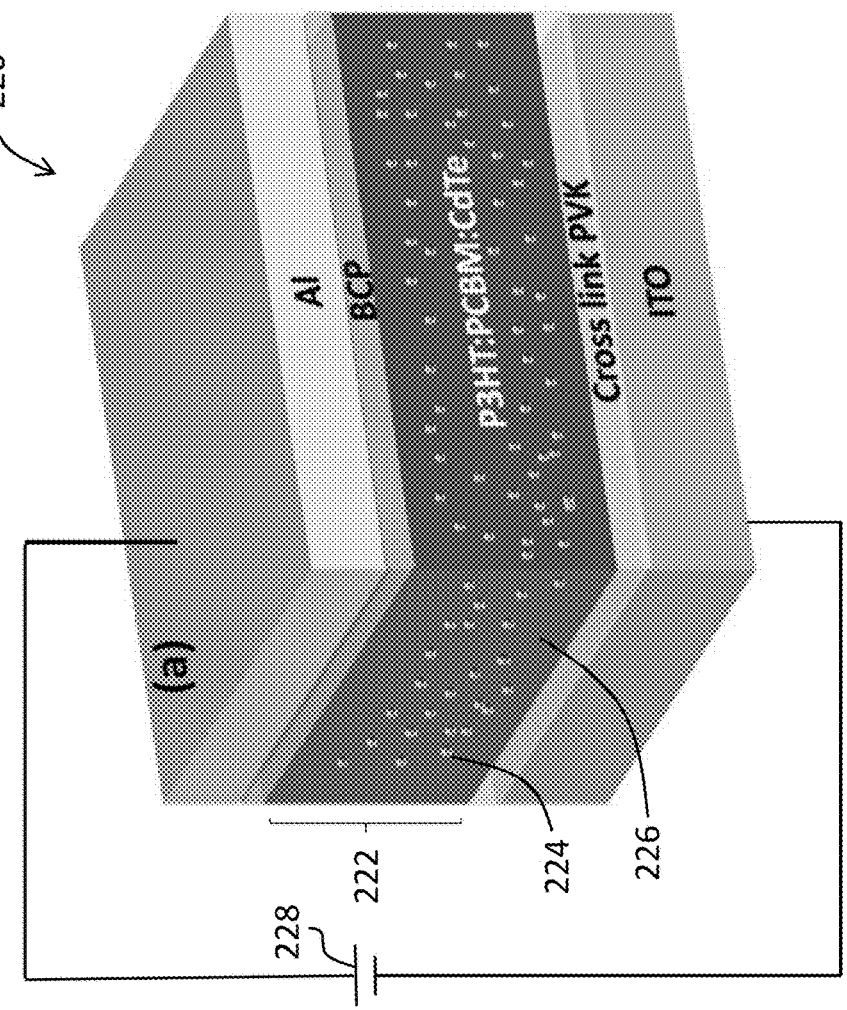
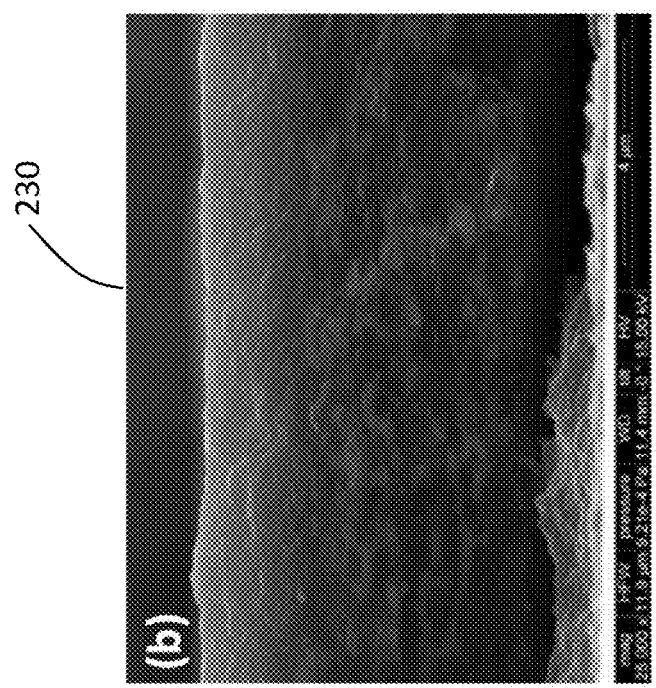
FIG. 23
FIG. 24

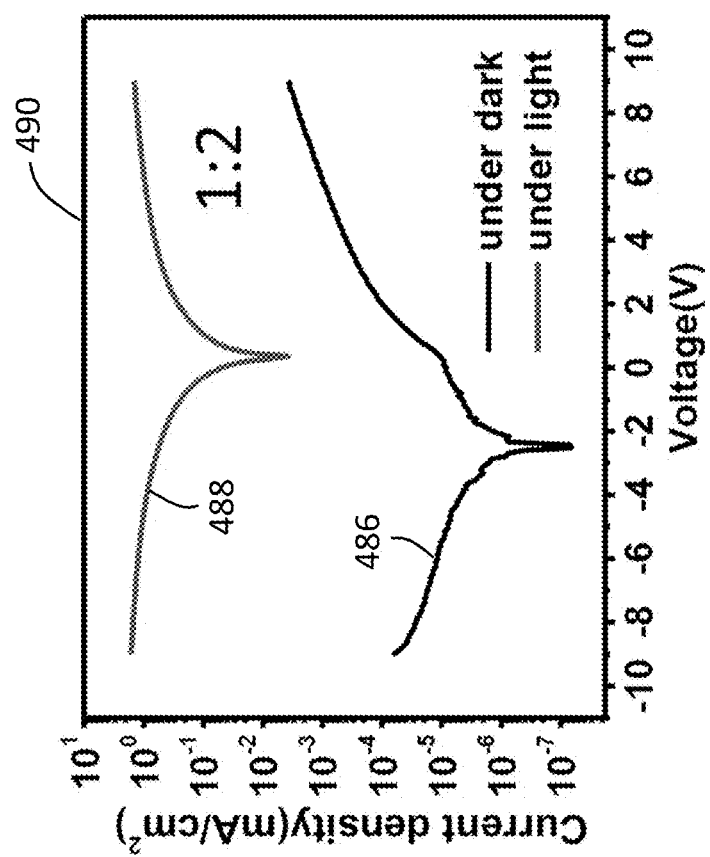
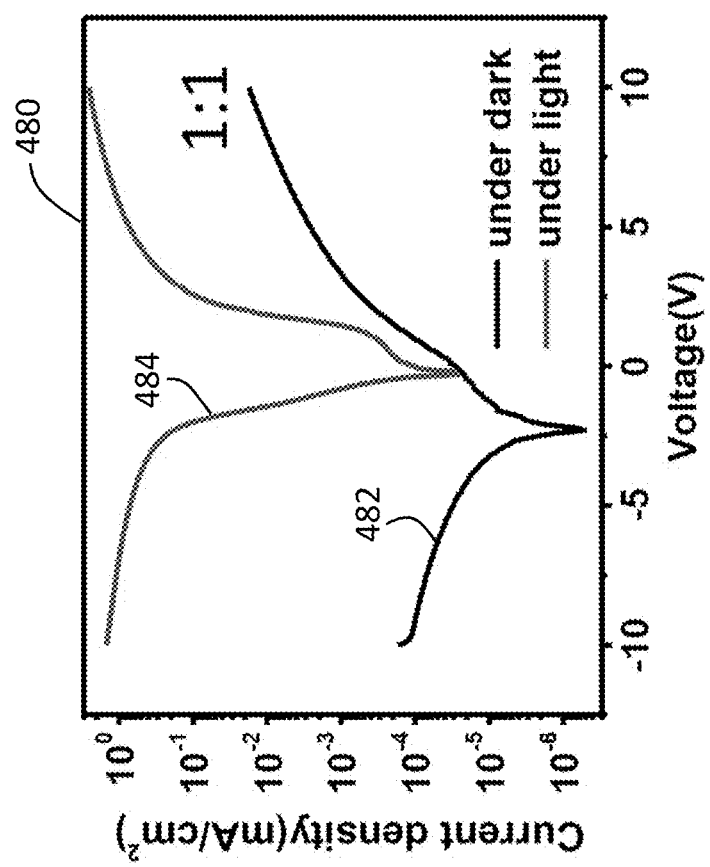
FIG. 39A
FIG. 39B

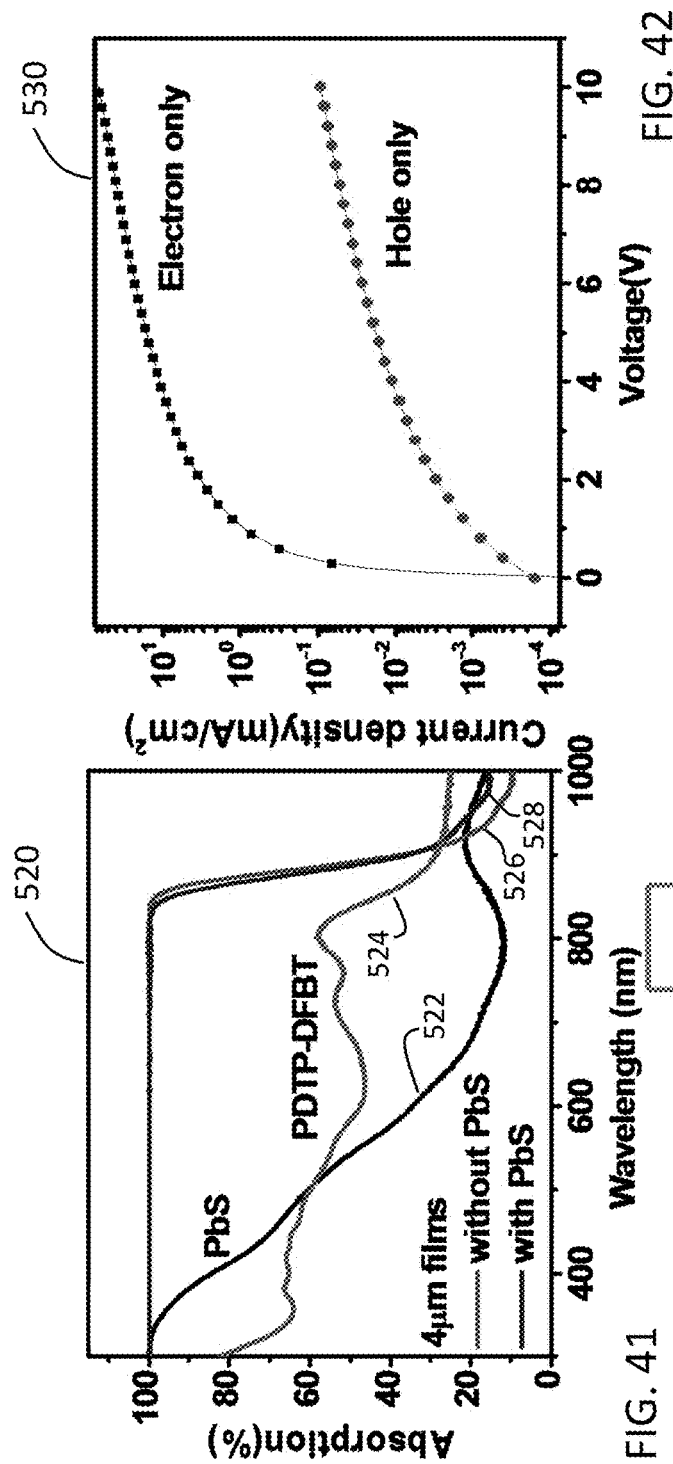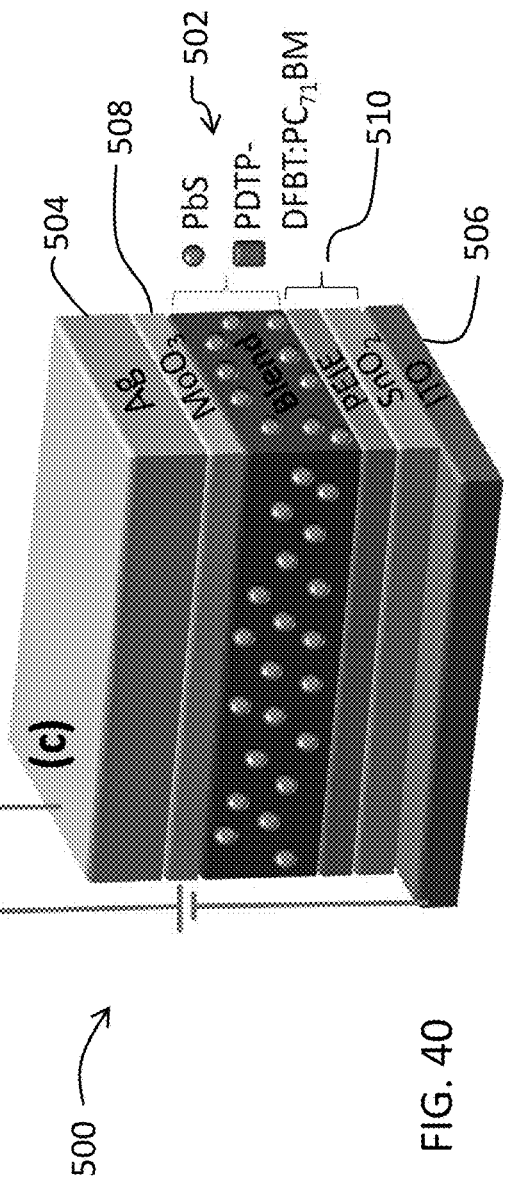
FIG. 42
FIG. 41
FIG. 40

NARROWBAND NANOCOMPOSITE PHOTODETECTOR

CROSS-REFERENCE TO RELATED APPLICATIONS

This application is a continuation-in-part of U.S. patent application Ser. No. 13/946,975, filed on Jul. 19, 2013, which claims priority to U.S. provisional application 61/673,787, filed on Jul. 20, 2012. The above applications are incorporated herein by reference in their entirety.

STATEMENT AS TO FEDERALLY SPONSORED RESEARCH

This invention was made with government support under Office of Naval Research grant N000141210556 and Defense Threat Reduction Agency grant HDTRA1-14-1-0030. The government has certain rights in the invention.

TECHNICAL FIELD

This subject matter is generally related to narrowband nanocomposite photodetectors.

BACKGROUND

Ultraviolet photodetectors are useful in medical, communications, and defense applications. The photodetectors can include single crystalline silicon, silicon carbide, or gallium nitride p-n junction photodiodes. When the p-n junction of a photodiode is illuminated by light, photons excite electrons, causing free electrons and holes to be generated. Due to the built-in electric field at the depletion region, the free electrons move toward the cathode and the holes move toward the anode, producing a photocurrent that can be measured.

SUMMARY

In general, in one aspect, a method of operating a photodetector is provided. The method includes providing a bias voltage from a power supply, and applying the bias voltage across a cathode and an anode of a photodetector, the photodetector having an active layer disposed between the cathode and the anode, the active layer comprising an electron donor material, a first electron acceptor material, and a second material that includes at least one of electron trapping particles or hole trapping particles; and detecting light by transmitting the light through the anode to the active layer, absorbing the light in the active layer, and increasing a current flowing through the photodetector. The at least one of electron trapping particles or hole trapping particles modify energy band levels near an interface between the active layer and at least one of the anode or cathode, resulting in photoconductive gain such that a number of charges collected at the anode or cathode is larger than a number of photons detected by the photodetector.

Implementations can include one or more of the following features. The active layer can have a thickness in a range between 100 nm to 500 nm.

The electron donor material and the first electron acceptor material can be selected to enable the photodetector to detect UV light and visible light.

The active layer can have a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

Detecting light can include detecting light having a wavelength greater than the second wavelength and not detecting light having a wavelength smaller than the first wavelength.

In some examples, the first wavelength can be 600 nm and the second wavelength can be 630 nm. In some examples, the first wavelength can be 800 nm and the second wavelength can be 850 nm.

In some examples, the active layer can have a thickness in a range between 3 µm to 4 µm.

In some examples, the electron donor material and the first electron acceptor material can be selected to enable the photodetector to detect light having a wavelength in a range from 630 nm to 800 nm and can have negligible response to light having a wavelength in a range from 400 nm to 600 nm.

The electron donor material can include poly(3-hexylthiophene) (P3HT) and the first electron acceptor material can include [6,6]-phenyl C61-butyric acid methyl ester (PCBM).

In some examples, the active layer can include cadmium tellurium quantum dots.

In some examples, the method can include upon absorbing light at the active layer, producing electrons and holes from an interaction of the light and materials in the active layer, and trapping the electrons using the cadmium telluride quantum dots.

The photodetector can have a peak external quantum efficiency that is greater than 100%.

In some examples, the electron donor material and the first electron acceptor material can be selected to enable the photodetector to detect light having a wavelength in a range from 850 nm to 950 nm and have negligible response to light having a wavelength in a range from 400 nm to 800 nm.

The electron donor material can include poly[2,7-(5,5-bis-(3,7-dimethyloctyl)-5H-dithieno[3,2-b:2',3'-d]pyran)-alt-4,7-(5,6-difluoro-2,1,3-benzothia diazole)] (PDTP-DFBT) and the first electron acceptor material can include phenyl-C71-butyric-acid-methyl ester ($PC_{71}BM$).

In some examples, the active layer can include lead sulfide quantum dots.

In some examples, the method can include upon absorbing light at the active layer, producing electrons and holes from an interaction of the light and materials in the active layer, and trapping the holes using the lead sulfide quantum dots.

In some examples, an external quantum efficiency spectrum of the photodetector can have a peak at about 890 nm.

In some examples, the photodetector can have a peak external quantum efficiency that is greater than 100% with a full-width at half-maxima of less than 100 nm.

In some examples, the photodetector can have a peak external quantum efficiency that is greater than 100% with a full-width at half-maxima of less than 50 nm.

The method can include reducing a dark current of the photodetector when there is no light by using a first buffer layer to block conduction of electrons, the first buffer layer being disposed between the active layer and the anode, and using a second buffer layer to block conduction of holes, the second buffer layer being disposed between the active layer and the cathode.

In another general aspect, a method of operating a photodetector is provided. The method includes providing a bias voltage from a power supply, and applying the bias voltage across a cathode and an anode of a photodetector, the photodetector having an active layer disposed between the cathode and the anode, the active layer comprising an electron donor material, a first electron acceptor material, and a second material that includes charge trapping particles that trap at least one of electrons or holes. The method includes, when the photodetector is not illuminated by light, operating the photodetector in a first mode comparable to a photodiode having a rectifying Schottky contact; and when the photodetector is illuminated by light, operating the photodetector in a second mode comparable to a photoconductor having an Ohmic contact.

Implementations can include one or more of the following features. The active layer can have a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

The method can include detecting light having a wavelength greater than the second wavelength and not detecting light having a wavelength smaller than the first wavelength.

In some examples, the first wavelength can be 600 nm and the second wavelength can be 630 nm.

In some examples, the first wavelength can be 800 nm and the second wavelength can be 850 nm.

In some examples, the second material can include lead sulfide (PbS) quantum dots.

In some examples, the method can include absorbing light at the active layer, producing electrons and holes from an interaction of the light and materials in the active layer, and trapping the holes using the lead sulfide quantum dots.

In some examples, the second material can include cadmium telluride (CdTe) quantum dots.

In some examples, the method can include upon absorbing light at the active layer, producing electrons and holes from an interaction of the light and materials in the active layer, and trapping the electrons using the cadmium telluride (CdTe) quantum dots.

The method can include, when the photodetector is illuminated by light, transmitting the light through the anode to the active layer, absorbing the light in the active layer, and increasing a current flowing through the photodetector.

The method can include, when the photodetector is not illuminated by light, reducing a dark current of the photodetector by using a first buffer layer to block conduction of electrons, the first buffer layer being disposed between the active layer and the anode, and using a second buffer layer to block conduction of holes, the second buffer layer being disposed between the active layer and the cathode.

The electron donor material can include poly(3-hexylthiophene) (P3HT), and the first electron acceptor material comprises [6,6]-phenyl C61-butyric acid methyl ester (PCBM).

The electron donor material can include poly[2,7-(5,5-bis-(3,7-dimethyloctyl)-5H-dithieno[3,2-b:2',3'-d]pyran)-alt-4,7-(5,6-difluoro-2,1,3-benzothia diazole)] (PDTP-DFBT) and the first electron acceptor material comprises phenyl-C71-butyric-acid-methyl ester (PC71BM).

In another general aspect, an apparatus for detecting light includes a power supply to provide a bias voltage; and a photodetector that includes an anode; a cathode, in which the power supply is configured to apply the bias voltage across the anode and the cathode; and an active layer disposed between the anode and the cathode, the active layer comprising an electron donor material, a first electron acceptor material, and a second material that includes at least one of electron trapping particles or hole trapping particles. The photodetector includes a first buffer layer disposed between the active layer and the anode; and a second buffer layer disposed between the active layer and the cathode, in which the first buffer layer blocks conduction of electrons and the second buffer layer blocks conduction of holes to reduce a dark current through the photodetector when the photodetector is not illuminated by light.

Implementations can include one or more of the following features. The active layer can have a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

The photodetector can be configured to detect light having a wavelength greater than the second wavelength and not detect light having a wavelength smaller than the first wavelength.

In some examples, the first wavelength can be 600 nm and the second wavelength can be 630 nm.

In some examples, the first wavelength can be 800 nm and the second wavelength can be 850 nm.

The at least one of electron trapping particles or hole trapping particles can include at least one of cadmium telluride (CdTe) quantum dots or lead sulfide (PbS) quantum dots.

In some examples, the electron donor material can include poly(3-hexylthiophene) (P3HT), and the first electron acceptor material can include [6,6]-phenyl C61-butyric acid methyl ester (PCBM).

In some examples, the electron donor material can include poly[2,7-(5,5-bis-(3,7-dimethyloctyl)-5H-dithieno[3,2-b:2',3'-d]pyran)-alt-4,7-(5,6-difluoro-2,1,3-benzothia diazole)] (PDTP-DFBT), and the first electron acceptor material can include phenyl-C71-butyric-acid-methyl ester (PC71BM).

In some examples, the second material can include lead sulfide quantum dots and the photodetector can have a peak external quantum efficiency that is greater than 100% with a full-width at half-maxima of less than 100 nm.

In some examples, the second material can include lead sulfide quantum dots and the photodetector can have a peak external quantum efficiency that is greater than 100% with a full-width at half-maxima of less than 50 nm.

In some examples, the second material can include cadmium telluride quantum dots and the photodetector can have a peak external quantum efficiency that is greater than 100%.

In some examples, the photodetector can be configured to detect light having a wavelength in a range from about 630 nm to 900 nm and disregard light having a wavelength from about 400 nm to about 600 nm.

The first buffer layer can include at least one of an organic materials or self-assembled monolayers (SAMs).

The first buffer layer can include at least one of poly(3, 4-ethylenedioxithiophene) (PEDOT) doped with poly(styrene sulfonicacid) (PSS), 4,4'-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, $Cu_2O$, CuSCN/P3HT, or Au nanoparticles.

The second buffer layer can include at least one of LiF, $LiCoO_2$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCB SD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFP-NBr), or poly(ethylene oxide) (PEO).

In another general aspect, an apparatus for detecting light includes a power supply to provide a bias voltage; and a photodetector array. The photodetector array includes a plurality of anode lines that are individually selectable; a plurality of cathode lines that are individually selectable, in which the power supply is configured to apply the bias voltage across a selected anode line and a selected cathode line; and an active layer disposed between the anode lines and cathode lines, the active layer comprising an electron donor material, a first electron acceptor material, and a second material that includes at least one of electron trapping particles or hole trapping particles, in which each intersection of one of the anode lines and one of the cathode lines form an individually selectable photodetector.

Implementations can include one or more of the following features. The active layer can have a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

The photodetector array can be configured to detect light having a wavelength greater than the second wavelength and not detect light having a wavelength smaller than the first wavelength.

In some examples, the first wavelength can be 600 nm and the second wavelength can be 630 nm.

In some examples, the first wavelength can be 800 nm and the second wavelength can be 850 nm.

The at least one of electron trapping particles or hole trapping particles can include at least one of cadmium telluride (CdTe) quantum dots or lead sulfide (PbS) quantum dots.

The apparatus can include a first buffer layer disposed between the active layer and the anode lines; and a second buffer layer disposed between the active layer and the cathode lines, the first buffer layer having a higher hole conductivity compared to that of the second buffer layer, the second buffer layer having a higher electron conductivity compared to that of the first buffer layer.

The apparatus can include a controller configured to receive an address signal and select one of the photodetectors based on the address signal.

In general, in another aspect, a photodetector includes an anode; a cathode; an active layer disposed between the anode and the cathode, the active layer including at least one of nanoparticles or organic electron trapping particles; a first buffer layer disposed between the active layer and the anode; and a second buffer layer disposed between the active layer and the cathode, in which the first buffer layer blocks conduction of electrons and the second buffer layer blocks conduction of holes to reduce a dark current through the photodetector when the photodetector is not illuminated by light.

Implementations of the photodetector may include one or more of the following features.

In some examples, the nanoparticles can include at least one of zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}Cd_xTe$, InAsSb, InNSb, InBiTe, or InTlSb.

In some examples, the nanoparticles can include at least one of InAs/GaInSb super lattice, HgTe/CdTe super lattice, graphene quantum dots, carbon nanotube, or fullerene.

The active layer can include a polymer.

The active layer can include at least one of polyvinylcarbazole (PVK), poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, a polythiophene, a derivative of polythiophene, a polycarbazole, a derivative of polycarbazole, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9"-hepta-decanyl-2,7-carbazole-alt-5,5-(4',7'-di-2-thienyl-2',1', 3'-benzothiadiazole)] (PCDTBT), or a combination of two or more of the above materials.

The anode can include at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

The cathode can include at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of two or more of the above materials.

The first buffer layer can include at least one of an organic materials or self-assembled monolayers (SAMs).

The first buffer layer can include at least one of poly(3,4-ethylenedioxithiophene) (PEDOT) doped with poly(styrene sulfonicacid) (PSS), 4,4'-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANT), poly[(9,9-dioctylfluorene)-co-N-(4-(1-methylpropyl)phenyl)diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

The second buffer layer can include at least one of an alkali metal compound, a metal oxide, an organic material, or self-assembled monolayers (SAMs).

The second buffer layer can include at least one of LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFPNBr), or poly(ethylene oxide) (PEO).

The active layer can absorb light having a wavelength in a first predetermined range. The anode can be transparent or partially transparent to light having a wavelength in a second predetermined range, the second predetermined range overlapping the first predetermined range in a third predetermined range. The photodetector can have a high resistivity when not illuminated by light and have a low resistivity when illuminated by light having a wavelength in the third predetermined range.

The organic electron trapping particles can include at least one of a fullerene, a derivative of fullerene, a perylene derivative, a 2,7-dicyclohexyl benzo, phenanthroline derivative, a 1,4-diketo-3,6-dithienylpyrrolo[3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C61-butyric acid methyl ester (PCBM), [6,6]-phenyl C61-butyric acid methyl ester (PC70BM), [6,6]-(4-fluoro-phenyl)-C61-butyric acid methyl ester (FPCBM), carbon 60 (C60), carbon 70 (C70), carbon nanotube (CNT), a carbon onion, or a combination of two or more of the above material.

In general, in another aspect, a photodetector array includes a plurality of anode lines that are individually selectable; a plurality of cathode lines that are individually selectable; and an active layer disposed between the anode lines and cathode lines. The active layer includes at least one of nanoparticles or organic electron trapping particles, in which each intersection of one of the anode lines and one of the cathode lines form an individually selectable photodetector.

Implementations of the photodetector array may include one or more of the following features.

The photodetector array can include a first buffer layer disposed between the active layer and the anode lines, and a second buffer layer disposed between the active layer and the cathode lines. The first buffer layer has a higher hole conductivity compared to that of the second buffer layer, and the second buffer layer has a higher electron conductivity compared to that of the first buffer layer.

The photodetector array can include a controller configured to receive an address signal and select one of the photodetectors based on the address signal.

The nanoparticles can include at least one of zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}Cd_xTe$, InAsSb, InNSb, InBiTe, or InTlSb.

The nanoparticles can include at least one of InAs/GaInSb super lattice, HgTe/CdTe super lattice, graphene quantum dots, carbon nanotube, or fullerene.

The active layer can absorb light having a wavelength in a first predetermined range. The anode lines can be transparent or partially transparent to light having a wavelength in a second predetermined range, the second predetermined range overlapping the first predetermined range in a third predetermined range. Each photodetector can have a high resistivity when not illuminated by light and have a low resistivity when illuminated by light having a wavelength in the third predetermined range.

In general, in another aspect, a photodetector includes an anode that is transparent or partially transparent to light having a wavelength in a first predetermined range; a cathode; and an active layer disposed between the anode and the cathode. The active layer includes at least one of nanoparticles or organic electron trapping particles, and the active layer absorbs light having a wavelength in a second predetermined range, the second predetermined range overlapping the first predetermined range in a third predetermined range. The photodetector has a high resistivity when not illuminated by light and has a low resistivity when illuminated by light having a wavelength in the third predetermined range.

Implementations of the photodetector may include one or more of the following features.

The photodetector can include a first buffer layer disposed between the active layer and the anode, and a second buffer layer disposed between the active layer and the cathode. The first buffer layer can have a higher hole conductivity compared to that of the second buffer layer, and the second buffer layer can have a higher electron conductivity compared to that of the first buffer layer.

The first buffer layer can include at least one of organic materials or self-assembled monolayers (SAMs).

The first buffer layer can include at least one of poly(3, 4-ethylenedioxithiophene) (PEDOT) doped with poly(styrene sulfonicacid) (PSS), 4,4'-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANT), poly[(9,9-dioctylfluorene)-co-N-(4-(1-methylpropyl)phenyl)diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

The second buffer layer can include at least one of an alkali metal compound, a metal oxide, an organic material, or self-assembled monolayers (SAMs).

The second buffer layer can include at least one of LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFPNBr), or poly(ethylene oxide) (PEO).

The nanoparticles can include at least one of zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}Cd_xTe$, InAsSb, InNSb, InBiTe, or InTlSb.

The nanoparticles can include at least one of InAs/GaInSb super lattice, HgTe/CdTe super lattice, graphene quantum dots, carbon nanotube, or fullerene.

The active layer can include a polymer.

The active layer can include at least one of polyvinylcarbazole (PVK), poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b] thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, a polythiophene, a derivative of polythiophene, a polycarbazole, a derivative of polycarbazole, poly(3-octylthiophene) (P3OT), poly(3-hexyloxythiophene) (P3DOT), poly(3-methylthiophene) (PMeT), poly(3-dodecylthiophene) (P3DDT), poly (3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl) thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly{[2,7-(9,9-bis-(2-ethylhexyl)-fluorene)]-alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9'-hepta-decanyl-2,7-carbazole-alt-5,5-(4',7'-di-2-thienyl-2',1', 3'-benzothiadiazole)] (PCDTBT), or a combination of two or more of the above materials.

The anode can include at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

The cathode can include at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of two or more of the above materials.

The organic electron trapping particles can include at least one of a fullerene, a derivative of fullerene, a perylene derivative, a 2,7-dicyclohexyl benzo, phenanthroline derivative, a 1,4-diketo-3,6-dithienylpyrrolo[3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C61-butyric acid methyl ester (PCBM), [6,6]-phenyl C61-butyric acid methyl ester (PC70BM), [6,6]-(4-fluoro-phenyl)-C61-butyric acid methyl ester (FPCBM), carbon 60 (C60), carbon 70 (C70), carbon nanotube (CNT), a carbon onion, or a combination of two or more of the above material.

In general, in another aspect, a method for detecting light is provided. The method includes applying a bias voltage across a cathode and an anode of a photodetector, the photodetector having an active layer disposed between the cathode and the anode, the active layer including at least one of nanoparticles or organic electron trapping particles; and detecting light by transmitting the light through the anode to the active layer, absorbing the light in the active layer, and increasing a current flowing through the photodetector.

Implementations of the method may include one or more of the following features.

The method can include reducing a dark current of the photodetector when there is no light by using a first buffer layer to block conduction of electrons, the first buffer layer being disposed between the active layer and the anode, and using a second buffer layer to block conduction of holes, the second buffer layer being disposed between the active layer and the cathode.

The method can include, upon absorbing light at the active layer, producing electrons and holes from an interaction of the light and materials in the active layer, and trapping the electrons using the nanoparticles or the organic electron trapping particles.

In general, in another aspect, a method for detecting light is provided. The method includes applying a bias voltage across a cathode and an anode of a photodetector, the photodetector having an active layer disposed between the cathode and the anode, the active layer including at least one of nanoparticles or organic electron trapping particles. When the photodetector is not illuminated by light, the photodetector is operated in a first mode comparable to a photodiode having a rectifying Schottky contact; and when the photodetector is illuminated by light, the photodetector is operated in a second mode comparable to a photoconductor having an Ohmic contact.

Implementations of the method may include one or more of the following features.

The method can include, when the photodetector is illuminated by light, transmitting the light through the anode to the active layer, absorbing the light in the active layer, and increasing a current flowing through the photodetector.

The method can include, when the photodetector is not illuminated by light, reducing a dark current of the photodetector by using a first buffer layer to block conduction of electrons, the first buffer layer being disposed between the active layer and the anode, and using a second buffer layer to block conduction of holes, the second buffer layer being disposed between the active layer and the cathode.

These aspects and features allow a photodetector to have a high signal-to-noise ratio when detecting light.

BRIEF DESCRIPTION OF DRAWINGS

FIG. 3 is a diagram showing exemplary chemical structures of materials that can be used in the photodetector.

FIG. 20 is a diagram of an exemplary photodetector structure.

FIG. 21 is a graph showing an exemplary distribution of normalized modulus square of optical electric field ($|E(x)^2|$) of the interior of the active layer.

FIG. 22 is a graph showing exemplary calculated incident photon-to-current efficiency (IPCE) of the photodetector based on the P3HT:PCBM.

FIG. 23 is a diagram of an exemplary structure of a photodetector.

FIG. 24 is a cross-section scanning electron microscopy (SEM) image of the active layer of an exemplary photodetector.

FIGS. 39A and 39B are graphs that show the current density versus voltage characteristic curves under dark and light conditions for exemplary photodetectors with various ratios of PDTP-DFBT to PC$_{71}$BM.

FIG. 40 is a diagram of an exemplary sensitive narrowband photodetector that can detect light in the near infrared wavelength range.

FIG. 41 is a graph showing the absorption spectra of PbS, PDTP-DFBT, a 4 μm film of PDTP-DFBT:PC$_{71}$BM without lead sulfide quantum dots, and a 4 μm film of PDTP-DFBT: PC$_{71}$BM with lead sulfide quantum dots.

FIG. 42 is a graph that shows single-carrier device dark current.

DETAILED DESCRIPTION

This disclosure relates to a photodetector having a nanocomposite layer. In some implementations, the photodetector includes an active layer made of a polymer material blended with nanoparticles (NPs). For example, a solution-processed UV-photodetector having a nanocomposite active layer that includes ZnO nanoparticles blended with semiconducting polymers can have a high signal-to-noise ratio when detecting UV light.

Due to interfacial trap-controlled charge injection, the photodetector transitions from having characteristics similar to a photodiode with a rectifying Schottky contact in the dark to having characteristics similar to a photoconductor with an ohmic contact under illumination. The photodetector has a low dark current comparable to a photodiode and a high responsivity of, e.g., 721~1,001 A/W, which is comparable to a photoconductor. In some implementations, when a bias voltage of less than 10V is applied, the photodetector can provide a detectivity of 3.4×10$^{15}$ Jones at 360 nm at room temperature.

Figure 1:
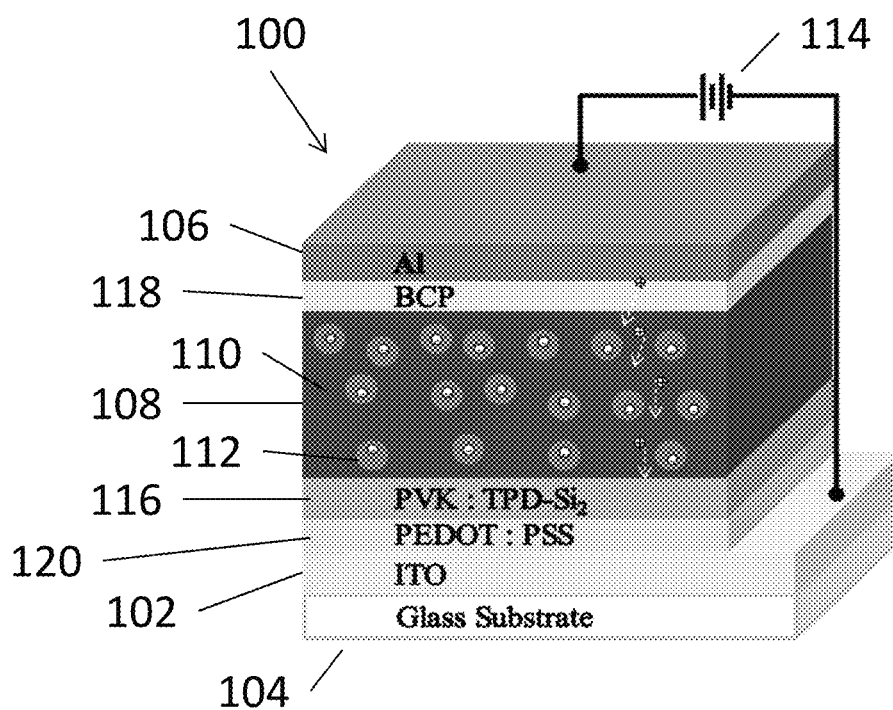
FIG. 1 is a diagram of an exemplary photodetector.

Referring to FIG. 1, a photoconductive photodetector 100 includes an anode 102 formed on a substrate 104, a cathode 106, and a photoactive layer 108 disposed between the anode 102 and the cathode 106. For example, the substrate 104 can be a glass substrate, the anode 102 can be made of transparent indium tin oxide (ITO), and the cathode 106 can be made of aluminum. The photoactive layer 108 includes a polymer 110 blended with nanoparticles 112. In some examples, the polymer 110 is a hole-conducting semiconductor polymer, and the nanoparticles 110 are selected to trap electrons. A bias voltage 114 is applied across the anode 102 and the cathode 106. When the photodetector 100 is illuminated by light, the light causes generation of electron-hole pairs in the active layer 108, in which the electrons are trapped by the nanoparticles 112. As described below, this changes the energy band levels resulting in an increase in the current flowing through the photodetector 100, enabling detection of the light.

The photoconductive photodetector 100 is sometimes referred to as a "vertical structure" photoconductive photodetector 100 because the cathode 106, the active layer 108, and the anode 102 are stacked vertically. This is in comparison to a previous "lateral structure" photodetector design in which both the cathode and the anode are placed on the same side of the active layer.

The polymer 110 and the nanoparticles 112 can be selected based on the spectrum of light that the photodetector 100 is intended to detect. For example, for a photodetector 100 designed to detect ultraviolet (UV) and visible light, the polymer 110 can be made of poly-3(hexylthiophene) (P3HT) that has an optical bandgap of 1.9 eV. For a photodetector 100 designed to detect ultraviolet (UV) light, the polymer 110 can be made of polyvinylcarbazole (PVK) that has a bandgap of 3.5 eV. PVK has a high hole mobility and a high bandgap. In both of the above examples, the nanoparticles can be ZnO nanoparticles. ZnO is suitable as a UV absorber because of its wide bandgap of about 3.4 eV.

In some examples, the nanoparticles 112 can be dispersed in the polymer 110 so that the nanoparticles do not contact each other. This way, the nanoparticles form isolated electron traps. In some examples, the nanoparticles can be coated with nonconductive ligands. In some examples, the nanoparticles have defects that function as charge trappers.

The various layers of materials of the photodetector 100 can be fabricated by low-cost spin-coating, which is compatible with complementary metal-oxide-semiconductor (CMOS) fabrication technology.

In some implementations, the anode is transparent or partially transparent to light having a wavelength in a first predetermined range. The active layer includes nanoparticles that absorb light having a wavelength in a second predetermined range, in which the second predetermined range overlaps the first predetermined range in a third predetermined range. The photodetector has a high resistivity when not illuminated by light and has a low resistivity when illuminated by light having a wavelength in the third predetermined range.

Figure 2:
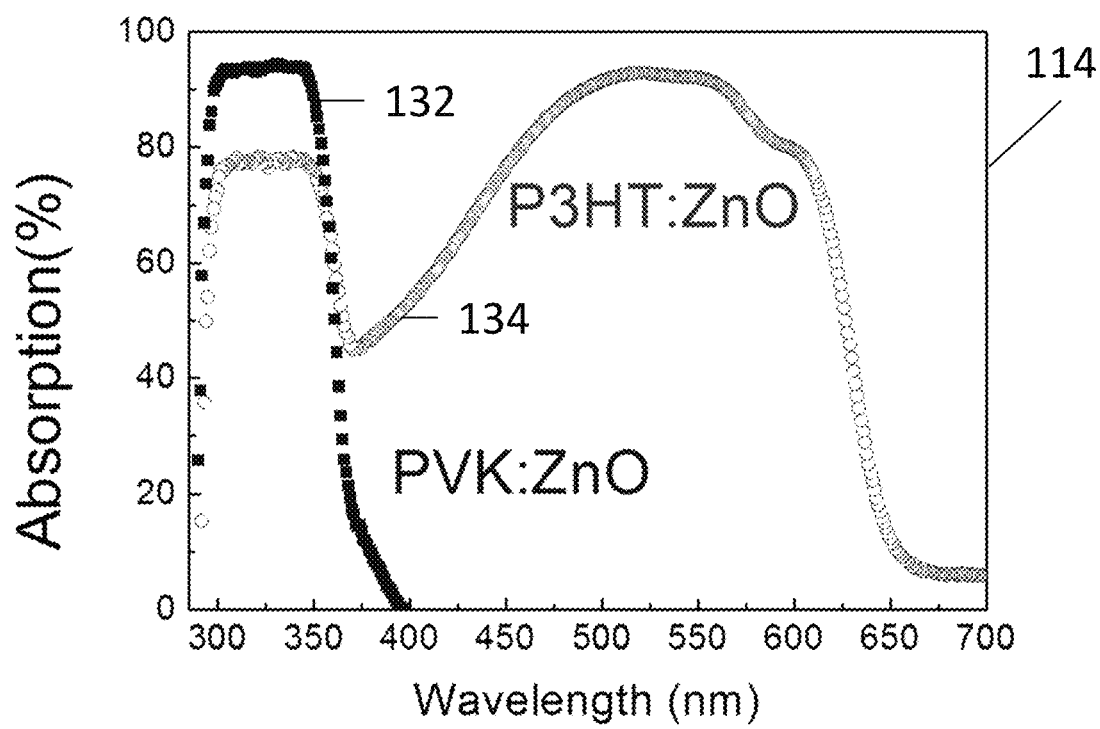
FIG. 2 is a graph showing the absorption spectra of two different exemplary active layers.
Figure 4:
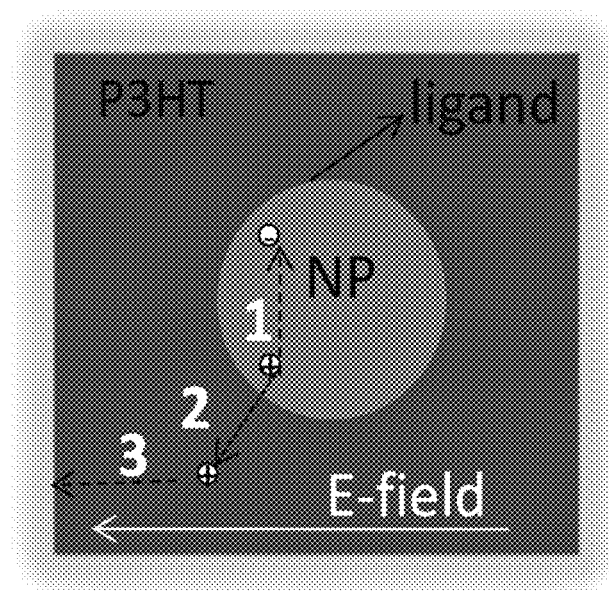
FIG. 4 is a diagram showing electron-hole pair generation, electron-hole separation, hole transport, and electron trapping process in an exemplary nanocomposite material.

FIG. 2 is a graph 130 that shows an absorption spectrum 132 of PVK:ZnO nanocomposite material and an absorption spectrum 134 of P3HT:ZnO nanocomposite material. The absorption spectrum 132 indicates that the PVK:ZnO nanocomposite material absorbs UV light, so a photodetector having an active layer that includes PVK:ZnO nanocomposite material can detect UV light. The absorption spectrum 134 indicates that the P3HT:ZnO nanocomposite material absorbs UV and visible light, so a photodetector having an active layer that includes P3HT:ZnO nanocomposite material can detect UV light and light in the visible spectrum.

For example, the photoactive layer 108 can have a thickness of about 500 nm. There are many types of nanoparticles that can absorb UV radiation with high absorption coefficients. When the photoactive layer 108 includes the UV-absorbing nanoparticles, a thickness of 500 nm for the photoactive layer 108 can be sufficient for the photoactive layer 108 to absorb most of the UV radiation.

A feature of the photodetector 100 is that it has a gain comparable to a photoconductor and low noise comparable to a diode.

The chemical structures of materials that can be used in the photodetector 100 are shown in FIG. 3. The nanoparticles work as charge traps in the photodetector 100. BCP and PVK are available from Sigma-Aldrich, PEDOT:PSS (PH4083) is available from H.C.Starck, and P3HT is available from Rieke Metals.

In order to reduce the dark current, a first buffer layer 116 is disposed between the anode 102 and the photoactive layer 108. The first buffer layer 116 functions as an electron-blocking/hole-conducting layer. For example, the first buffer layer 116 can be a thin layer of 4,4'-Bis[(p-trichlorosilyl-propylphenyl)phenylamino]-biphenyl (TPD-Si$_2$) and PVK blend. This material blend combines the hole-injection and hole-transport capabilities of TPD-Si$_2$ with the electron-blocking capability of PVK, and can reduce the dark current by two to three orders of magnitude in the photodetector 100. The hole-transport layer can be cross-linked by annealing TPD-Si$_2$ in air so that the photoactive layer coating that follows will not wash away this layer.

Similarly, a second buffer layer 118 is disposed between the cathode 106 and the photoactive layer 108. The second buffer layer 118 functions as a hole-blocking/electron-conducting layer. For example, the second buffer layer 118 can be a layer of 2,9-dimethyl-4,7-diphenyl-1,10-phenanthroline (BCP), which can be deposited by thermal evaporation on the cathode side.

An optional PEDOT:PSS layer 120 is provided above the ITO layer 102 to make the ITO layer 102 smooth.

Referring to FIGS. 4, 5, 6A, and 6B, the photodetector 100 operates as follows:

(1) When the photodetector 100 is illuminated by light, both the polymer 110 and the nanoparticles 112 absorb incident photons and generate Frenkel excitons.

Figure 5:
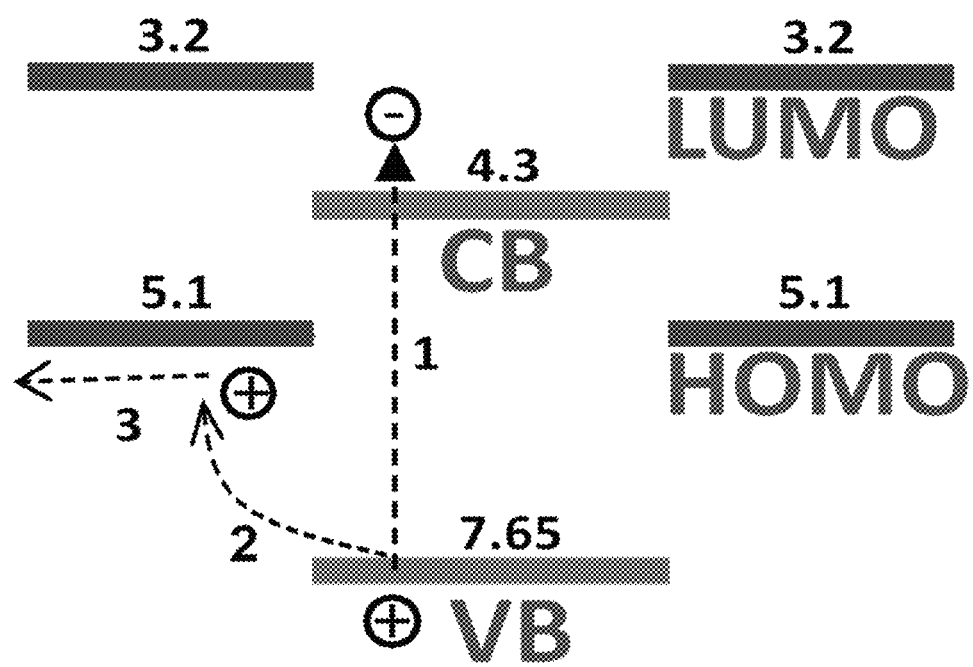
FIG. 5 is a diagram showing exemplary energy levels of the nanoparticle and the surrounding polymer.

(2) The Frenkel excitons diffuse to the polymer/nanoparticles interface and the electrons transfer from the nanoparticles and semiconducting polymer, as shown in the energy diagram of FIG. 5.

(3) The holes transport in the semiconducting polymer under the applied reverse bias/electric field, and the electrons remain trapped in the nanoparticles 112 due to the lack of a percolation network for electrons and the strong quantum confinement effect in the nanoparticles 112. The strong electron trapping effect is evidenced by the 3 to 4 orders of magnitude lower electron current in the electron-only devices than the hole current in the hole-only devices using the same nanocomposite layers as the carrier transport layer. The electron trapping effect by ZnO nanoparticles was also directly observed by electric force microscopy.

Figure 6A:
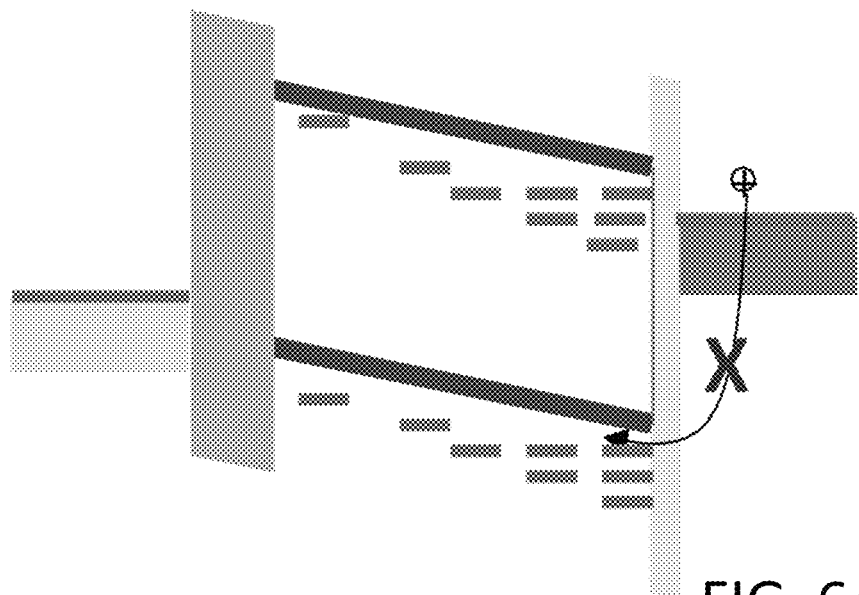
FIG. 6A is a diagram showing energy levels of the photodetector in the dark.

(4) As shown in FIG. 6A, in the absence of illumination, the dark current is small because of the large charge injection barrier (e.g., greater than 0.6 eV) under reverse bias. Under illumination, the trapped electrons quickly shift the lowest unoccupied molecular orbital (LUMO) of the polymer downwards and align the Fermi energy of the nanocomposite with that of the cathode 106. The electron traps are predominately close to the cathode because of the formation of vertical phase separation in the nanocomposite with ZnO nanoparticles segregated to the cathode side, as observed by the cross-section scanning electron microscopy (SEM). The phase separation (both lateral and vertical) has been observed in P3HT:ZnO nanocomposite and was promoted by the slow drying of the film due to the different surface affinity of ZnO and P3HT to the substrate.

Figure 6B:
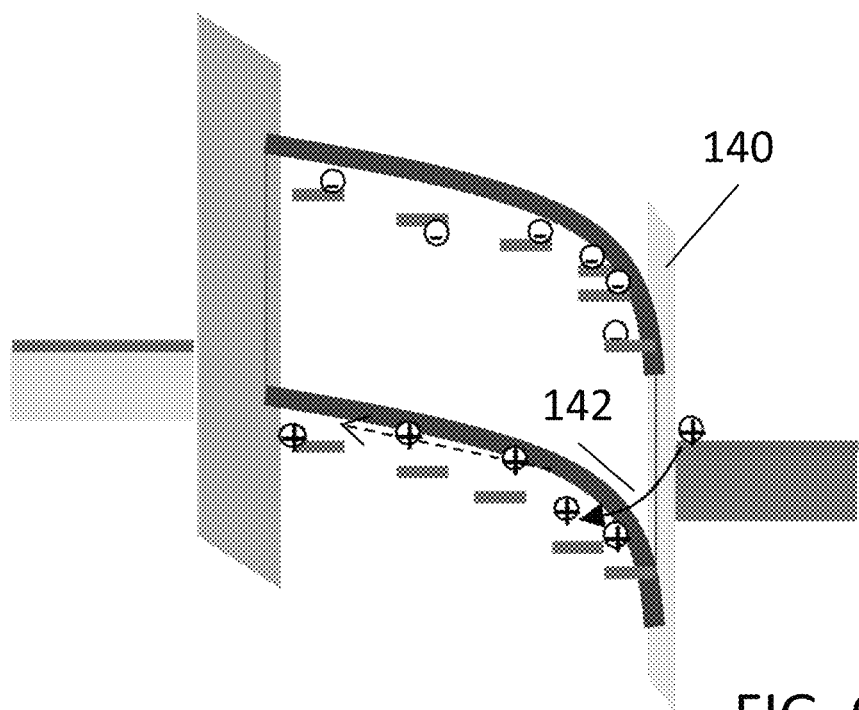
FIG. 6B is a diagram showing energy levels of the photodetector under illumination.

As shown in FIG. 6B, the thickness of a hole-injection barrier 140 on the cathode side becomes so small that the holes can easily tunnel (142) through it at a small reverse bias. Thus, the nanocomposite/Al interface acts as a photon addressable photoelectronic "valve" for hole injection and incident photons can switch on this valve. The average energy barrier change, $\Delta\Phi$, is a linear function of trapped electron density ($n_t$), while the injection current follows an exponential relationship with the energy barrier change according to the Richardson-Dushman equation:

$$J \propto \exp\left(-\frac{\Delta\Phi}{kT}\right) \propto \exp\left(\frac{n_t}{kT}\right) \tag{Equ. 1}$$

where k is the Boltzmann constant and T is the temperature. The gain of a photodetector is the ratio of the measured photocurrent (carriers) versus the number of incident photons. If the injected hole number exceeds the absorbed photon number, there is gain due to the exponential dependence of injected holes on incident photons.

Figure 7:
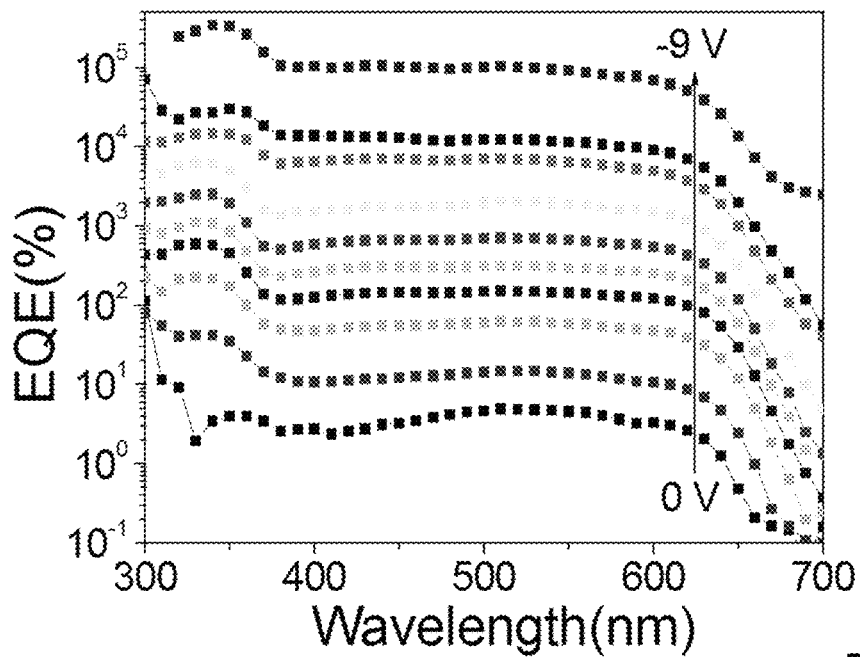
FIG. 7 is a graph showing external quantum efficiencies of an exemplary photodetector that uses an active layer having P3HT:ZnO under reverse bias with a voltage step of 1 V.
Figure 8:
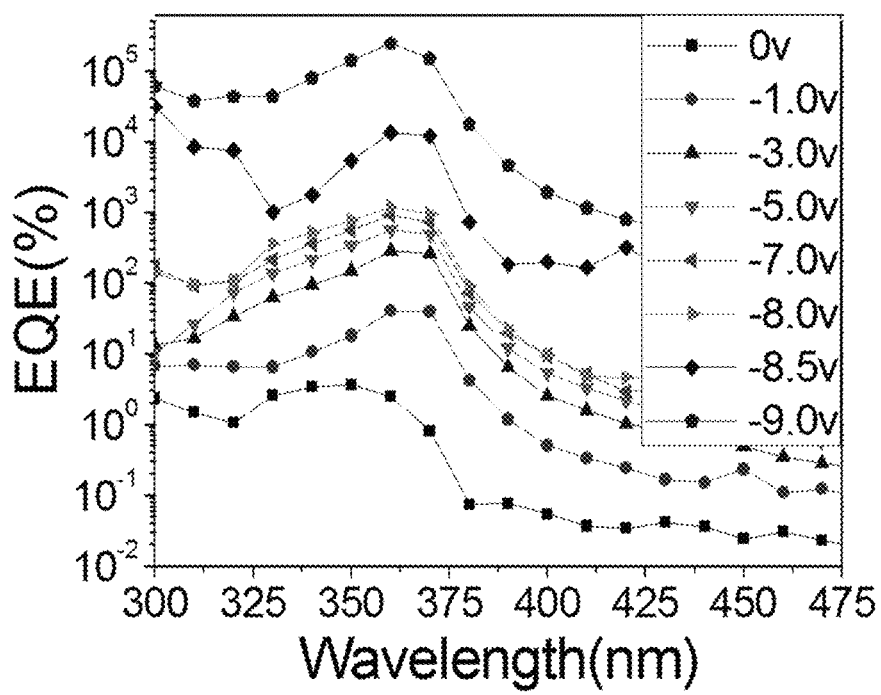
FIG. 8 is a graph showing external quantum efficiencies of an exemplary photodetector that uses an active layer having PVK:ZnO under reverse bias with a voltage step of 1 V.
Figure 9:
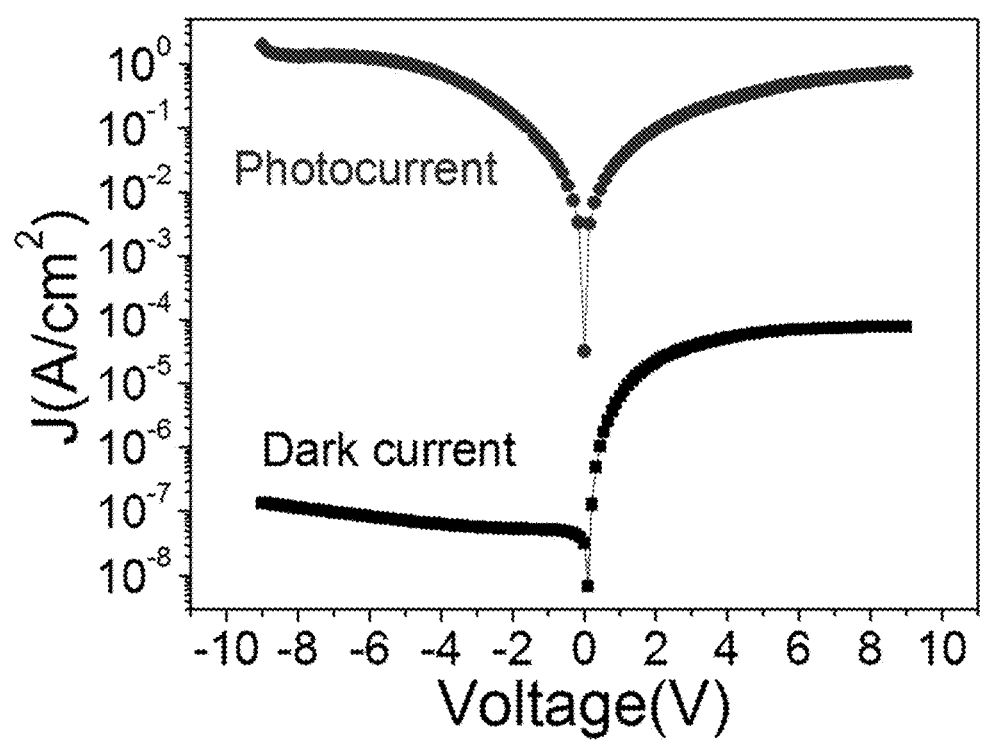
FIG. 9 is a graph showing photocurrent and dark current density of an exemplary photodetector that uses an active layer having PVK:ZnO nanocomposite material.

To characterize the wavelength-dependent gain of the photodetectors, the external quantum efficiencies (EQE) versus wavelength were measured by the incident-photon-to-current efficiency (IPCE) system at different reverse bias, and the results are shown in FIGS. 7 and 8. The EQE curves agree with the absorption curves of the nanocomposites as well. EQE exceeds 100% at a bias of −3 V for PVK:ZnO devices and −1 V for P3HT:ZnO devices, respectively. EQEs increase quickly with increasing negative bias, especially at reversed bias above −8 V. The rapid increase of EQE is consistent with the quick increase of photocurrents, as shown in FIG. 9. The measurements were performed for a bias voltage from −9V to 9V (the highest voltage output of the lock-in amplifier used for the measurement), and the peak external quantum efficiency is 245,300% and 340,600% under bias of −9 V at 360 nm for the PVK:ZnO and P3HT:ZnO devices, respectively. The corresponding responsivity (R in A/W), i.e., the ratio of photocurrent to incident-light intensity, can be calculated from EQE with $$R = EQE/hv \qquad (Equ. 2)$$

where hv is the energy of the incident photon in terms of electron-volts. The peak responsivities, at illumination light intensity of 1.25 μW/cm², are 721 A/W for the PVK:ZnO device and 1,001 A/W for the P3HT:ZnO device at 360 nm, which are more than three orders of magnitude larger than that of commercial GaN or SiC detectors (e.g., less than 0.2 A/W). FIG. 9 shows that the photodetector 100 has a good signal-to-noise ratio when a bias voltage of less than 10 V is used.

Figure 10A:
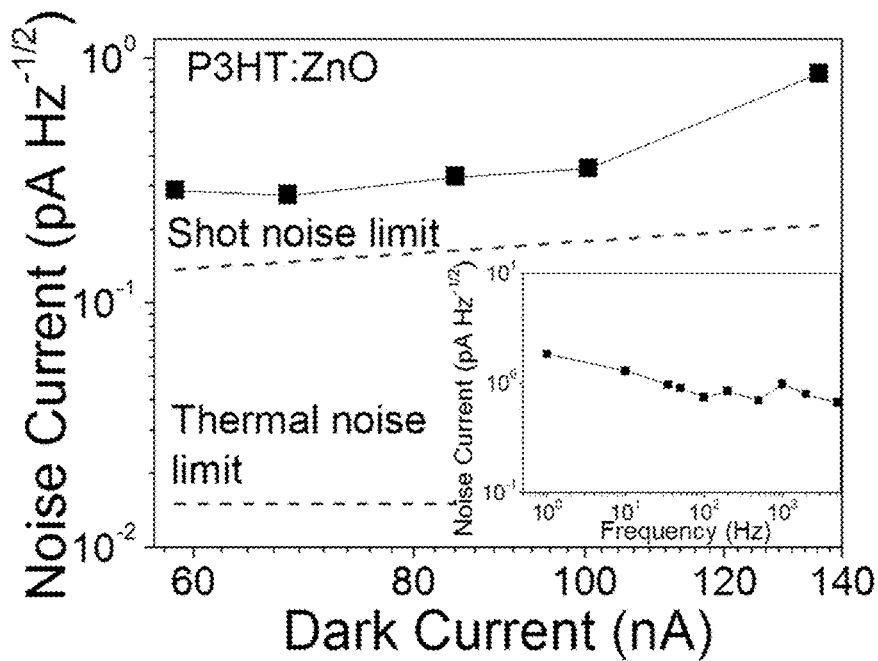
FIG. 10A is a graph showing a relationship between the noise current of an exemplary photodetector using P3HT:ZnO in the active layer and the dark current. The inset shows the frequency dependent noise current at −9 V.
Figure 10B:
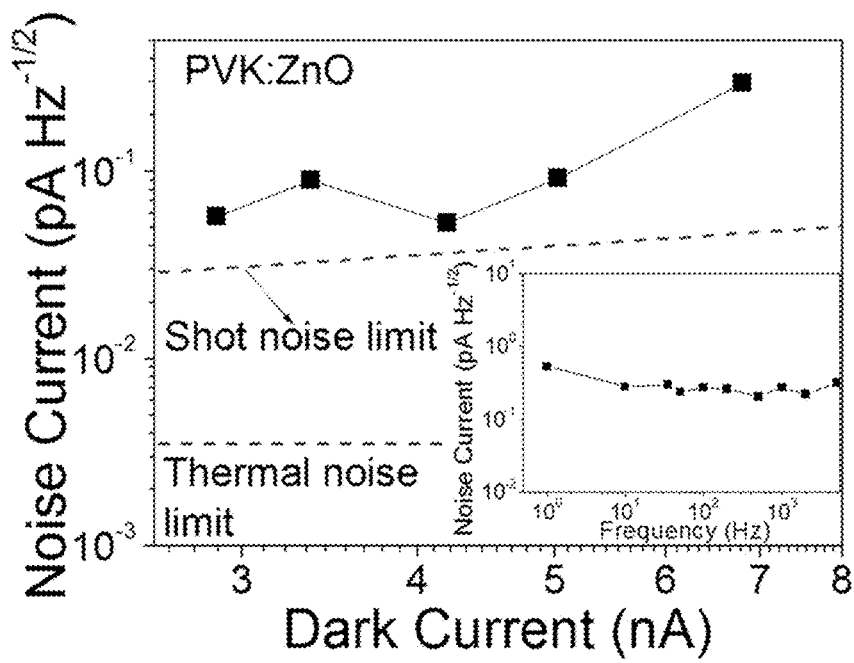
FIG. 10B is a graph showing a relationship between the noise current of an exemplary photodetector using PVK:ZnO in the active layer and the dark current. The inset shows the frequency dependent noise current at −9 V.

The nanocomposite photodetector devices show a transition from a photodiode in the dark with a rectifying Schottky contact to a photoconductor under light with an ohmic contact, as evidenced by the dark current and photocurrent in FIG. 9. A feature of the photodetector 100 is that it has a low dark current (comparable to that of a photodiode) and a large gain (comparable to that of a photoconductor), resulting in a high sensitivity. The figure of merit for a photodetector is the specific detectivity which characterizes the capability of a photodetector to detect the weakest light signal. In addition to responsivity, the other factor that limits the specific detectivity of a detector is the noise current. The dark current of the photodetector 100 can be, e.g., as low as 6.8 nA at −9 V bias voltage because of the use of the first and second buffer layers 116 and 118, which block the transport of electrons and holes at the anode and the cathode side, respectively, in dark condition, as shown in FIG. 9, which gives a very low shot noise. To include other possible noise, such as flicker noise and thermal noise, the total noise current of the photodetector was directly measured with a SR830 lock-in amplifier at different dark current density and frequency. As shown in FIGS. 10A and 10B, the measured total noise current was found to be dominated by the shot noise within the frequency range of 1 Hz to 5 kHz. The specific detectivities (D*) of a photodetector are given by:

$$D^* = \frac{(AB)^{1/2}}{NEP} \left( cm\, Hz^{\frac{1}{2}} W^{-1}\, or\, Jones \right) \qquad (Equ. 3)$$

$$NEP = \frac{\overline{i_n^2}^{1/2}}{R}(W) \qquad (Equ. 4)$$

where A is the device area, B is the bandwidth, NEP is the noise equivalent power, $\overline{i_n^2}^{1/2}$ is the measured noise current, and R is the responsivity.

Figure 11:
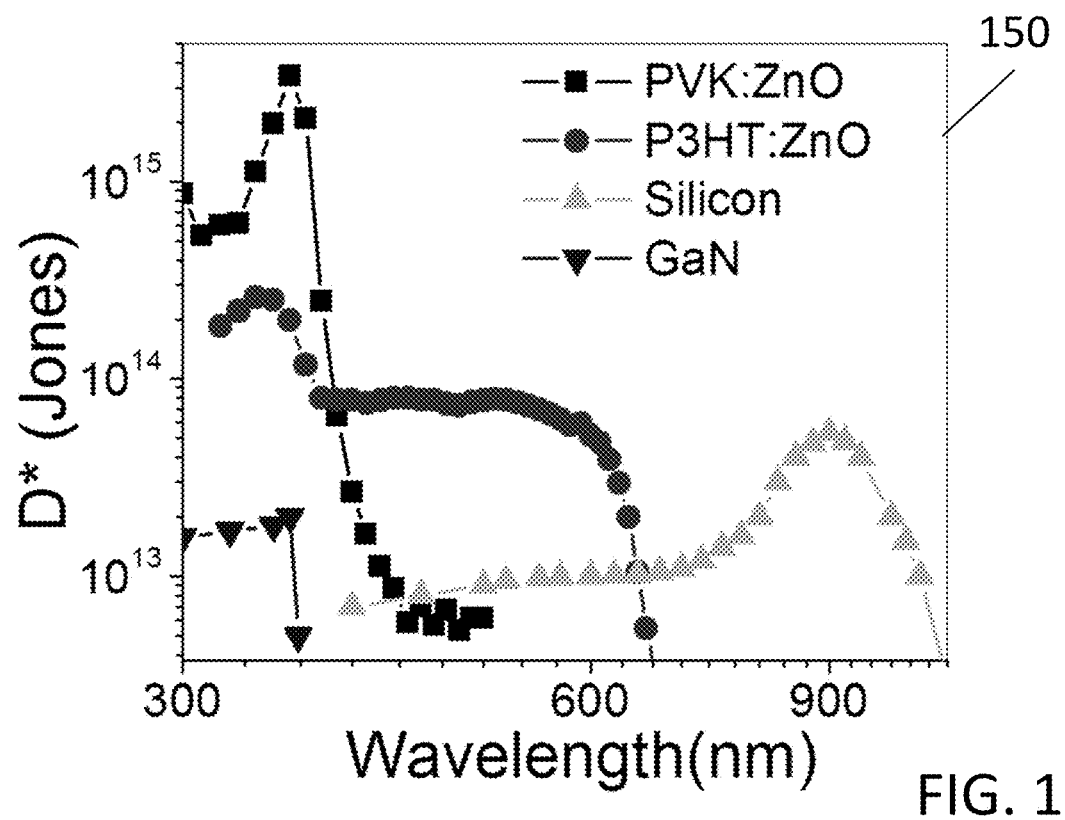
FIG. 11 is a graph showing specific detectivities of the photodetector at various wavelengths.

Referring to FIG. 11, a graph 150 shows the detectivities of the nanocomposite photodetector 100 that were calculated at different wavelengths with the measured noise current, responsivity at −9 V bias. At illumination light intensity of 1.25 μW/cm², the specific detectivities at 360 nm are 3.4×10¹⁵ Jones for PVK:ZnO devices and 2.5×10¹⁴ Jones for P3HT:ZnO devices. The specific detectivities in the UV range are 2 to 3 orders of magnitude larger than silicon and GaN UV detectors. The specific detectivity of a P3HT:ZnO device within the visible light range is also more than ten times better than that of silicon detectors.

Figure 12:
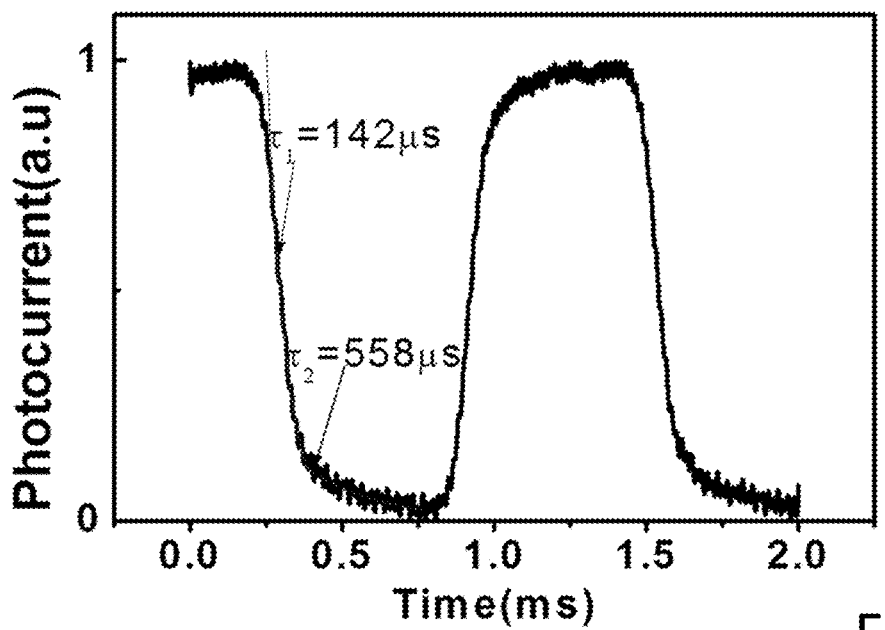
FIG. 12 is a graph showing the transient photo response waveform of an exemplary photodetector having a P3HT:ZnO active layer operating under a −9 V bias voltage.

An important parameter of the photodetector is the response speed. The temporal response of the nanocomposite detector was characterized by a chopper-generated short light pulse. FIG. 12 shows the transient photocurrent of the P3HT:ZnO device measured under a bias of −9 V at light intensity of 1 μW/cm². The transient response result shows a rise time (output signal to change from 10-90% of the peak output value) of 25 μs which was limited by the rising edge of the light pulse from the optical chopper. The decay of the photocurrent after switching off the UV pulse has a fast component of 142 μs and a slow component of 558 μs, which indicates the existence of two channels for the recombination of holes. The 3-dB bandwidth is 9.4 kHz. The photodetector 100 provides several orders of magnitude in improvement in gain-bandwidth product compared to previous photodetectors. The multiple-exponential decay time can be caused by the electron traps with different trap depths due to the non-uniform nature of ZnO nanoparticles or aggregates in the present hybrid devices. Deeper traps have longer charge release time and thus result in slower device response speed.

The photodetector response speed is related to the trap occupancy which depends on the light intensity. At a lower light intensity, the photocurrent decay may be dominated by the slower process of 558 μs because deeper traps are easier to be filled. The response speed at lower light level may be increased by improving the uniformity of ZnO nanoparticles. The photoconductive gain is the ratio between hole recombination time, or device switch-off time, and the transit time that holes sweep through the nanocomposite film to the ITO. The calculated gain of the P3HT:ZnO device from the measured hole mobility and hole recombination time is 3,798.

Figure 13:
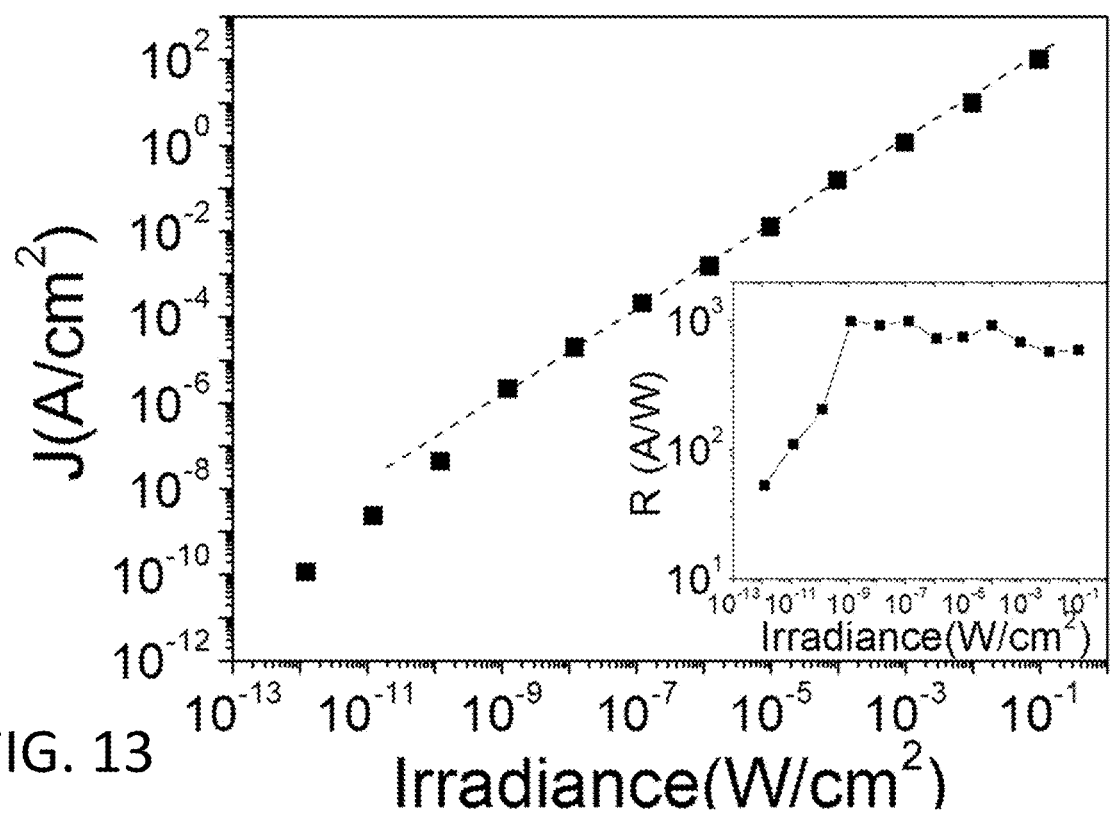
FIG. 13 is a graph showing the dynamic range of an exemplary photodetector having a PVK:ZnO active layer. The inset shows responsivities under various illumination intensities.

The photodetector 100 has a large linear dynamic range (LDR) to measure both strong and weak light. The linear dynamic range of the nanocomposite photodetector 100 was characterized by measuring the photocurrent at a fixed frequency of 35 Hz at varied light intensity from 10⁻¹ W/cm² down to 10⁻¹² W/cm². As shown in FIG. 13, the PVK:ZnO photodetector shows a linear response within the incident light intensity range from 10⁻¹ to 10⁻⁹ W/cm², corresponding to an linear dynamic range of 80 dB. The responsivity keeps almost constant in this light intensity range despite a slight (~10%) drop at high light level (inset of FIG. 13). This slight sublinear response at high light intensity is possibly caused by electron trapping saturation and/or limitation of hole mobility in the nanocomposite layers. The device begins to loss its linearity when the incident light intensity is below 10⁻⁹ W/cm². The responsivity drops to 52 A/W and the specific detectivity drops to 2.45×10¹⁴ Jones accordingly at a light intensity of 1.25×10⁻¹² W/cm². The sub-linearity and declined detectivity at low light level is a disadvantage because high gain at low light intensity is desired for weak light detection. However, it can be improved by tuning the morphology of the nanocomposite layer. In principle, we expect a constant responsivity down to the lowest detectable incident light level (or noise equivalent power, NEP) if the automatic transition from the Schottky junction to Ohmic contact occurs at such a low incident light level. This is possible because the incident photons can cause a band bending in the local environment surrounding the light-absorbing ZnO nanoparticles that induces strong local hole injection. However, the degree of local band bending varies with the morphology of the nanocomposite layer. If there is aggregation of ZnO nanoparticles, the local average trapped electron density may be reduced and the induced charge injection may be weakened. In addition, there are still many ZnO nanoparticles located in the middle of nanocomposite layer or at the anode side despite the higher ZnO nanoparticles concentration at the cathode side due to the TPD-$Si_2$ interface-induced vertical phase separation. Light absorption by these ZnO nanoparticles far away from the cathode may not induce as much Schottky junction-narrowing effect as those close to the cathode side. This non-ideal morphology may increase the lowest detectable light intensity by the nanocomposite photodetector. It may be possible to reduce the lower limit of detectable light intensity and improve the linear response by pushing more ZnO nanoparticles closer to the cathode side.

Advantages of the photodetector 100 include one or more of the following. The photodetector 100 can be made at a low cost, and the fabrication process can be easily scaled up to a large area. The photodetector 100 has a high gain and a low dark current due to the absence of Ohmic contact in the dark, and can respond quickly.

The following describes exemplary methods for preparing the photodetector. ZnO nanoparticles were prepared using a hydrolysis method in methanol with some modifications. For example, 2.95 g (23 mmol) $ZnAc2.2H_2O$ was dissolved in 125 ml MeOH at 60° C. and followed by dropwise adding KOH solution (1.57 g KOH in 65 ml MeOH) within 5 min. After about 1.5 hour, when the reaction solution became turbid from transparent, the reaction mixture was stirred for one more hour. The nanocrystals were collected by centrifuge and were washed by methanol for three times, and then dispersed in chlorobenzene to form transparent solution.

To fabricate the photodetector, PEDOT:PSS was first spin-cast onto a cleaned ITO glass substrate at a spin speed of 3,000 r.p.m., which gives a PEDOT:PSS film thickness of approximately 30 nm. The PEDOT:PSS was then baked at 120° C. for 30 min before spin-casting the polymer film. Poly vinylcarbazole (PVK) was first dissolved in 1,2-dichlorobenzene to produce a 20 mg $ml^1$ solution, followed by blending with 4,4'-Bis[(p-trichlorosilylpropylphenyl)phenylamino]-biphenyl (TPD-$Si_2$) in a ratio of 1:1 by weight. TPD-$Si_2$ is a cross-linkable, hole-transporting organosiloxane material. The hole-transporting layer was obtained by spin-coating the blend at 4000 r.p.m. for 20 s, and the thickness of the blend film was approximately 70 nm. The film was annealed at 100° C. for 1 hour in air. Due to the plastic effect of TPD-$Si_2$ through thermal annealing, it was stable and has a good resistance to the solvent in the following spin coating process. The active layer was a blend of ZnO with PVK or P3HT in the ratio of 3:1 by weight. It was spin-coated at 1000 r.p.m. for 20 s, then solvent annealed for eight hours. The thickness of the active layer was approximately 550 nm. A 100 nm thick aluminum was thermal evaporated to form the cathode. The active device area was 0.05 $cm^2$.

Electrostatic force microscopy (EFM) was used to characterize the topography and electron trap distribution in the nanocomposite films. The cross-section morphology of the P3HT:ZnO nanoparticle nanocomposite was measured by SEM. The UV light was provided by Newport QE measurement kit which combines a Xe lamp and a monochromator. A Si diode was used to calibrate the light intensity for photocurrent measurement. The external quantum efficiency was measured with the Newport QE measurement kit by focusing a monochromatic beam of light (chopped at 35 Hz, at an optical power density less than or equal to 0.1 $mW/cm^2$) onto the devices. For the transient response measurement, an optical chopper was used to generate the light pulses, a 100K resistor was connected in series with the photodetector, and an oscilloscope (LeCroy WaveRunner) was used to record the voltage variation of the resistor. Batteries were used to bias the device for the measurement of the noise current to minimize noise components from the bias source. The absorption spectra of the photoactive layers PVK:ZnO and P3HT:ZnO were measured with a PerkinElmer Lambda 900 spectrometer. The film thickness was measured with an AMBIOS XP-2 stylus profilometer. Noise current was directly measured with a Lock-In Amplifier SR830.

Figure 14:
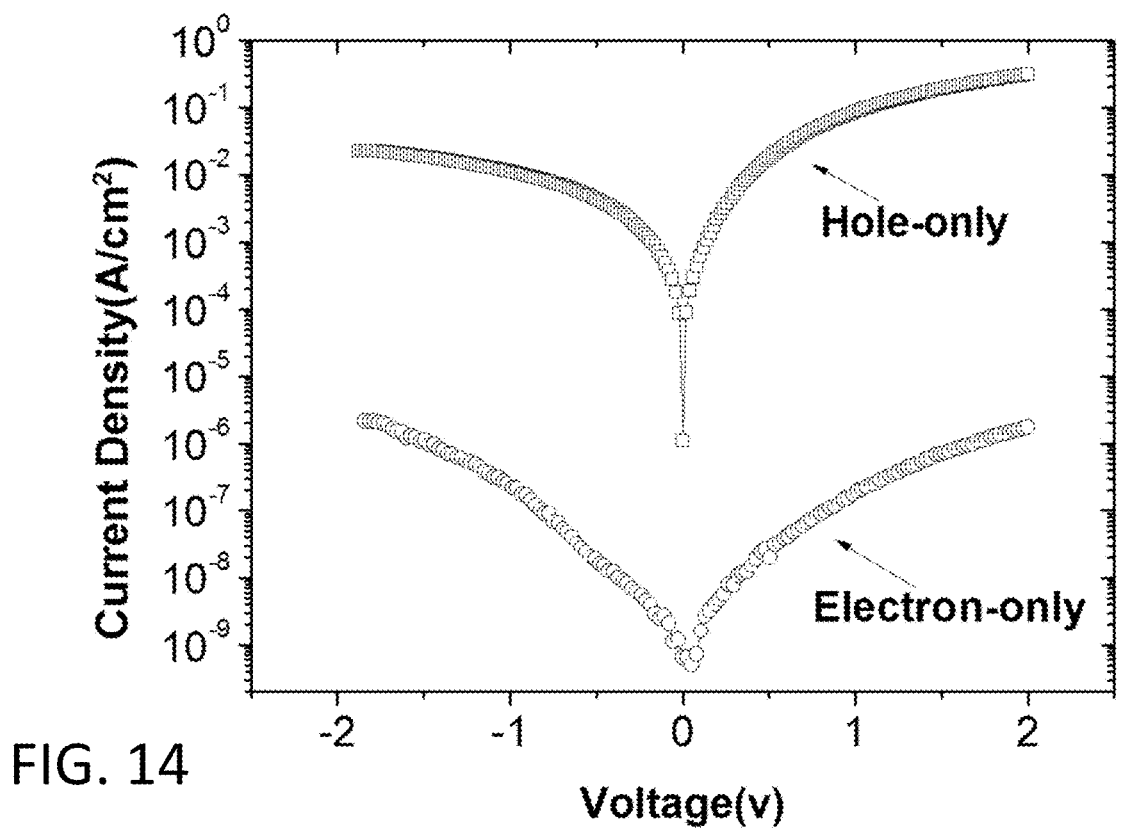
FIG. 14 is a graph showing the current-voltage (I-V) curve under dark conditions for an exemplary hole-only device and an exemplary electron-only device.

In order to verify the electron trapping in the proposed device, hole-only and electron-only devices were constructed to investigate the type of charge trapping in the photodetectors. The constructed structure is ITO/$CsCO_3$/PVK:ZnO/$CsCO_3$/Al for electron-only and ITO/PEDOT/PVK:ZnO/$MnO_3$/Al for hole-only devices, respectively. FIG. 14 is a graph that shows the current-voltage (I-V) curve under dark conditions.

Figure 15A:
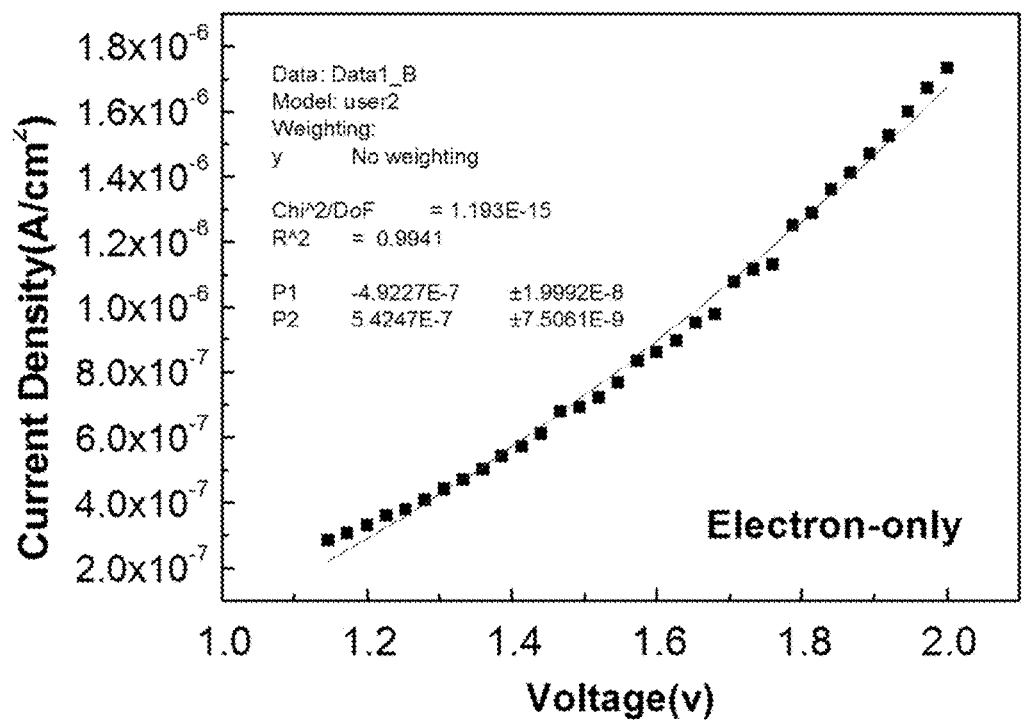
FIG. 15A is a graph showing the J-V curve fitting for the electron-only device.
Figure 15B:
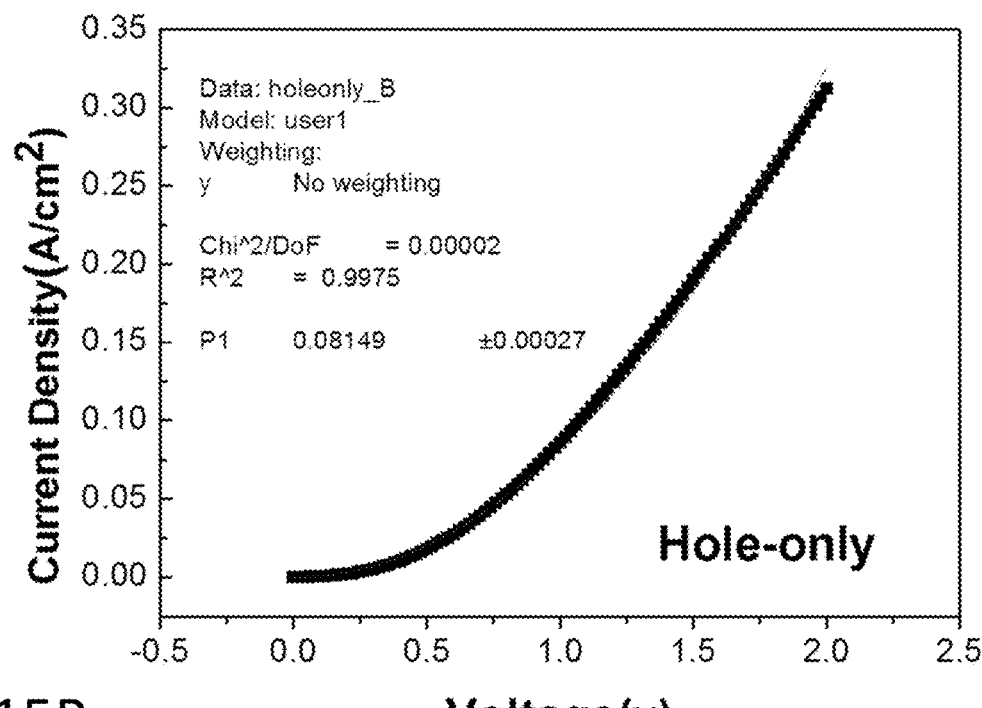
FIG. 15B is a graph showing the J-V curve fitting for the hole-only device.

FIGS. 15A and 15B are graphs showing J-V curve fitting for the electron-only and hole-only devices, respectively. The calculated mobility is $2 \times 10^{-4}$ $cm^2/VS$ for hole and $1.4 \times 10^{-9}$ $cm^2/VS$ for electron. The current density in hole-only device is 4 to 5 orders of magnitude higher than electron-only device. This means electrons can hardly move in the active layer and can be easily trapped by the nanoparticles in the active layer. On the other hand, holes can freely move with a relatively high mobility and thus enables the high photoconductive gain in the photodetector under illumination.

Figure 16:
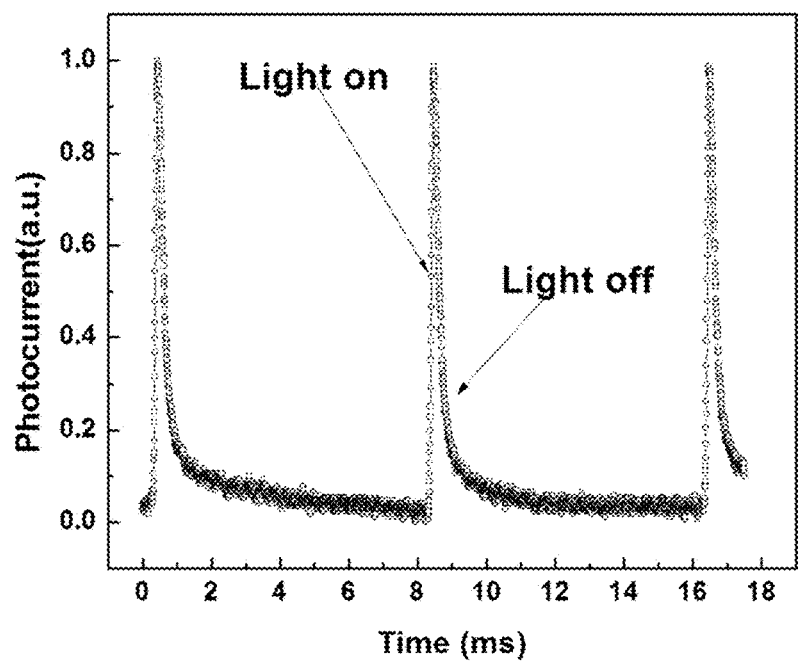
FIG. 16 is a graph showing the transient photo response of an exemplary photodetector that uses a P3HT: ZnO active layer.

FIG. 16 is a graph showing the transient photo response of a photodetector that uses a P3HT:ZnO active layer. It has a rise time of about 92 μs (from 10% to 90% of the light intensity level) and a fall time of about 768 μs (from 90% to 10% of the light intensity level), respectively. The RC time constant is 60μ and the chopper open/close time is 12 μs when operating at 125 Hz.

Figure 17:
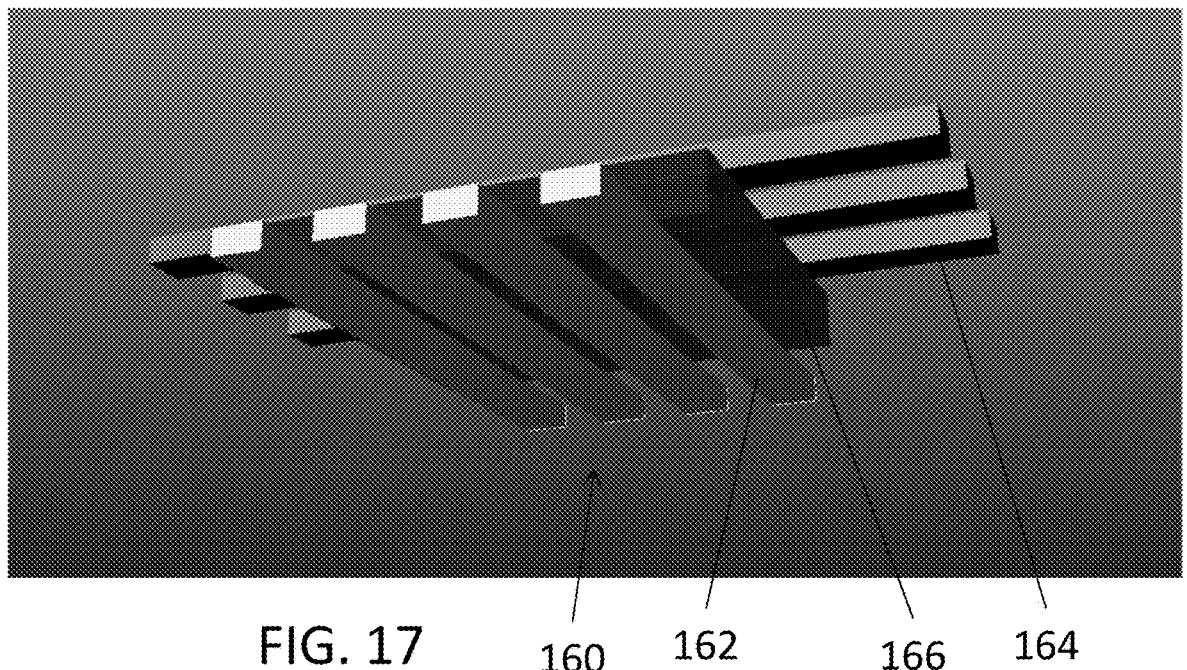
FIG. 17 is a diagram of an exemplary photodetector array.

Referring to FIG. 17, in some implementations, a photodetector array 160 includes anode lines 162 that are individually selectable, cathode lines 164 that are individually selectable, and an active layer 166 disposed between the anode lines 162 and the cathode lines 164. The active layer 166 can be similar to the active layer 108 shown in FIG. 1 and includes nanoparticles dispersed in a semiconducting polymer. Each intersection of one of the anode lines 162 and one of the cathode lines 164 form an individually selectable photodetector.

A first buffer layer (not shown) is disposed between the active layer 166 and the anode lines 162, and a second buffer layer (not shown) is disposed between the active layer 166 and the cathode lines 164. The first buffer layer and the second buffer layer can be similar to the first buffer layer 116 and the second buffer layer 118, respectively, of FIG. 1. A controller (not shown) can be configured to receive an address signal and select one of the photodetectors based on the address signal. The controller can apply a bias voltage to the selected photodetector, and measure the current through the selected photodetector to detect light. The amount of current is a function of the level of light. Thus, the photodetector array 160 can be used as an image sensor.

Figure 18:
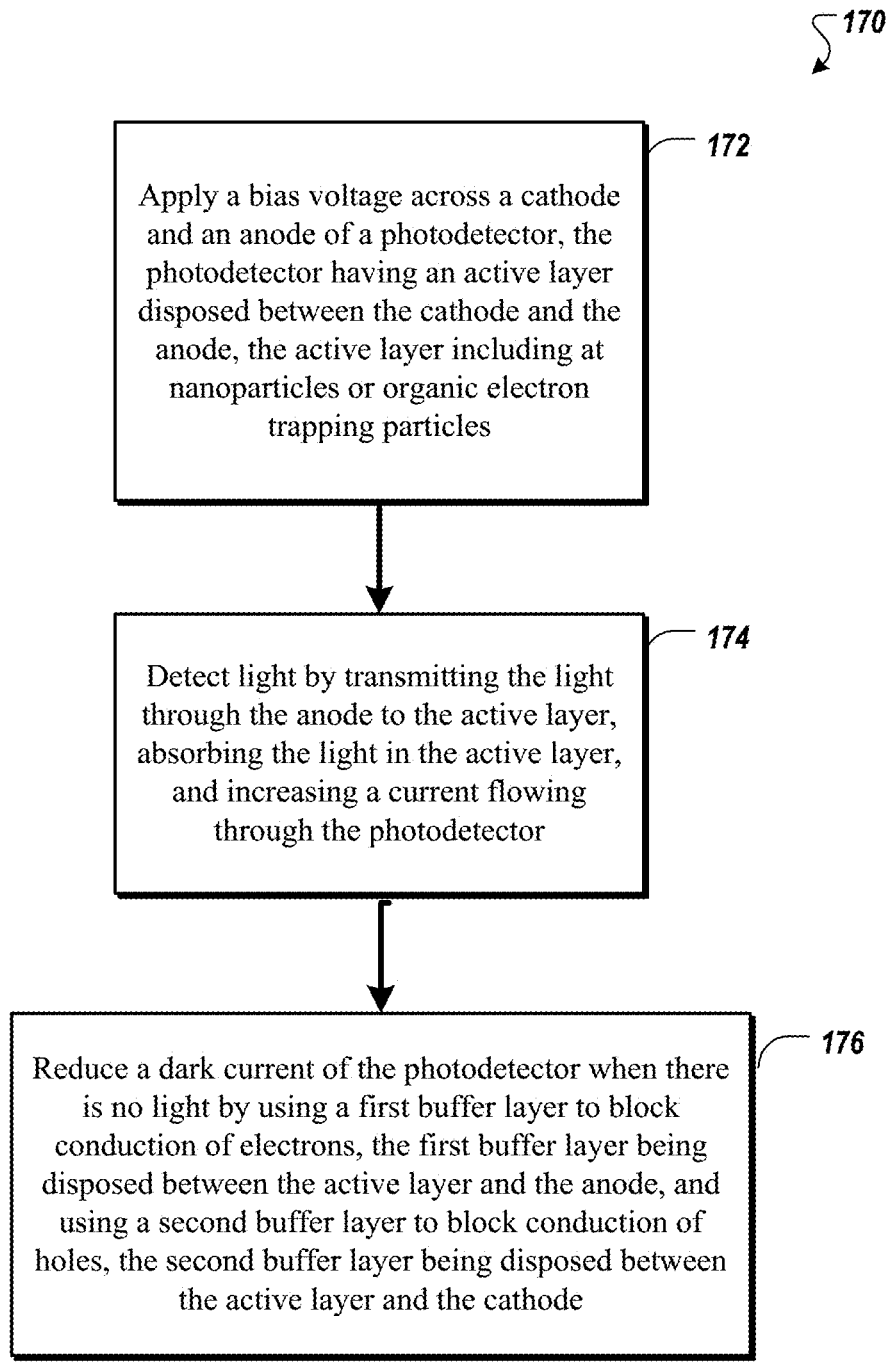
FIG. 18 is a flow diagram of an example process for detecting light.

Referring to FIG. 18, a process 170 for detecting light is provided. For example, the process 170 can be implemented using the photodetector 100 of FIG. 1.

Process 170 includes applying a bias voltage across a cathode and an anode of a photodetector (172), in which the photodetector has an active layer disposed between the cathode and the anode. The active layer includes nanoparticles or organic electron trapping particles.

The process 170 includes detecting light by transmitting the light through the anode to the active layer, absorbing the light in the active layer, and increasing a current flowing through the photodetector (174).

The process 170 includes reducing a dark current of the photodetector when there is no light by using a first buffer layer to block conduction of electrons, the first buffer layer being disposed between the active layer and the anode, and using a second buffer layer to block conduction of holes, the second buffer layer being disposed between the active layer and the cathode (176).

Various modifications can be made to the examples discussed above. For example, the thickness of the active layer 108 can be different from those described above. The photodetector can be used to detect light having wavelengths that are different from those described above. The spectrum can be extended to infrared region by using either low bandgap nanoparticles, low bandgap polymer, or both. For example, the nanoparticles can include lead sulfide (PbS) nanoparticles, which absorbs infrared light. A photodetector having an active layer that includes lead sulfide nanoparticles is useful as an infrared light detector.

Figure 19:
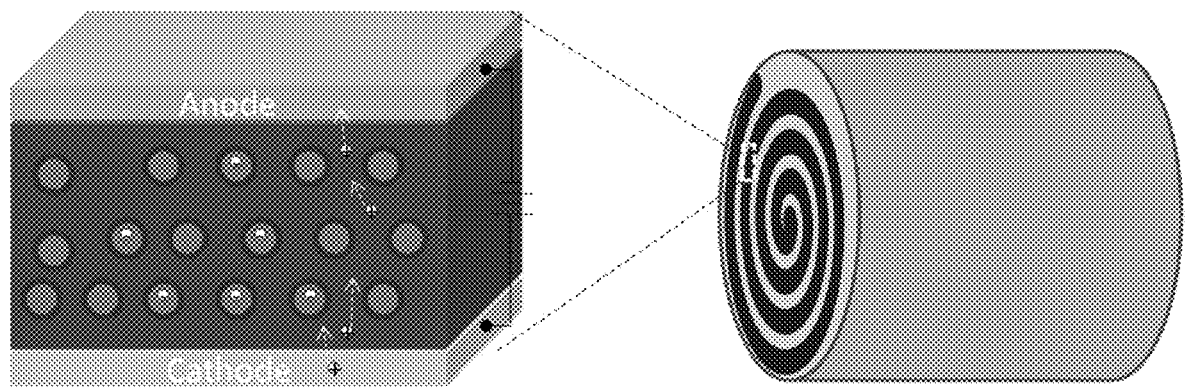
FIG. 19 is a diagram of an exemplary detector having a roll-up structure.

The photodetector structure described above can be used to make radiation detectors that detect, e.g., x-rays, gamma rays, and neutrons. A γ-ray or neutron detector can include a nanocomposite material as active layer composed of nanoparticles dispersed in a semiconducting polymer, as shown in FIG. 19. For γ-ray detection, the materials chosen for the nanoparticles can include the family of $Cd_{1-x}Zn_xTe$ (CZT) and its core-shell heterostructures with bandgap greater than 1.8 eV. The stopping power of CZT is about one to two times higher than NaI, four to five times higher than Ge, and 100 times larger than Si for typical gamma-ray energies. For neutron detection, the active layer can include materials such as $B^{10}$ nanoparticles or compound materials containing high weight percentage of $B^{10}$, such as boron carbide and/or boron nitride. Regioregular poly(3-hexylthiophene) (P3HT), which is commercially available, can be used as the polymer because it provides high hole mobilities reaching up to 1 $cm^2V^{-1}$ $s^{-1}$. P3HT:NPs will form a good donor/acceptor pair with a type II heterojunction. A thin layer of aluminum can be used as the cathode and the anode. The thin film photodetector can be fabricated on a flexible plastic foil, and the detector size can be scaled up to be larger than 1" by rolling up flexible detector sheets to form a cylinder shaped detector. This type of detector is low cost because of the low-cost materials used and low-cost solution fabrication method, and also because there is no need for a cooling system or amplifier electronics.

As discussed above, the photodetector includes a transparent electrode, an active layer composed of nanoparticles blended with a semiconducting polymer, buffer layers, and a contact cathode. These components can be made from various materials described below.

For example, the transparent electrode may be made of a material selected from suitable transparent conductors such as, but not limited to, indium tin oxide (ITO), fluorine-doped tin oxide (FTO), aluminum-doped zinc oxide (AZO), antimony-tin mixed oxide (ATO), highly conductivity polymer, networks of metal or carbon nanowire, nanotube, nanosheet or nanorod, carbon nanotube, silver nanowire and graphene. The transparent electrode may be deposited on transparent substrates, such as plastic and/or glass substrates.

For example, the nanoparticles may be selected from, but not limited to, zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2); cadmium selenide (CdSe), lead selenide (PbSe), cadmium telluride (CdTe), lead telluride (PbTe), Si, Ge, InAs, InSb, Pb1-xSnxTe, Hg1-xCdxTe, InAsSb, InNSb, InBiTe, InTlSb; or super lattices including: InAs/GaInSb, HgTe/CdTe, carbon nanomaterials (graphene quantum dots, carbon nanotube, fullerene). The nanoparticles can be solution or vacuum deposited particles.

Instead of using nanoparticles, organic electron trapping material (or organic electron acceptor material) may also be used. For example, the electron acceptor material may be selected from, but not limited to, a fullerene and derivatives thereof, a perylene derivative, a 2,7-dicyclohexyl benzo, phenanthroline derivative, a 1,4-diketo-3,6-dithienylpyrrolo [3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, and combinations thereof, [6,6]-phenyl C61-butyric acid methyl ester (PCBM), [6,6]-phenyl C61-butyric acid methyl ester (PC70BM), [6,6]-(4-fluoro-phenyl)-C61-butyric acid methyl ester (FPCBM), carbon 60 (C60), carbon 70 (C70), carbon nanotube (CNT), a carbon onion, and combinations thereof.

For example, the semiconducting polymers may be selected from electron donor materials such as, but not limited to, polyvinylcarbazole (PVK), poly(3-hexylthiophene) (P3HT), poly[4,8-bis-(2-ethyl-hexyl-thiophene-5-yl)-benzo[1,2-b:4,5-b']dithiophene-2,6-diyl]-alt-[2-(2'-ethyl-hexanoyl)-thieno[3,4-b]thiophen-4,6-diyl (PBDTTT-CT), phthalocyanine complex, a porphyrin complex, a polythiophene (PT) and derivatives thereof, a polycarbazole and derivatives thereof, a poly(p-phenylene vinylene) (PPV) and derivatives thereof, a polyfluorene (PF) and derivatives thereof, a cyclopentadithiophene-based polymer, a benzodithiophene (BDT)-based polymer, and combinations thereof, polythiophenes and derivatives thereof, polycarbazoles and derivatives, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b] thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly{[2,7-(9,9-bis-(2-ethylhexyl)-fluorene)]-alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]}(BisDMO-PFDTBT), poly[N-9''-hepta-decanyl-2,7-carbazole-alt-5,5-(4',7'-di-2-thienyl-2',1',3'-benzothiadiazole)] (PCDTBT), and combinations thereof.

For example, the cathode contact material may be selected from, but not limited to aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or combinations thereof. The cathode contact material may be solution or vacuum deposited thin films.

Buffer layers, both at the anode and at the cathode interface, mainly to favor charge collection, extraction or blocking, can improve the device's overall performance.

For example, the anode buffer layer may use a material selected from organic materials, self-assembled monolayers (SAMs), or inorganic materials, such as, but not limited to poly(3,4-ethylenedioxithiophene) (PEDOT) doped with poly(styrene sulfonicacid) (PSS), 4,4'-bis[(ptrichlorosilyl-propylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANT), poly[(9,9-dioctylfluorene)-co-N-(4-(1-methylpropyl)phenyl)diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

The cathode buffer layer may use a material selected from alkali metal compounds, metal oxide, organic materials, self-assembled monolayers (SAMs), or inorganic materials, such as, but not limited to, LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFP-NBr), or poly(ethylene oxide) (PEO).

Sensitive Narrowband Nanocomposite Photodetectors with Gain

The following describes a highly sensitive narrowband red-light nanocomposite photodetector with gain. The sensitive photodetector with narrow band response is useful in, e.g., the fields of biomedical measurement, elemental analysis, and scientific research. For biomedical measurements, the dyeing method can be used to mark target cells in a sample. To accurately distinguish the position and obtain the concentration of marked cells by fluorescence detection, it is useful to have photodetectors that can selectively detect the fluorescence emission generated by marked cells while having weak or no response to background emission or excitation light. In some implementations, an optical band-pass filter is used to select a wavelength band according to the requirements of a given application. In some situations, optical filters may not cover the spectrum needed, and the optical filters may add cost to the photodetectors. In some examples, photodetectors that use interference-based filters may have problems related to contamination, shoulder absorption, or increased sensor sizes.

Figure 35A:
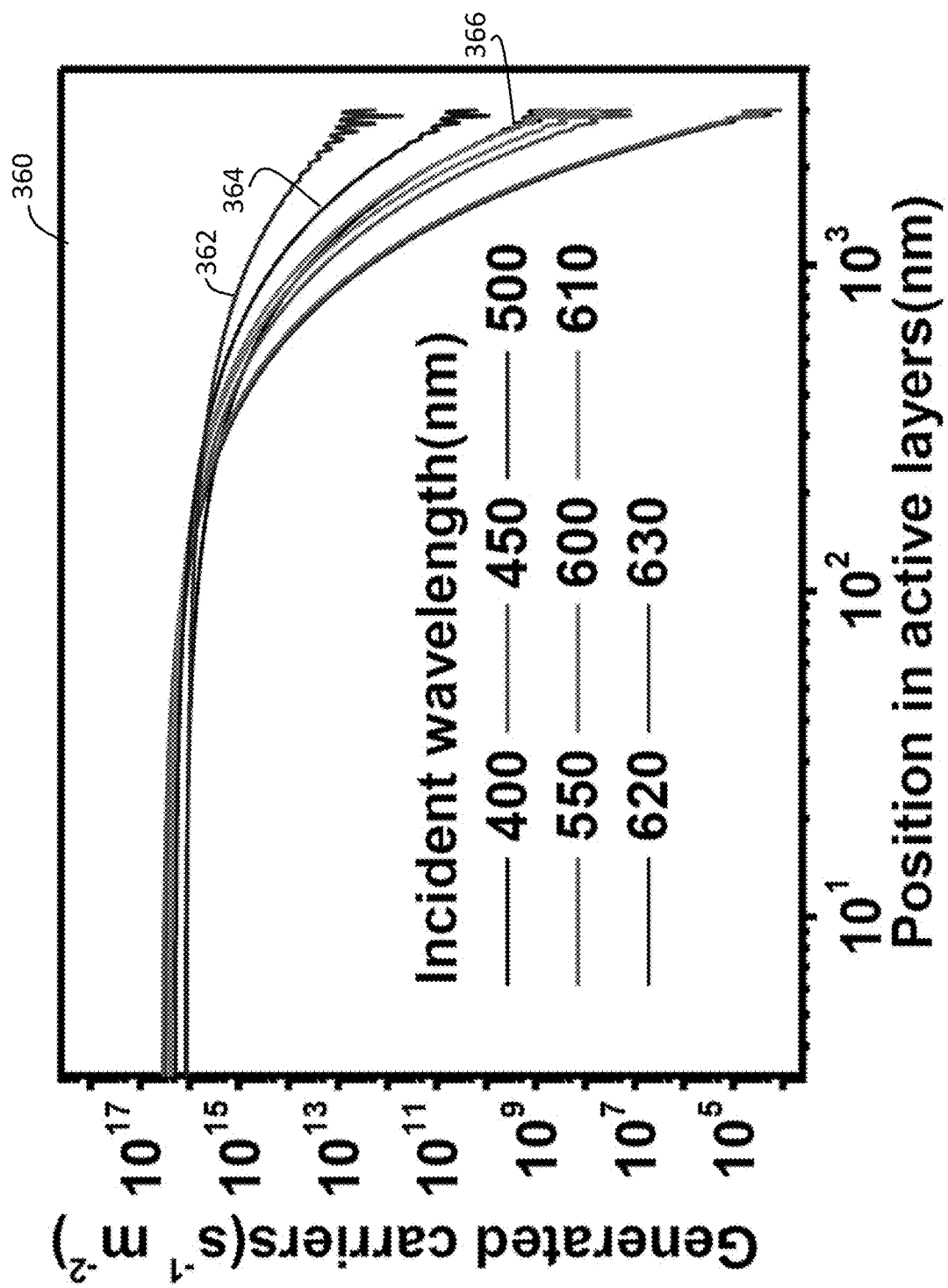
FIGS. 35A and 35B are graphs showing exemplary generation rates of photo-generated carriers versus the position in the active layers for various incident light wavelengths.
Figure 35B:
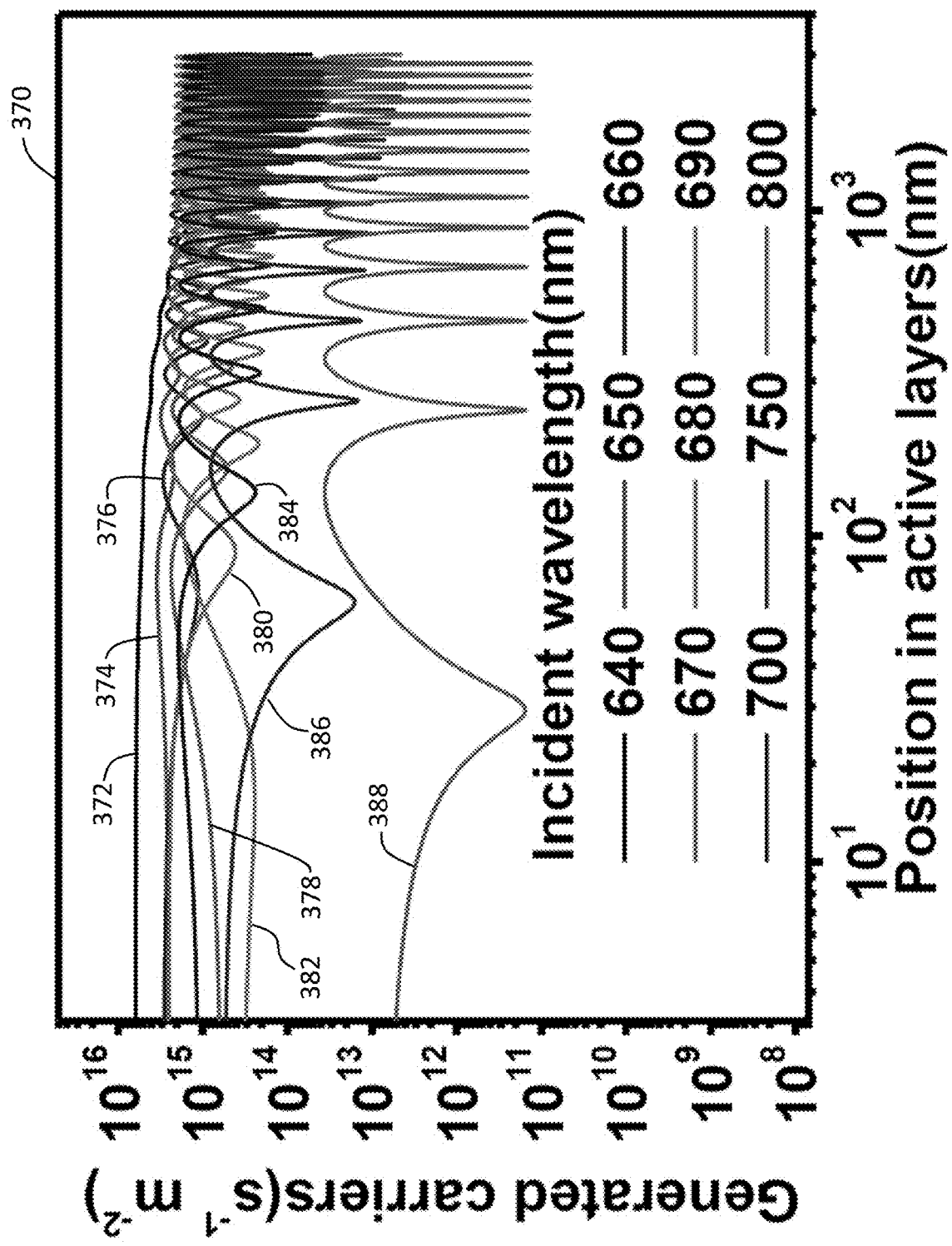

Referring to FIG. 20, in some implementations, a narrow-band photodetector 200 that does not use an optical filter includes a thick polymer bulk heterojunction film 202 placed between an anode 204 and a cathode 206. The photodetector 200 uses the difference of light attenuation lengths at different wavelengths to achieve the wavelength-dependent charge collection spectrum. In general, the absorption coefficient of a photoactive material is wavelength dependent. The absorption of light near or below the bandgap is much smaller than the absorption above the bandgap. Thus, light having a longer wavelength has a larger penetration depth ($L_p$) in the photoactive layer, resulting in a distribution of charge generation as shown in FIGS. 35A and 35B.

When the photoactive layer 202 is thick (e.g., having a thickness of 3 μm to 4 μm), the photo-generated charges that are generated by light having shorter wavelengths may not be collected by the electrodes and may recombine inside the active layer 202, in which the sum of the penetration depth ($L_p$) and the charge drift length ($L_d$) is less than the film thickness ($L_f$). Therefore, only the carriers that are photo-generated by light having longer wavelengths, which have a smaller absorption coefficient, have a chance to be partially collected by the electrodes. As a result, the photodetector having a thick active layer has photo responses only to light having longer wavelengths, and has a small or no response to light having shorter wavelengths, resulting in a photo response peak near the band-edge, as illustrated in FIG. 20. This mechanism allows the photodetector 200 to achieve narrow-band light detection. The particular narrow band of light that can be detected by the photodetector can be configured by selecting appropriate parameters for $L_p$, $L_d$ and $L_f$.

We performed simulations to determine the charge generation region using a poly-(3-hexylthiophene)(P3HT): [6,6]-phenyl C60 butyric acid methyl ester (PCBM) material system in a device having the following structure: indium tin oxide (ITO)/poly(N-vinylcarbazole) (PVK) (20 nm)/P3HT:PCBM (3 μm)/2,9-dimethyl-4,7-diphenyl-1,10-phenanthroline (BCP)(10 nm)/aluminum (Al) (100 nm). In this photodetector, the electrodes are made of indium tin oxide and aluminum, respectively. The active layer includes P3HT:PCBM and has a thickness of 3 μm. The buffer layer between the indium tin oxide electrode and the active layer includes PVK and has a thickness of 20 nm. The buffer layer between the aluminum electrode and the active layer includes BCP and has a thickness of 10 nm.

FIG. 21 is a graph 204 that shows the distribution of normalized modulus square of optical electric field ($|E(x)^2|$) in the active layer 202. The color difference represents the $|E(x)^2|$ intensity. The graph shows that the $|E(x)^2|$ value is almost zero below 630 nm at a distance of 500 nm from the indium tin oxide layer, but a strong oscillation of $|E(x)^2|$ around 700 nm appears across the whole active layer due to the interference effect. This suggests that light having a wavelength from 400 nm to 630 nm is totally (or near totally) absorbed by the 500 nm P3HT:PCBM layer due to the shorter penetration depth $L_p$. On the other hand, light having a wavelength equal to or above 630 nm can penetrate 3 μm or more into the active layer 202. Thus, the charges generated by light having wavelengths equal to or greater than 630 nm can reach the cathode.

One limitation of using the structure shown in FIG. 20 for narrow band photo detection is that the responsivity of the photodetector 200 may be relatively low because a significant amount of photo-generated charges near the transparent electrode cannot be collected by the counter electrode. In some examples, the maximum external quantum efficiency (EQE) is only 30%. We performed a computation of the external quantum efficiency by assuming that all the charges generated within the charge drift length $L_d$ from the aluminum cathode can be completely collected, and derived the external quantum efficiency spectrum of the thick P3HT:PCBM device. An explanation of the calculation process is provided later in this document. Referring to FIG. 22, a graph 206 shows that the theoretical external quantum efficiency limit is less than 20%.

In the following, we describe a photodetector that has charge traps introduced into the photoactive layer, resulting in a large linear dynamic range of, e.g., up to 110 dB and a low noise equivalent power (NEP) of, e.g., 5 pW/cm$^2$. Referring to FIG. 23, a photodetector 220 includes an active layer 222 having charge trapping nanoparticles, such as cadmium telluride (CdTe) quantum dots 224. In this example, the active layer 222 includes a P3HT:PCBM bulk-heterojunction film 226, but other materials can also be used. Use of different materials for the active layer 222 may allow the photodetector to detect light having different wavelengths. In some implementations, the narrowband photodetector 220 has a responsivity that is 20 times greater than the responsivity of the narrowband response photodetector 200 (which does not have charge trapping nanoparticles) of FIG. 20. FIG. 24 is a cross-section scanning electron microscopy (SEM) image 230 of the active layer 222. In operation, a power supply 228 provides a bias voltage that is applied to the electrodes of the photodetector 220.

One of the differences between the photodetector 220 of FIG. 23 and the photodetector 100 of FIG. 1 is in the thickness of the photoactive layer. The photodetector 100 includes a photoactive layer 108 having a thickness of about 100 nm to 500 nm, whereas the photodetector 220 includes a photoactive layer 222 that has a thickness of about 3 µm to 4 µm. The thick photoactive layer 222 provides selectivity among charges generated by light of different wavelengths. Because light having a shorter wavelength has a smaller penetration depth, the charges generated by photons having shorter wavelengths (e.g., wavelength less than 630 nm) are not collected by the anode. On the other hand, because light having a larger wavelength (e.g., wavelength equal to or greater than 630 nm) has a larger penetration depth, the charges generated by photons having larger wavelengths can be partially collected by the anode. This allows the photodetector to have a narrow band response to light having larger wavelengths, e.g., red light.

Figure 25:
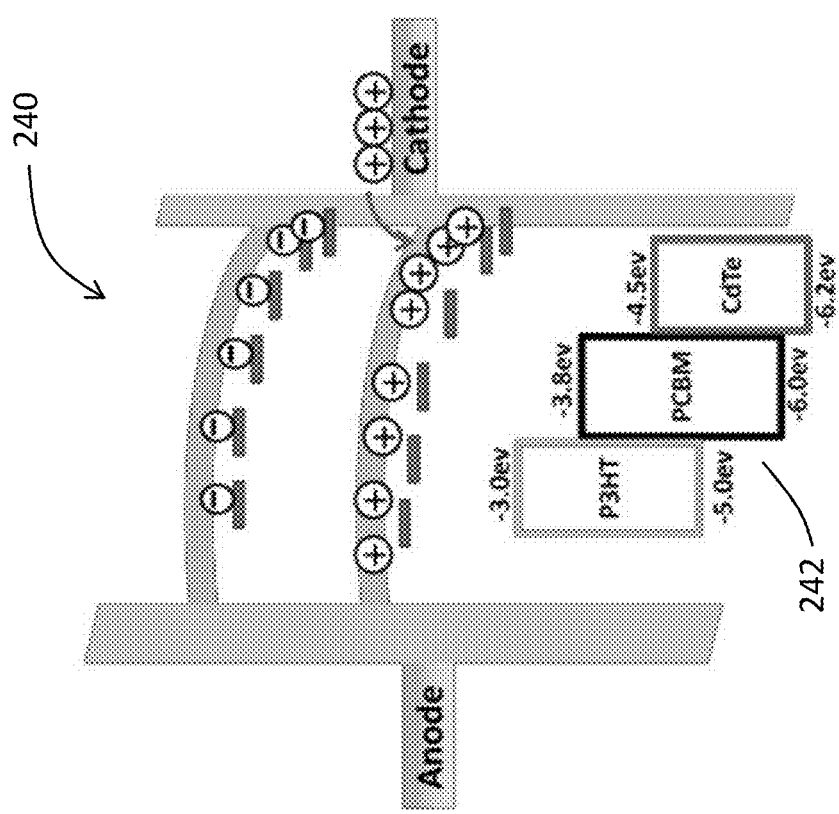
FIG. 25 is an energy diagram of an exemplary photodetector.

The introduction of charge trapping nanoparticles, such as cadmium telluride quantum dots 224, into the P3HT:PCBM bulk-heterojunction film 226 enables the photodetector 220 to achieve a large photoconductive gain. FIG. 25 shows an energy diagram 240 of the photodetector 220. An inset 242 shows the energy levels of P3HT, PCBM, and cadmium telluride. The diagram 240 shows that P3HT acts as electron donor, and both PCBM and cadmium telluride quantum dots work as electron acceptors. The introduction of cadmium telluride quantum dots that have a long electron trapping time significantly elongates the electron-hole recombination time. A photoconductive gain is thus realized because the photoconductive gain is determined by the ratio of the hole recombination lifetime time and the hole transit time. The photodetector 220 device has high gain and low noise in part because of the vertical phase separation in the nano-composition layer, which is also shown in the image 230 of FIG. 24.

In this example, the cadmium telluride quantum dots are predominately located at the top interface near the aluminum electrode. Under illumination, photo-generated electrons transfer from P3HT to PCBM and the cadmium telluride quantum dots. The electrons, including those transferred from P3HT and generated in the cadmium telluride quantum dots, are trapped by the cadmium telluride quantum dots near the cathode, which causes doping of electrons in the P3HT:PCBM:CdTe layer at the top surface by forming the space charge layer in-situ. The trapped electrons, which shift the lowest unoccupied molecular orbital (LUMO) of the P3HT downwards and align the Fermi energy of the active layer 222, causes more holes to be injected into the nanocomposite from the cathode when a small reverse bias voltage is applied due to the decreased charge injection barrier thickness. This provides a mechanism to form an Ohmic contact. Since the valance band top of cadmium telluride is deeper than the highest occupied molecular orbital of P3HT, accumulation of cadmium telluride quantum dots at the interface of nanocomposite/aluminum will not enhance the dark current due to the limited hole injection. As a result, when a small reverse bias voltage is applied to the electrodes, the photodetector is transformed from a photodiode to a photoconductor because the Schottky contact is replaced by an Ohmic contact. Thus, the photodetector has a gain in which the number of charges collected at the electrodes exceeds the number of photons detected by the photodetector.

Figure 26:
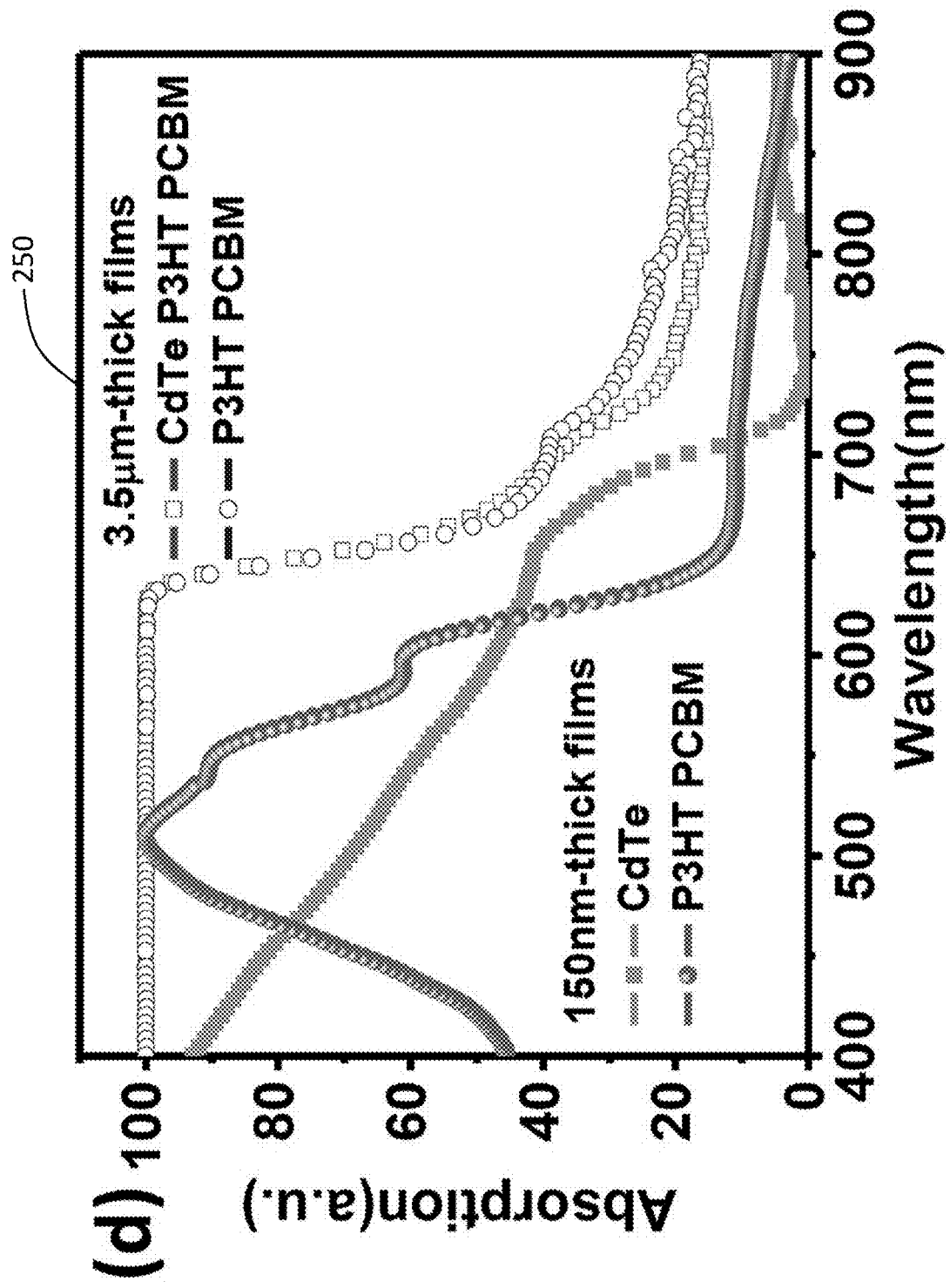
FIG. 26 shows exemplary absorption spectra of CdTe (150 nm), P3HT:PCBM (150 nm), CdTe:P3HT:PCBM (3.5 μm), and P3HT:PCBM (3.5 μm).

Referring to FIG. 26, a graph 250 shows the absorption spectra of 150 nm thick cadmium telluride, 150 nm thick P3HT:PCBM, and 3.5 µm thick P3HT:PCBM with or without cadmium telluride measured in a transmission mode. The absorption cutoff of the P3HT:PCBM film is about 630 nm. Light having a wavelength below 630 nm was completely (or almost completely) absorbed by the 3.5 µm thick film. There is still relatively weak light absorption in the wavelength range between 630 nm and 850 nm, which is either from tail-state absorption from P3HT:PCBM, or from cadmium telluride quantum dots, or due to light scattering. The absorption cutoff of cadmium telluride quantum dots is 720 nm, which agrees with its size of about 5 nm. The absorption spectrum of P3HT:PCBM:CdTe thick film is almost the same as that of P3HT:PCBM thick film, other than the small absorption shoulder caused by the cadmium telluride. The absorption spectra provide evidence that only red light can transmit through the whole active layer while shorter wavelength blue or green light is completely (or almost completely) absorbed.

Figure 27:
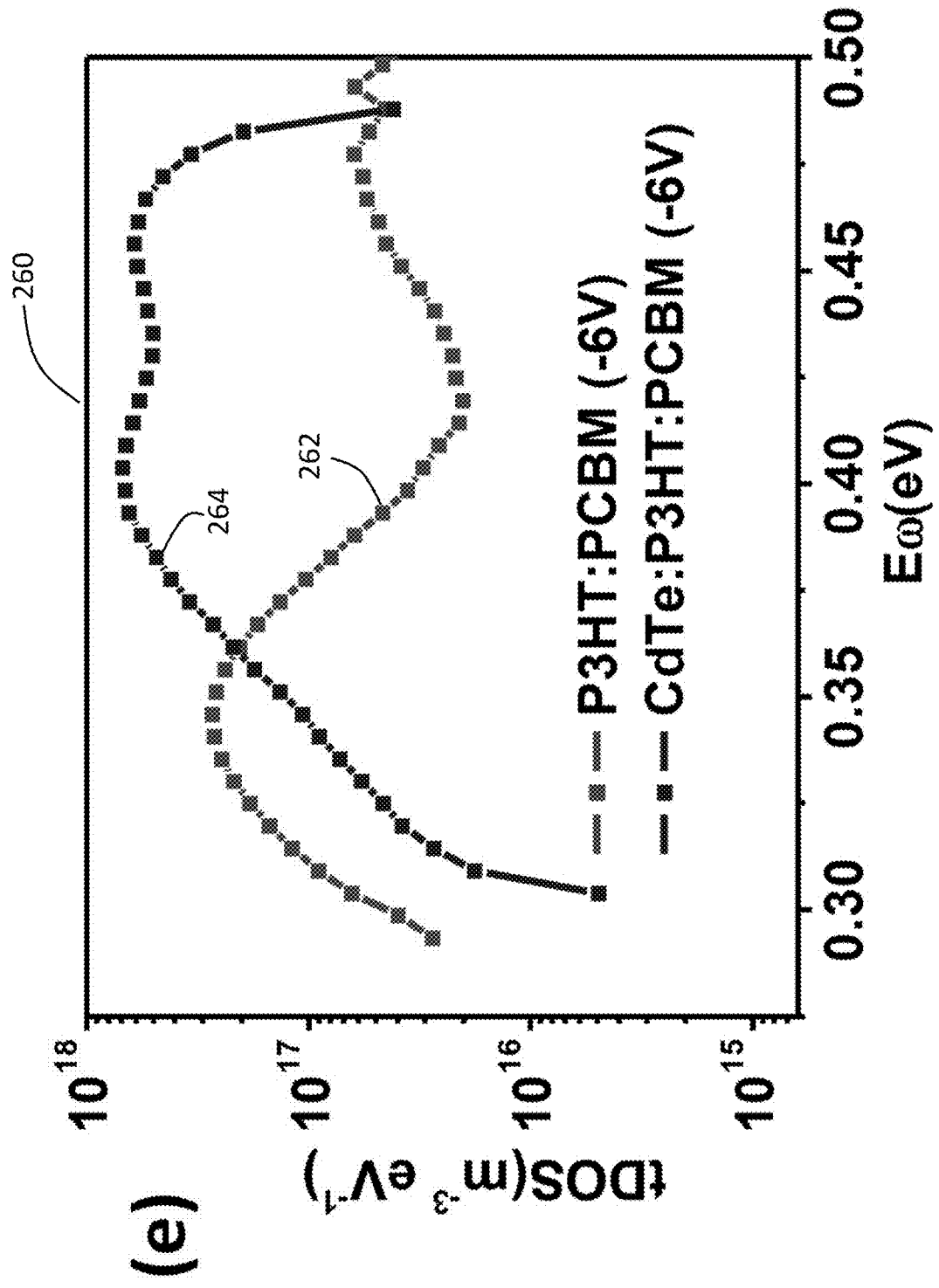
FIG. 27 is a graph showing the trap density of states curve versus demarcation energy curve.

In order to identify whether the charge traps were introduced into the photodetectors, the thermal admittance spectroscopy measurement of the photodetectors with and without cadmium telluride quantum dots were performed. Referring to FIG. 27, a graph 260 shows the distribution of the trap states presented by the calculated trap density of states versus demarcation energy. The graph 260 includes curves 262 and 264 representing the relationship between the calculated trap density of states versus demarcation energy for P3HT:PCBM and CdTe:P3HT:PCBM, respectively, when a −6V bias voltage is applied to the electrodes of the photodetectors. By comparing the two trap density curves 262 and 264 of the photodetectors without and with, respectively, cadmium telluride quantum dots, it is observed that a deeper charge trap band from 0.36 eV to 0.46 eV below band edge was introduced into the device having cadmium telluride quantum dots.

In some implementations, the cadmium telluride quantum dots and the nanocomposite solution for the active layer 222 can be prepared according to the following process. This is merely an example, other methods of producing nanoparticle quantum dots can also be used. In this example, a telluride precursor solution containing 0.1 g of telluride (0.78 m mol) was prepared by dissolving telluride powder in 1.8 mL tri-n-butylphosphine (TBP) and then diluted with 2 mL 1-Octadecene (ODE) in nitrogen atmosphere. A mixture of 0.1 g cadmium oxide (CdO) (0.78 mmol), 1.12 mL oleic acid (OA), and 6.4 mL 1-Octadecene was heated in a three-neck flask to 300° C. to obtain a clear solution. The mixture solution was then cooled to 280° C., and the tellurium precursor solution was quickly injected into it. The reaction mixture was cooled to 250° C. for the growth of the cadmium tellurium quantum dots. The synthesis was carried out under argon flow. A pyridine solution was added to the synthesized cadmium tellurium solution to precede ligand exchange, and the mixture solution was stirred for 24 hours. Hexanes was added to precipitate the nanocrystals, and the precipitate was isolated by centrifugation and dissolved into 1,2-dichlorobenzene (DCB) to make a 50 mg/mL solution. P3HT and PCBM were dissolved in DCB to make a 20 mg/ml polymer solution. The cadmium tellurium solution and the polymer solution were mixed at a volume ratio of 1:10. A solution of PVK: 20 wt % PMA in chlorobenzene/1,2-dichloroethane/acetonitrile (2:2:1 vol) was produced at a concentration of 4.0 mg/ml.

In some implementations, the photodetector can be fabricated using the following process. This is an example only, the photodetector can also be fabricated using other processes. The PVK solution was spin-cast onto the pre-cleaned indium tin oxide, then annealed at 110° C. on a hot plate for three minutes and spin-rinsed with acetonitrile. The as-prepared CdTe-polymer blends were dropped on the substrate, then solvent-annealed for 12 hours by placing the device in the solvent DCB vapor filled petri dish. The device was completed by evaporating 10 nm BCP and 100 nm aluminum as a cathode in sequence under vacuum ($1.5\times 10^{-6}$ Pa). The active device area was around $0.07$ cm$^2$.

Figure 28B:
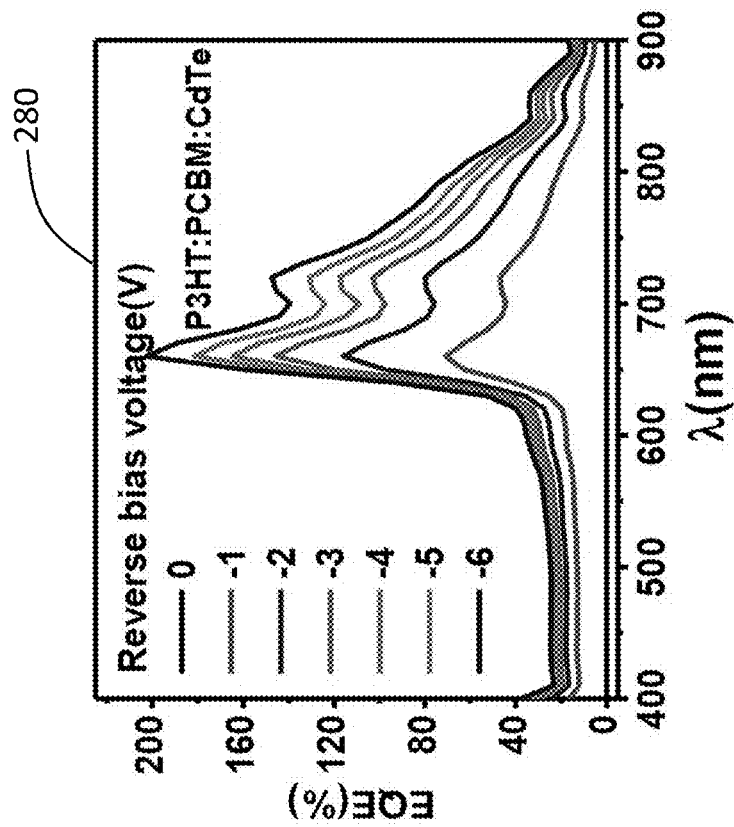
FIG. 28B is a graph showing external quantum efficiencies of exemplary photodetectors with cadmium telluride quantum dots under a reverse bias voltage from 0V to −6V with a voltage step of 1V.
Figure 28A:
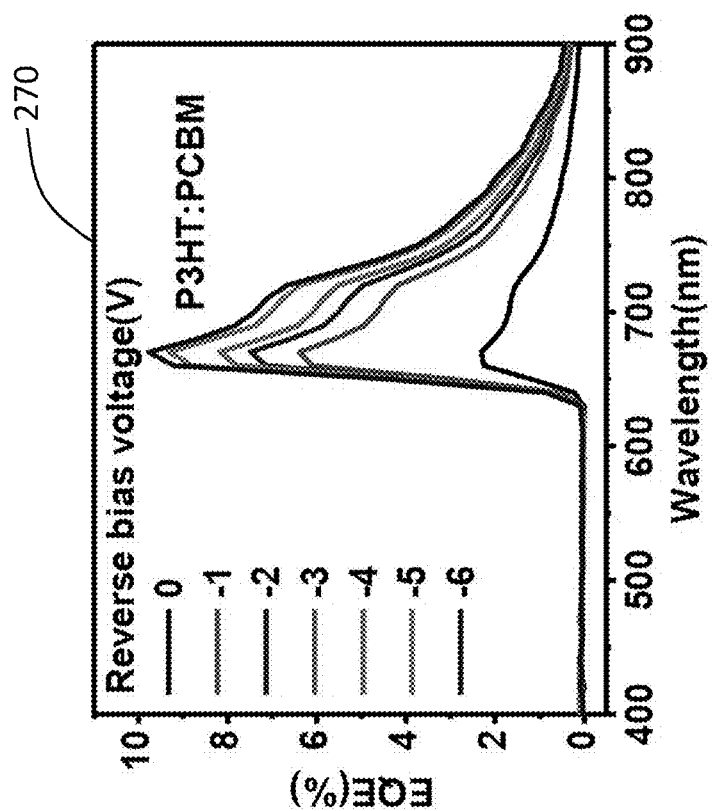
FIG. 28A is a graph showing external quantum efficiencies of an exemplary photodetector without cadmium telluride quantum dots under a reverse bias voltage from 0V to −6V with a voltage step of 1V.

The external quantum efficiency versus wavelength was measured at different reverse bias voltages to characterize the wavelength-dependent gain of the photodetectors, and the results are shown in FIGS. 28A and 28B. Referring to FIG. 28A, a graph 270 shows that devices without cadmium telluride quantum dots have higher external quantum efficiencies in a range between 650 nm and 800 nm, which agrees well with the calculated external quantum efficiency response wavelengths. For wavelengths from 400 nm to 650 nm, the external quantum efficiency is almost zero. At a reverse bias voltage of −6 V, the peak external quantum efficiency at 660 nm is about 10%, which is lower than the calculated results that assume all the charges generated within the charge drift length $L_d$ from the aluminum cathode can be completely collected. No gain appears in this photodetector and the corresponding responsivity of 0.053 A/W is small.

Referring to FIG. 28B, a graph 280 shows that the peak value of the external quantum efficiency of devices that have cadmium telluride quantum dots is dramatically increased by about 20 time to around 200% at the same reverse bias, compared to those shown in the graph 270 of FIG. 28A. The performance improvement is mainly caused by the trap enhanced secondary hole injection. The external quantum efficiency values for wavelengths below 630 nm show an enhancement compared to the device without cadmium telluride quantum dots. This may be because the cadmium telluride quantum dots cause the same order of absorption with the band-edge absorption of P3HT:PCBM.

Figures 29A, 29B:
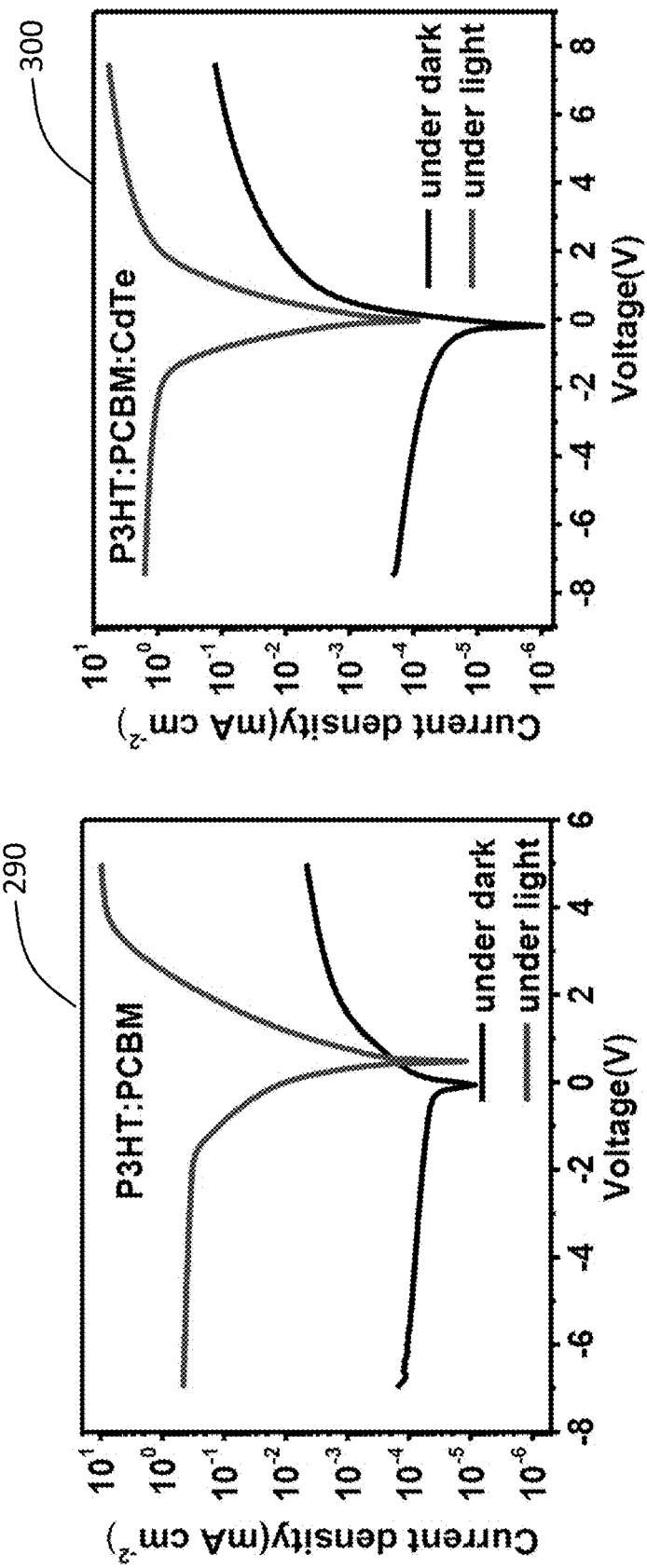
FIG. 29A is a graph showing photocurrent density at 100 mW cm$^{-2}$ and dark current density of exemplary photodetectors without cadmium telluride quantum dots.
FIG. 29B is a graph showing photocurrent density at 100 mW cm$^{-2}$ and dark current density of exemplary photodetectors having cadmium telluride quantum dots.

Referring to FIGS. 29A and 29B, graphs 290 and 300 show that both the P3HT:PCBM and P3HT:PCBM:CdTe devices have good rectifying characteristics and low dark currents (e.g., $10^{-7}$ A/cm$^2$) in the dark condition, indicating typical photodiode behaviors. When the P3HT:PCBM device was illuminated under a light intensity of 100 mW/cm$^2$ (AM 1.5), the rectification ratio was still in excess of 20 with a three-order increase of photocurrent under both reverse bias and forward bias conditions. In addition, there is a small photovoltage of 0.6 V, which indicates the P3HT:PCBM photodetector worked in photovoltaic mode under illumination. In contrast, for the P3HT:PCBM: CdTe QDs device, the rectification ratio decreased significantly to be less than 10 under illumination, and the photovoltage disappeared, which provided evidence that the working mechanism of the photodetector transformed from the photodiode to the photoconductor mode. As discussed above, this transition is due to the strong electron trapping of the cadmium telluride quantum dots, which led to strong band bending and formed an Ohmic contact around the cathode region.

Figures 30, 31:
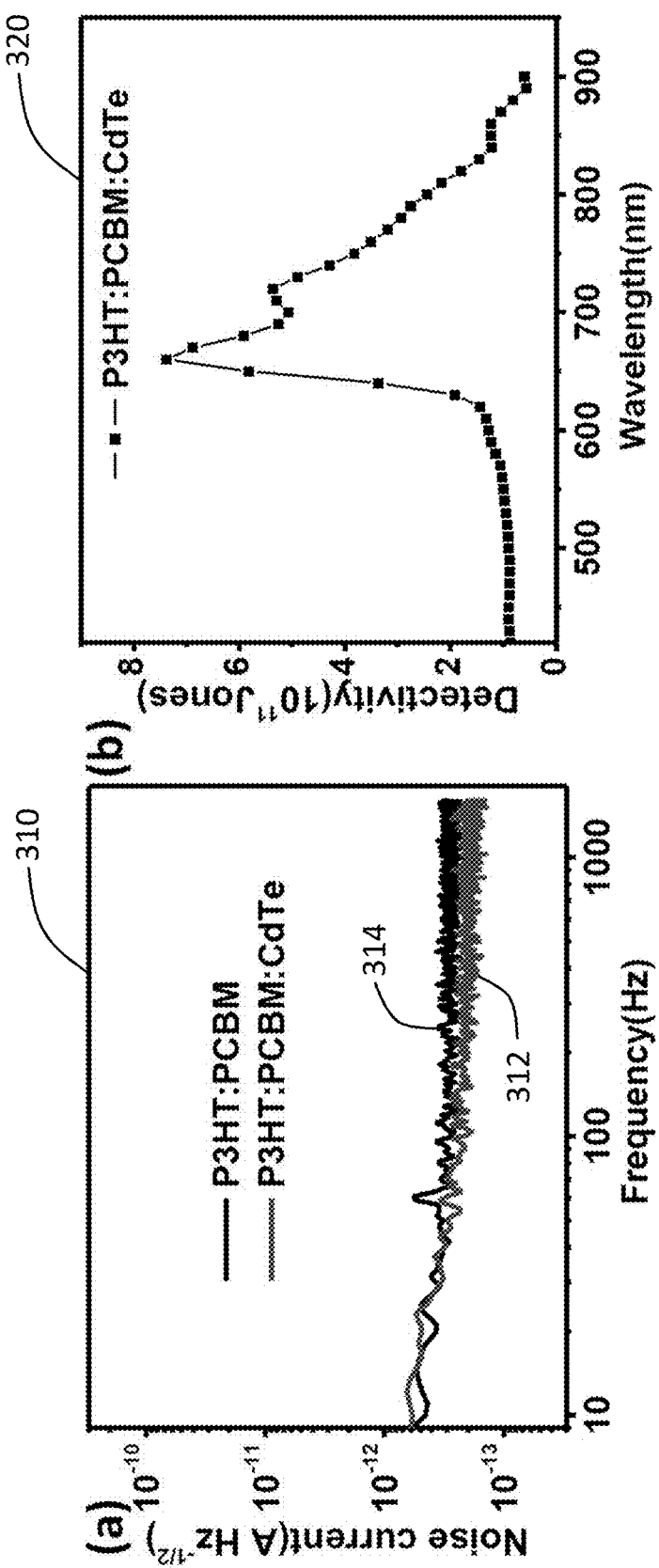
FIG. 30 is a graph that shows the noise current of exemplary photodetectors with or without cadmium telluride quantum dots under a −6V bias voltage.
FIG. 31 is a graph that shows the specific detectivity of an exemplary photodetector having cadmium telluride quantum dots under a −6V bias voltage.

To accurately obtain the noise current of the photodetectors with the lowest dark current, a fast Fourier transform (FFT) signal analyzer and a current pre-amplifier were used to record the noise current at different frequencies under −6 V bias. Referring to FIG. 30, a graph 310 shows the noise current of the photodetectors with or without cadmium telluride quantum dots, in which a −6V bias voltage is applied to the electrodes of the photodetectors. Curves 312 and 314 show that the noise currents of the photodetector with and without, respectively, the cadmium telluride quantum dots are $3.51\times 10^{-13}$ A Hz$^{-1/2}$ and $3.47\times 10^{-13}$ A Hz$^{-1/2}$, respectively, at 35 Hz, which are almost the same. The figure shows that the noise currents of the photodetectors is relatively less sensitive to the frequency. Based on the measured noise current and the external quantum efficiency, the specific detectivity (D*) can be calculated according to the following expressions:

$$D^* = \frac{\sqrt{AB}}{NEP} \qquad \text{Equ. 1}$$

$$NEP = \frac{i_n}{R} \qquad \text{Equ. 2}$$

$$R = \frac{EQE}{\frac{hc}{\lambda}} \qquad \text{Equ. 3}$$

where A is the active layer area, in is the measured noise current, R is the responsivity, h is the Planck constant, c is the light speed, and λ, is the light wavelength.

Referring to FIG. 31, a graph 320 shows that the specific detectivity D* of photodetectors having cadmium telluride quantum dots is $7.3\times 10^{11}$ cm Hz$^{1/2}$ W$^{-1}$ at 660 nm at 35 Hz, which is about 20 times higher than that of the photodetector without cadmium telluride ($3.7\times 10^{10}$ cm Hz$^{1/2}$ W$^{-1}$). In this example, a −6V bias voltage is applied to the electrodes of the photodetector. Based on the responsivity R and the measured noise current $i_n$ at 35 Hz, the noise equivalent power of the photodetector is calculated to be $3.3\times 10^{-13}$ W Hz$^{-1/2}$, which means the photodetector should be able to detect the red light intensity as low as 4.7 pW cm$^{-2}$, considering that the active layer area of the devices in this example is 7 mm$^2$.

Figures 32, 33:
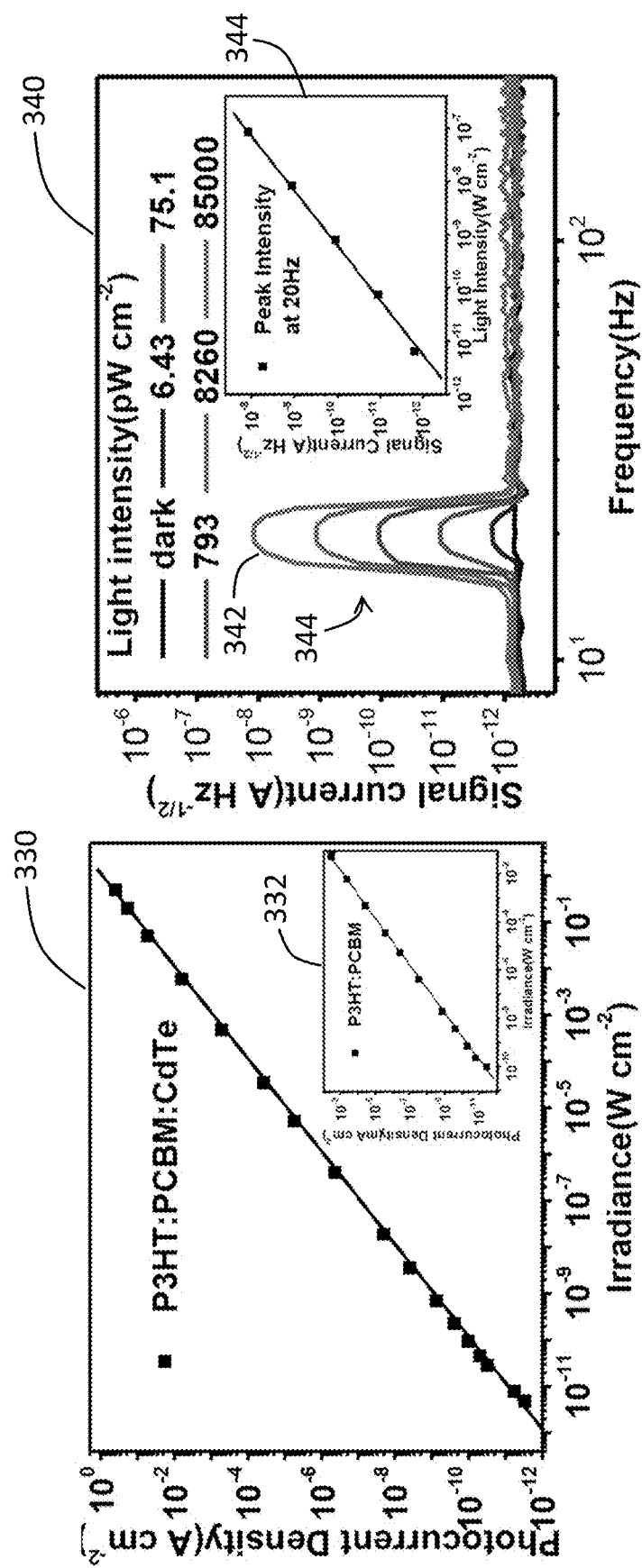
FIG. 32 is a graph that shows the dynamic response of exemplary photodetectors having cadmium telluride quantum dots under −6V bias under a LED illumination of various light intensities.
FIG. 33 is a graph showing the signal current spectra of photodetectors having cadmium telluride quantum dots illuminated by a 660 nm LED modulated at 20 Hz with various light intensities of direct noise equivalent power measurement. An inset shows the peak signal intensity at 20 Hz as a function of light intensities.

The liner dynamic range represents the light intensity range when the responsivity of the photodetectors keeps constant, which is an important parameter in photodetection application. The linear dynamic range was measured by recording the photocurrent change under various red light intensities with the modulation frequency of 35 Hz. FIG. 32 is a graph 330 that shows the dynamic response of exemplary photodetectors having cadmium telluride quantum dots under −6V bias using LED illumination of various light intensities. The solid line is linear fitting to the data. The graph 330 shows that the photocurrent increased linearly with increasing light intensity from about 5 pW cm$^{-2}$ (almost the same with the calculated noise equivalent power) to 0.5 W cm$^{-2}$, producing a large linear dynamic range of 110 dB. An inset 332 shows the dynamic response (linear dynamic range) of a photodetector without cadmium telluride quantum dots under −6V bias with a LED illumination of various light intensities. The solid line in the inset is linear fitting to the data. The inset 332 shows that the linear dynamic range is about 90 dB from 10$^{-10}$ W cm$^{-2}$ to 0.1 W cm$^{-2}$. The figure shows that the linear dynamic range was dramatically increased by two orders of magnitude by introducing the cadmium telluride quantum dots, which contributes to the introduced gain by reducing the noise equivalent power.

To further verify whether the photodetectors can detect light intensity as low as the noise equivalent power and the responsivity can keep constant in weak light intensity, we measured the signal current under various light intensities with the fast Fourier transform signal analyzer in the same way to measure the noise current, and the result is shown in FIG. 33. Referring to FIG. 33, a graph 340 shows curves 344 representing the signal current spectra of photodetectors having cadmium telluride quantum dots illuminated by a red light-emitting diode (LED, emission peak at 660 nm) that was modulated at 20 Hz by a function generator power source, and the light intensities were tuned by optical neutral density filters. A peak 342 appeared at the frequency of 20 Hz in the noise-signal spectra, and reduced along with decreasing irradiance. The signal submerged into the background noise current when the light intensity was reduced to 6.43 pW cm$^{-2}$. The noise equivalent power represents the lowest light intensity at which the signal of a photodetector can no longer be differentiated from noise. Thus, the noise equivalent power derived from the measurements is almost the same as the noise equivalent power calculated from the specific detectivity D*. An inset 344 in FIG. 33 shows the peak signal intensity at 20 Hz obtained from the curves 344 as a function of light intensities. The inset indicates that the signal peak intensities change substantially linearly with the irradiance.

Figure 34:
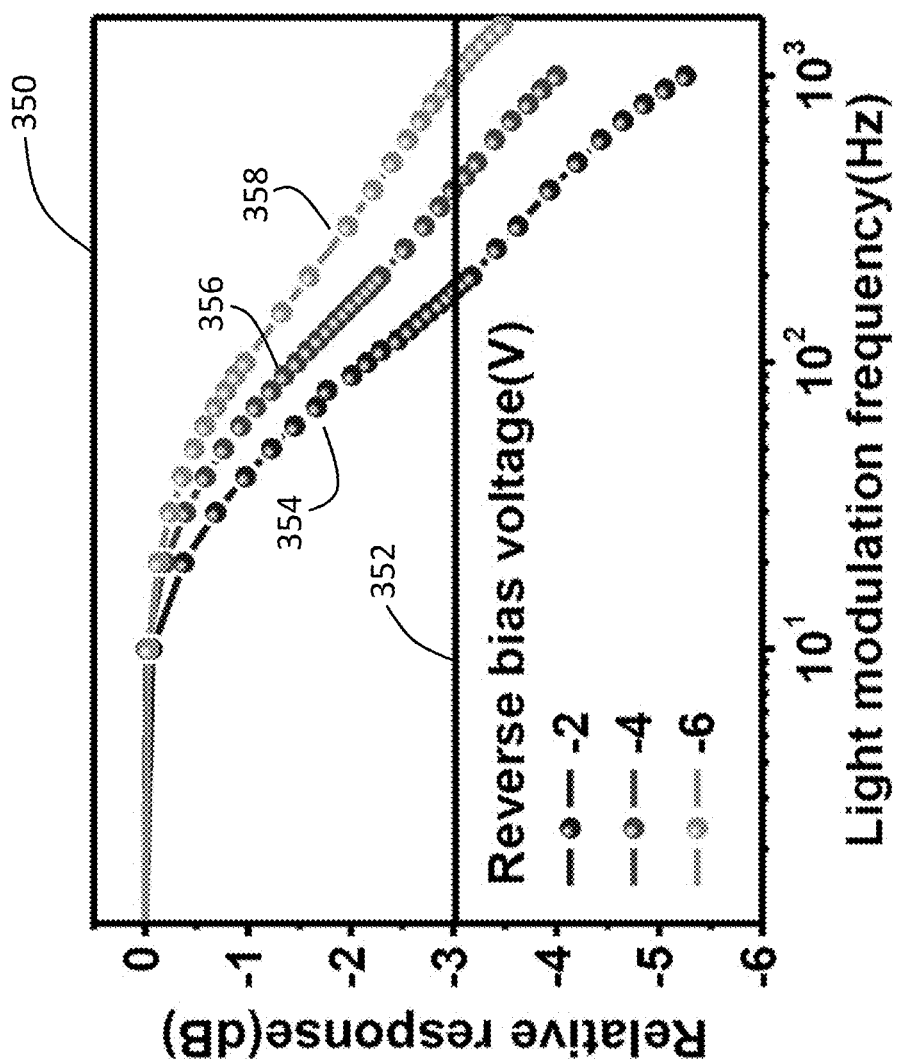
FIG. 34 is a graph that shows normalized response loss of photodetectors having cadmium telluride quantum dots versus light modulation frequency at a 660 nm LED under (−2, −4, −6V) bias.

Referring to FIG. 34, a graph 350 shows measurements of the response times of the photodetectors, which is directly related to the frequency responses of the photodetectors. The −3 dB point is indicated by a line 352. The response time was measured by the $f_{-3\ dB}$ method. The response speed determines the ability of a photodetector to follow a fast varying optical signal. The devices were illuminated by a red LED (emission peak at 660 nm) with various switching frequencies, and the photocurrents of the photodetectors were recorded by a lock-in amplifier. The device response speed is dependent on the bias voltage. Curves 354, 356, and 358 show that the −3 dB cut-off frequencies for three reverse bias voltages −2V, −4V, and −6V are 180 Hz, 400 Hz, and 900 Hz, respectively. The corresponding response times are 1.9 ms, 0.8 ms, and 0.39 ms, respectively, according to the equation $t=0.35/f_{-3\ dB}$.

As described above, by adding charge trapping nanoparticles to a photodetector having a thick active layer (e.g., an active layer having a thickness from about 3 µm to about 4 µm), a highly sensitive narrow band photodetector can be implemented. In some examples, for a narrow band red light photodetector that includes an active layer having P3HT:PCBM, adding cadmium telluride quantum dots to the active layer can introduce a photoconductive gain, increasing the sensitivity up to about 20 times, as compared to the photodetector without the cadmium telluride quantum dots. Compared to the narrow-band photodetector without gain, the device with a gain increased the specific detectivity to 7.3×10$^{11}$ cm Hz$^{1/2}$ W$^{-1}$ at 660 nm at 35 Hz, which resulted in an increased linear dynamic range to 110 dB, and improved the noise equivalent power to 5 pW cm$^{-2}$. This highly sensitive red light photodetector is useful in, e.g., applications in chemical and biological detection.

The following describes a process for calculating the incident-photon-to-converted electron (IPCE) parameter. The IPCE calculating process is based on its definition, which is the ratio between the number of collected carriers and the number of all the incident photons on the device active area at a given wavelength. According to the transferred matrix method (TMM), the total photo-generated carriers can be calculated and shown in Table 1 below under AM1.5G at 100 mW/cm$^2$ illumination. FIG. 35A is a graph 360 that shows the generation rate of the photo-generated carriers versus the position in the active layers (3 µm film thickness) with the incident light wavelength of 400, 450, 500, 550, 600, 610, 620, and 630 nm. For example, curves 362, 364, and 366 show the generation rate of the photo-generated carriers versus the position in the active layers for light wavelengths of 630, 620, and 610 nm, respectively. The figure shows that for wavelengths 400 nm to 630 nm, the cut-off of penetration lengths are about 1 µm near the anodes, which is shorter than the film thickness of 3 µm.

TABLE 1

| Wavelength (nm) | Incident photons (s$^{-1}$m$^{-2}$) | Collected | IPCE |
|---|---|---|---|
| 400 | 2.24E18 | 5.36E16 | 2.39 |
| 450 | 3.53E18 | 8.03E16 | 2.38 |
| 500 | 3.88E18 | 7.91E16 | 2.04 |
| 550 | 4.26E18 | 8.92E16 | 2.10 |
| 600 | 4.45E18 | 9.92E16 | 2.23 |
| 610 | 4.50E18 | 1.02E17 | 2.26 |
| 620 | 4.59E18 | 1.09E17 | 2.37 |
| 630 | 4.41E18 | 1.26E17 | 2.86 |
| 640 | 4.61E18 | 2.60E17 | 5.63 |
| 650 | 4.44E18 | 5.25E17 | 11.8 |
| 660 | 4.64E18 | 7.53E17 | 16.2 |
| 670 | 4.78E18 | 7.04E17 | 14.7 |
| 680 | 4.78E18 | 7.91E17 | 16.6 |
| 690 | 4.10E18 | 5.55E17 | 13.5 |
| 700 | 4.51E18 | 6.41E17 | 14.2 |
| 750 | 4.65E18 | 2.94E17 | 6.32 |
| 800 | 4.31E18 | 1.35E16 | 3.14 |

FIG. 35B is a graph 370 that shows the generation rate of the photo-generated carriers versus the position in the active layers (3 µm thickness) with the incident light wavelength of 640, 650, 660, 670, 680, 690, 700, 750, and 800 nm. Curves 372, 374, 376, 378, 380, 382, 384, 386, and 388 show the generation rate of the photo-generated carriers versus the position in the active layers for light wavelengths of 640, 650, 660, 670, 680, 690, 700, 750, and 800 nm, respectively. The figure shows that the penetration depths of red light is longer than the film thickness, which is demonstrated by the interference effects shown in the figure. The photo-generated carriers decline one order of magnitude when red light transmits from the anode to the cathode. The photo-generated electrons and holes are recombined due to the limited lifetime (about 3 to 5 µs) and relatively low carriers mobility (about 10$^{-3}$ to 10$^{-4}$ cm$^2$/Vs) in the polymer:PCBM blend system. For example, when a −6 V reverse bias voltage is applied to the electrodes, the biggest carrier drift length is about 1 µm. The sum of the penetration lengths and the drift lengths is about 2 µm, which is smaller than the film thickness. This suggests that all the carriers except those generated by red light cannot be collected by the cathode, so the photodetector is only sensitive to the narrow band red light.

The charge collection efficiency η can be determined using the Hecht equation expressed by:

$$\eta = q/q_0 = (\mu\tau V/d^2)[1-e^{-d^2/\mu\tau V}]/(1+ds/V\mu) \qquad \text{Equ. 4}$$

where $q_0$ is the generated charge, q is the collected charge, μ is the carrier mobility, τ is the lifetime of carrier, V is the applied voltage, s is surface recombination rate, and d is the film thickness. The charge collection efficiency η represents a probability that the generated carriers can be collected. Assuming the internal quantum efficiency (IQE) is 100%, the number of collected carriers can be expressed as:

$$N_{collect} = N_{generate} \times P_{Hecht}. \qquad \text{Equ. 5}$$

Here, μ is about $10^{-3}$ cm$^2$/Vs, which is measured by the space charge limited current (SCLC) method; τ is 5 μs and V is −6 V applied in the experiment. The calculated results are shown in FIGS. 36A and 36B.

Figure 36A:
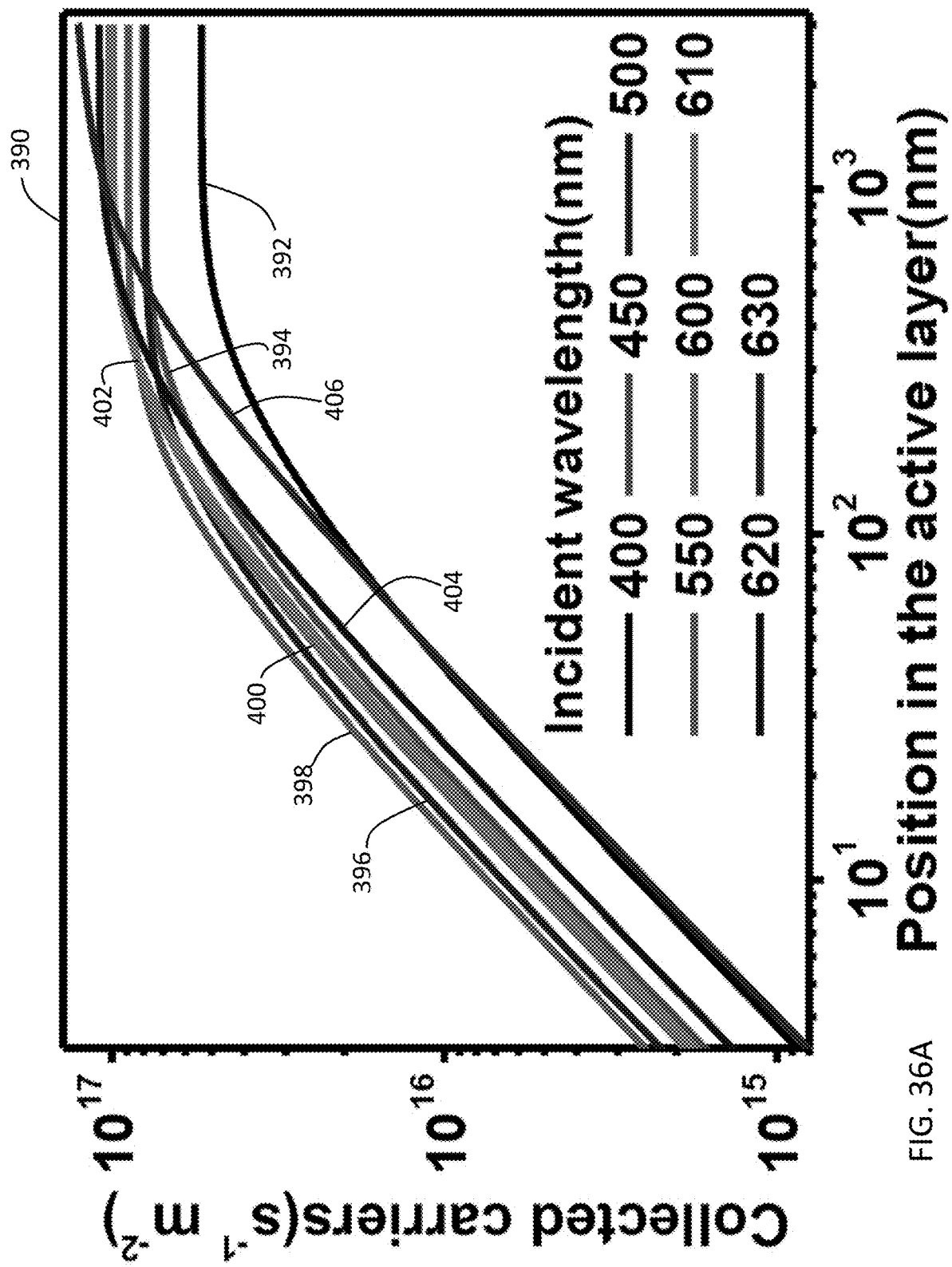
FIGS. 36A and 36B are graphs showing exemplary integrated collected photons versus position in the active layers for various incident light wavelengths.

Referring to FIG. 36A, a graph 390 shows the integrated collected photons versus position in the active layers (3 μm thickness) with the incident light wavelengths of 400, 450, 500, 550, 600, 610, 620, and 630 nm. Curves 392, 394, 396, 398, 400, 402, 404, and 406 represent the integrated collected photons versus position in the active layers for incident light wavelengths of 400, 450, 500, 550, 600, 610, 620, and 630 nm, respectively.

Figure 36B:
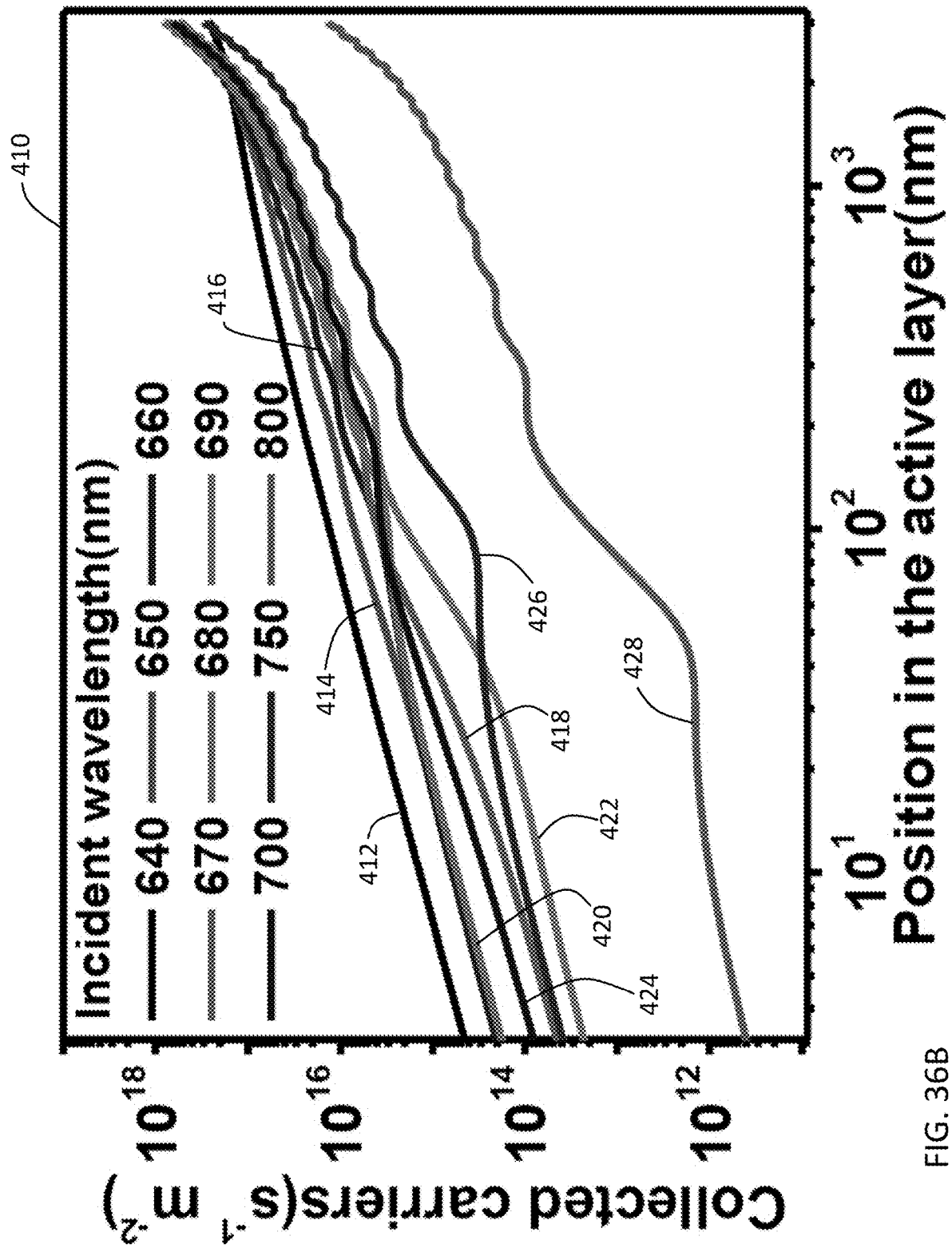

Referring to FIG. 36B, a graph 410 shows the integrated collected photons versus position in the active layers (3 μm thickness) with the incident light wavelengths of 640, 650, 660, 670, 680, 690, 700, 750, and 800 nm. Curves 412, 414, 416, 418, 420, 422, 424, 426, and 428 represent the integrated collected photons versus position in the active layers for incident light wavelengths of 640, 650, 660, 670, 680, 690, 700, 750, and 800 nm, respectively. FIGS. 36A and 36B show that the number of carriers collected by the cathode for wavelengths below 630 nm is at least one order of magnitude lower than the number of carriers collected by the cathode for wavelengths above 630 nm. The wavelength dependent IPCE value can be calculated as shown in Table 1 above.

Figures 37, 38A:
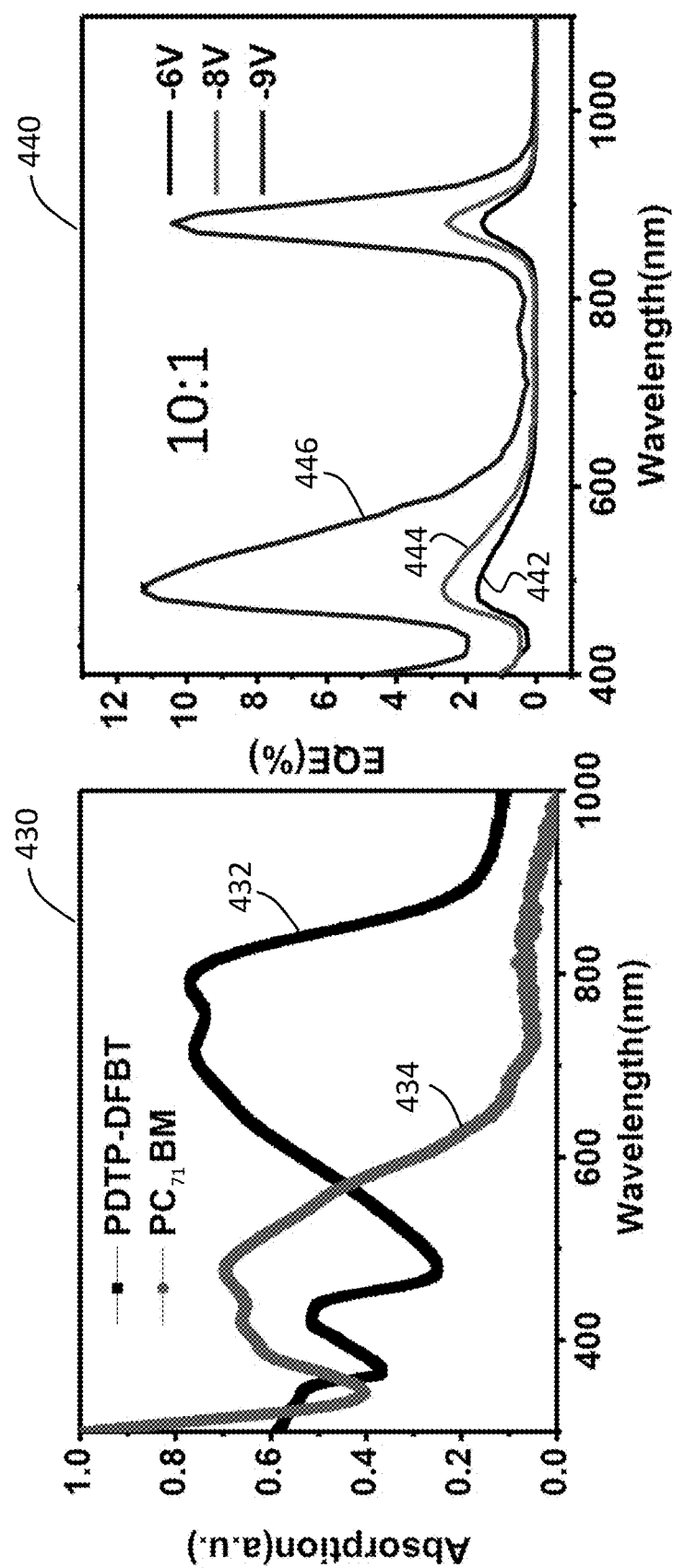
FIG. 37 is a graph showing the absorption spectra of PDTP-DFBT and PC$_{71}$BM.
FIGS. 38A to 38D are graphs showing the relationships between EQE and wavelength for various bias voltages for photodetectors with various ratios of PDTP-DFBT to PC$_{71}$BM.

The following describes an example of a narrowband photodetector that can detect light in the infrared wavelength range. In some implementations, Poly[2,7-(5,5-bis-(3,7-dimethyloctyl)-5H-dithieno[3,2-b:2',3'-d]pyran)-alt-4,7-(5,6-difluoro-2,1,3-benzothia diazole)] (PDTP-DFBT), which has a broad absorption from 400 nm to 900 nm, is used as electron donor combined with Phenyl-C71-Butyric-Acid-Methyl Ester (PC$_{71}$BM) as electron acceptor. FIG. 37 is a graph 430 that includes curves 432 and 434 that represent the absorption spectra of PDTP-DFBT and PC$_{71}$BM, respectively. The figure shows that there are two tail-state absorption in PDTP-DFBT around 500 nm and 900 nm respectively, which suggests that a potential narrowband detection will exist in corresponding visible and infrared wavelength ranges. To determine the response range, photodetectors having active layers with different mass ratios of PDTP-DFBT to PC$_{71}$BM were investigated and the measurements are shown in FIGS. 38A to 38D. In these examples, the thickness of the active layers were about 2.8 μm.

Referring to FIG. 38A, a graph 440 shows that there are two comparable response peaks about 10% EQE appearing at around 500 nm and 900 nm when the ratio of PDTP-DFBT to PC$_{71}$BM is 10:1, which is in accordance with the absorption of PDTP-DFBT. Curves 442, 444, and 446 represent the relationships between EQE and wavelength when bias voltages of −6V, −8V, and −9V, respectively, are applied to the electrodes of the photodetector.

Figure 38C:
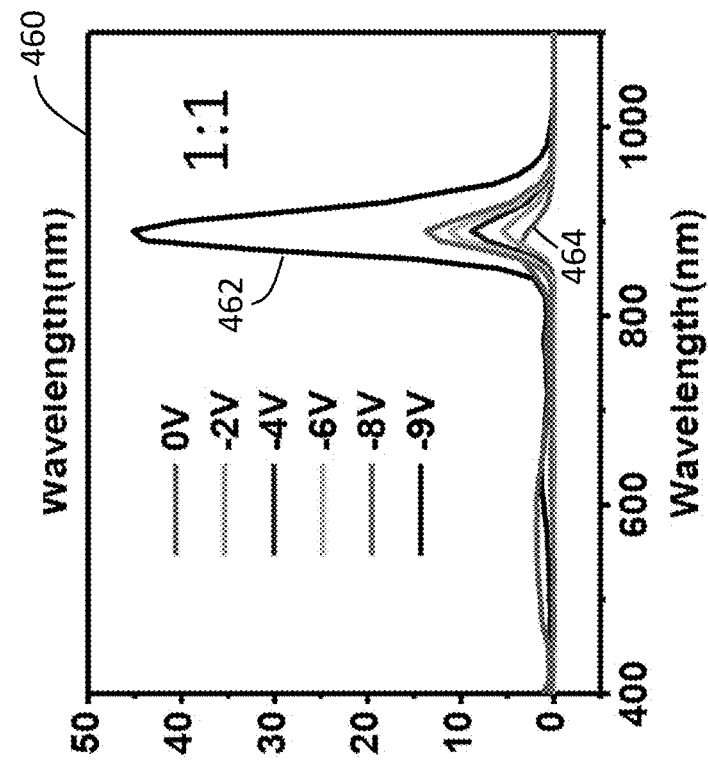
Figure 38B:
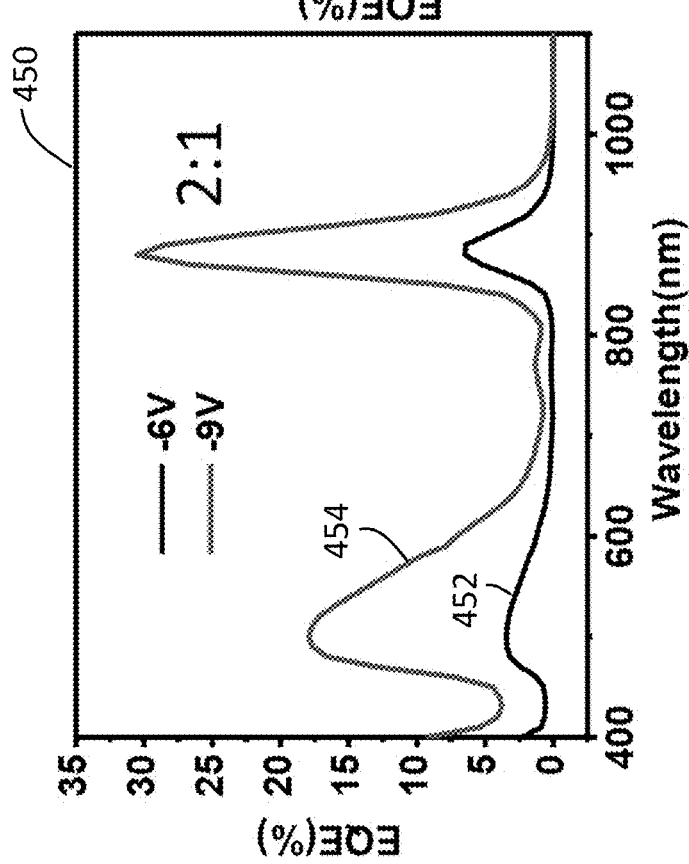

Referring to FIG. 38B, a graph 450 shows that when the ratio of PDTP-DFBT to PC$_{71}$BM is changed to 2:1, the photodetector response to visible light becomes weaker but the response to infrared light grows stronger. Curves 452 and 454 represent the relationships between EQE and wavelength when bias voltages of −6V and −9V, respectively, are applied to the electrodes of the photodetector.

Figure 38D:
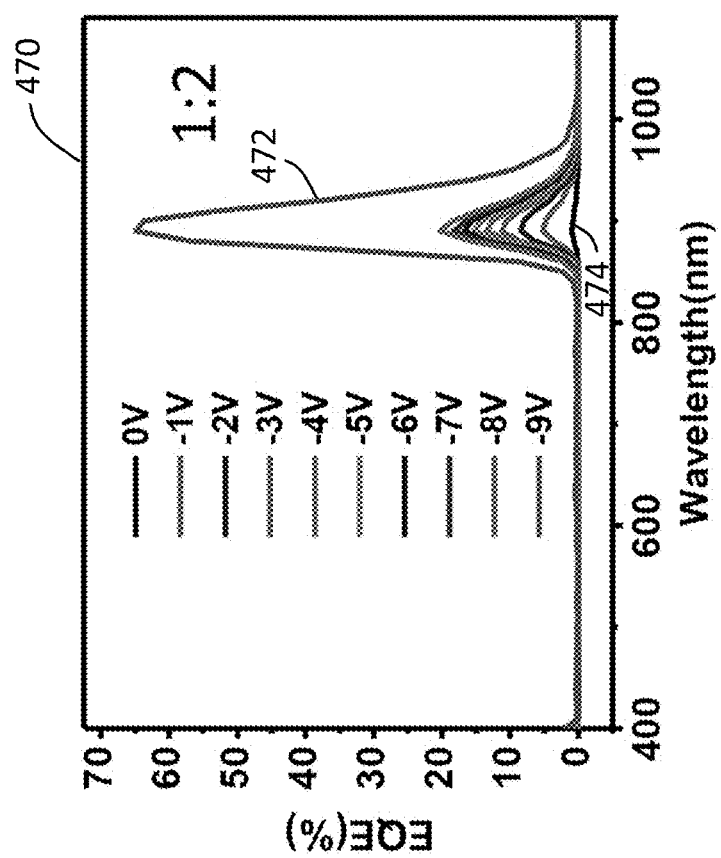

Referring to FIGS. 38C and 38D, graphs 450 and 460 show that the photodetector response to visible light decreases while the response to infrared light increases when the ratio of PDTP-DFBT to PC$_{71}$BM is 1:1 or 1:2. In FIG. 38C, curves 462 and 464 represent the relationships between EQE and wavelength when bias voltages of −9V and 0V, respectively, are applied to the electrodes of the photodetector, in which the ratio of PDTP-DFBT to PC$_{71}$BM is 1:1. The figure shows that EQE increases when the absolute value of the reverse bias voltage is increased. In FIG. 38D, curves 472 and 474 represent the relationships between EQE and wavelength when bias voltages of −9V and 0V, respectively, are applied to the electrodes of the photodetector, in which the ratio of PDTP-DFBT to PC$_{71}$BM is 1:2. The figure shows that EQE increases when the absolute value of the reverse bias voltage is increased.

Both PDTP-DFBT and PC$_{71}$BM can detect visible light, so the mixture of PDTP-DFBT and PC$_{71}$BM has a response in the visible wavelengths when the PDTP-DFBT is excessive. When the mass of PC$_{71}$BM is equal or excessive to PDTP-DFBT, the strong absorption of PC$_{71}$BM suppresses the tail-state absorption of PDTP-DFBT around 500 nm, which causes the photodetector to have a low sensitivity to visible light, while having a high sensitivity to light having a wavelength in a range from about 850 nm to 950 nm. The narrow band infrared detection is strongly dependent on the ratio of PDTP-DFBT and PC$_{71}$BM, and the response to visible light can be reduced or eliminated by increasing PC$_{71}$BM to enhance the absorption of visible light.

Referring to FIG. 39A, a graph 480 shows the current density versus voltage characteristic curves under dark condition (curve 482) and under a light intensity of 100 mW/cm$^2$ (AM1.5) (curve 484) for the photodetector in which the ratio of PDTP-DFBT to PC$_{71}$BM is 1:1. Referring to FIG. 39B, a graph 490 shows the current density versus voltage characteristic curves under dark condition (curve 486) and under a light intensity of 100 mW/cm$^2$ (AM1.5) (curve 488) for the photodetector in which the ratio of PDTP-DFBT to PC$_{71}$BM is 1:2.

FIGS. 39A and 39B show that the device works in photodiode mode under the dark condition due to the rectification ratio exceeding 100 at ±10V. The curves 482 and 486 show that the lowest point is not at 0V but at about −2V, suggesting there are some trap levels in the blend films. However, curves 484 and 488 show that the rectification ratio is almost equal to 1 at ±10V when the photodetector is illuminated by light, indicating the working mechanism of the device transformed from photodiode to photoconductor caused by the trap levels.

The narrowband photodetector described above is improved by adding charge trapping nanoparticles into the active layer. For example, the nanoparticles can be quantum dots, such as lead sulfide (PbS) quantum dots. Referring to FIG. 40, in some implementations, a sensitive narrowband photodetector 500 that can detect light in the near infrared wavelength range can be fabricated with an active layer 502 that includes PDTP-DFBT (used as electron donor) and PC$_{71}$BM (used as electron acceptor), accompanied by quantum dots, such as lead sulfide quantum dots, that function as charge trap centers. The photodetector 500 is insensitive to visible light without the need to use an optical filter. The active layer 502 is placed between a silver electrode 504 and an indium tin oxide electrode 506. A first buffer layer 508 made of molybdenum trioxide (MoO$_3$) is disposed between the active layer 502 and the silver electrode 504. A second buffer layer 510 that includes stannic oxide (SnO$_2$) and polyethylenimine, 80% ethoxylated (PEIE) polymer is disposed between the active layer 502 and the indium tin oxide electrode 506. The SnO$_2$ and PEIE act as an electron transporting (hole blocking) layer, and the MoO$_3$ works as a hole transporting (electron blocking) layer to reduce dark current under reverse bias voltage.

Referring to FIG. 41, a graph 520 includes curves 522, 524, 526, and 528 representing the absorption spectra of PbS, PDTP-DFBT, a 4 µm film of PDTP-DFBT:PC$_{71}$BM without lead sulfide quantum dots, and a 4 µm film of PDTP-DFBT:PC$_{71}$BM with lead sulfide quantum dots, respectively. The difference between the photodetector 500 of FIG. 40 and the red light narrow band photodetector 220 of FIG. 23 is that lead sulfide quantum dots in the photodetector 500 work as hole traps rather than electron traps, which is the function performed by the cadmium telluride quantum dots of the photodetector 220. This is verified by single-carrier device with space charge limited current (SCLC) method.

Referring to FIG. 42, a graph 530 shows that the current density in an electron-only device of PbS:PDTP-DFBT nanocomposite is at least 3 orders of magnitude higher than that of a hole-only device. The electron mobility is 6.1×10$^{-2}$ cm$^2$ V$^{-1}$ s$^{-1}$ and the hole mobility is 6.8×10$^{-5}$ cm$^2$ V$^{-1}$ s$^{-1}$. This means that electrons can move freely with a higher mobility PbS network and thus enables a photoconductive gain in the photodetector 500, which takes advantage of the electron traps in the active layer 502.

Figure 43:
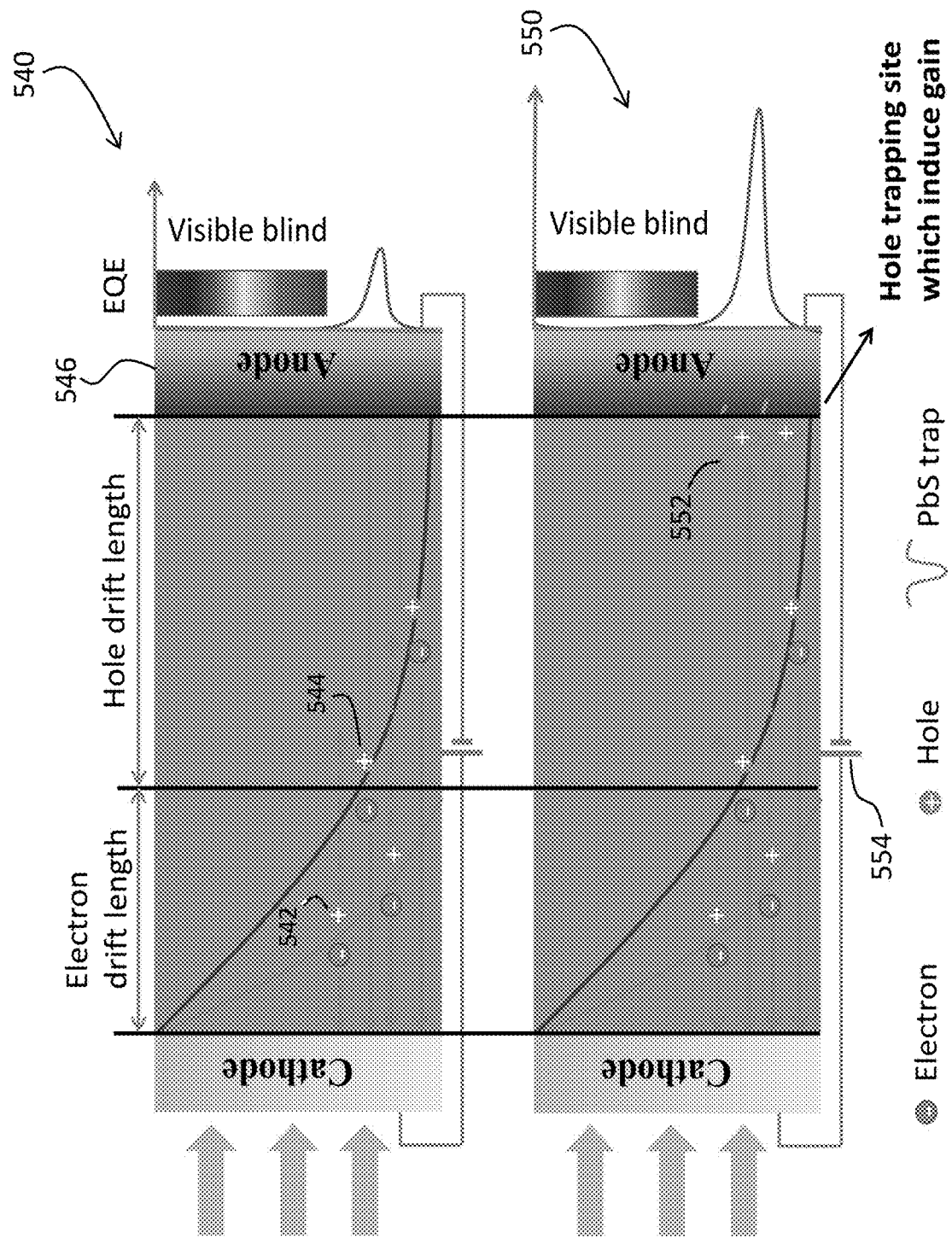
FIG. 43 is a diagram that illustrates the narrow band infrared photodetector operation mechanism and gain mechanism.

Referring to FIG. 43, diagrams 540 and 550 illustrate the device operation mechanisms for narrow band photo-response and photoconductive gain. When the photodetector is illuminated by light, the holes 542 generated by visible light cannot be collected by the anode 546 due to the short hole drift length compared with the film thickness. However, the holes 544 generated by near infrared (NIR) light can arrive at the anode 546 due to the longer penetration depths of light having near infrared wavelength. The lead sulfide quantum dots are enriched near the anode 546, in which the quantum dots function as charge traps 552 that can trap the photo-generated holes and lead to upward band bending at the Schottky barrier interface between the electrode and the polymer. Electrons can be directly injected into the device due to the interface transition from Schottky barrier to Ohmic contact. This results in photoconductive gain when an appropriate bias voltage 554 is applied to the electrodes.

Figure 45:
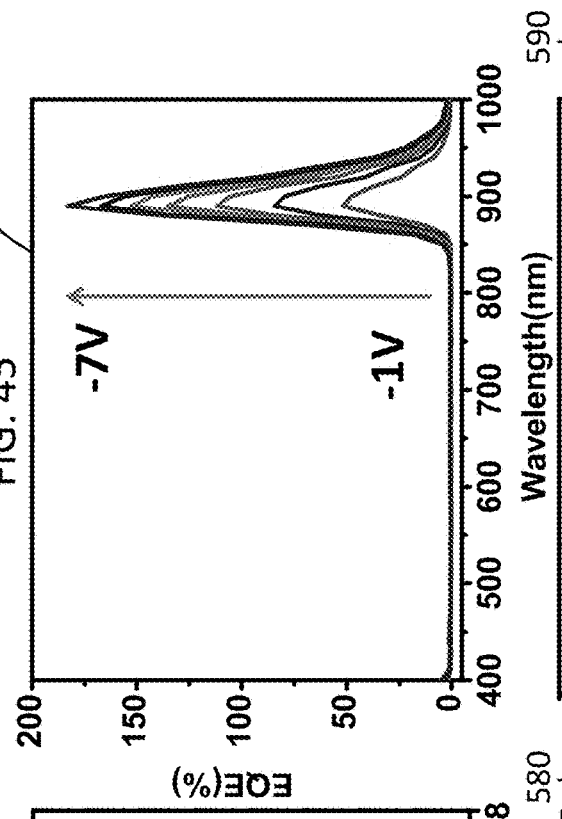
FIG. 45 is a graph showing the EQE of the photodetector under various bias voltages from −1 V to −7 V.
Figure 44:
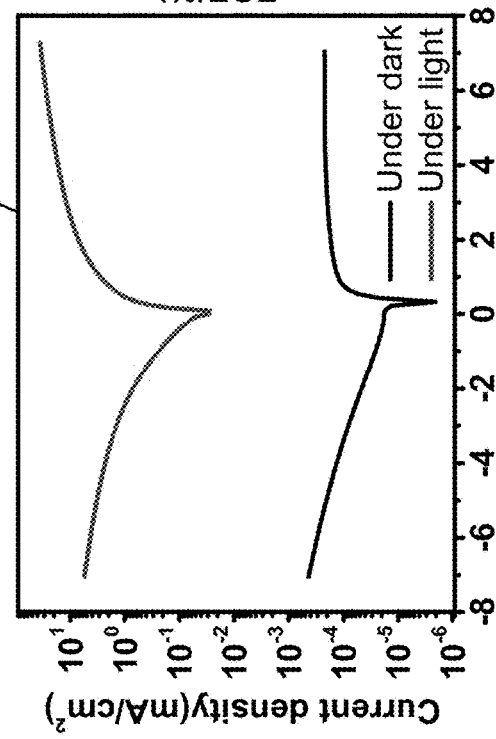
FIG. 44 is a graph showing the photo current and the dark current of an exemplary photodetector.

Referring to FIG. 44, a graph 560 shows the J-V curves under dark and light conditions (light intensity of 100 mW/cm$^2$ (AM 1.5G)). Referring to FIG. 45, a graph 570 shows the wavelength dependent gain at various reverse bias voltages. The graph 570 shows that the photodetector response is insensitive to visible light (e.g., having wavelength in a range from 400 nm to 700 nm). The EQE peaks around 890 nm and exceeds 100% at −3 V with a full-width at half-maxima of less than 50 nm. The photodetector has a maximum responsivity of 1.3 A/W at −7 V.

Figure 47:
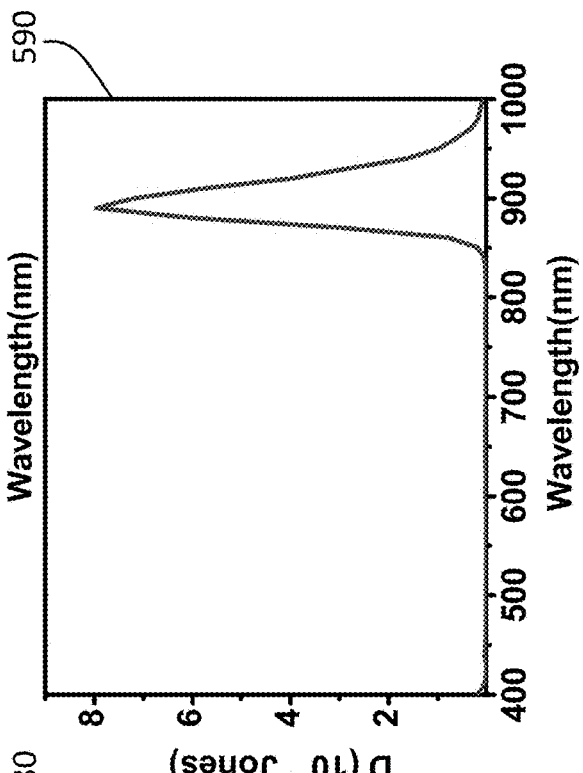
FIG. 47 is a graph showing the photodetector's specific detectivity at −7 V bias voltage.
Figure 46:
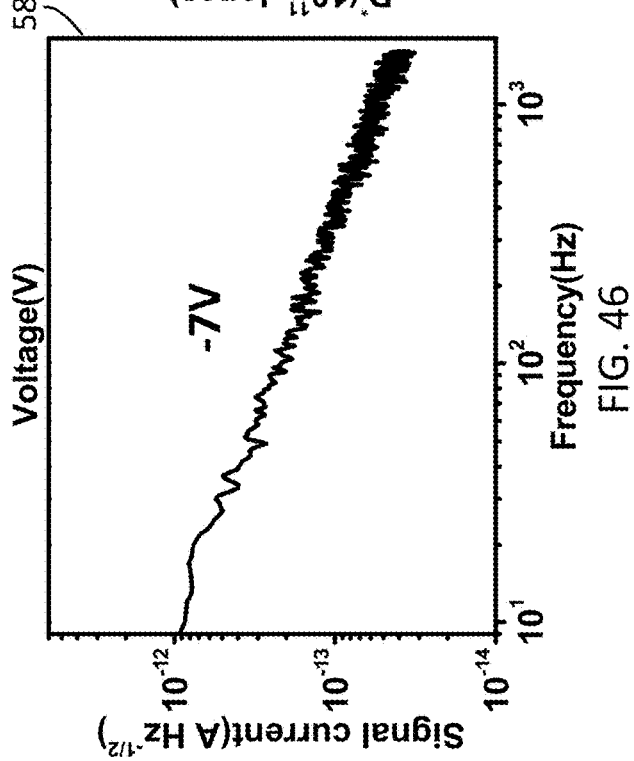
FIG. 46 is a graph showing the photodetector noise at −7 V bias voltage.

Referring to FIG. 46, a graph 580 shows the noise current measured at −7V bias voltage. The graph 580 shows that the noise likely belongs to frequency-dependent flicker noise rather than shot noise due to the charge process of charge trapping and de-trapping. The noise equivalent power (NEP) at 35 Hz is 3.35×10$^{-13}$ W Hz$^{-1/2}$, which suggests that the lowest detectable light intensity is 4.79 pW/cm$^2$ for a device area of 7 mm$^2$. Referring to FIG. 47, a graph 590 shows the specific detectivity D* that is calculated based on the noise current shown in graph 580 of FIG. 46.

Figure 48:
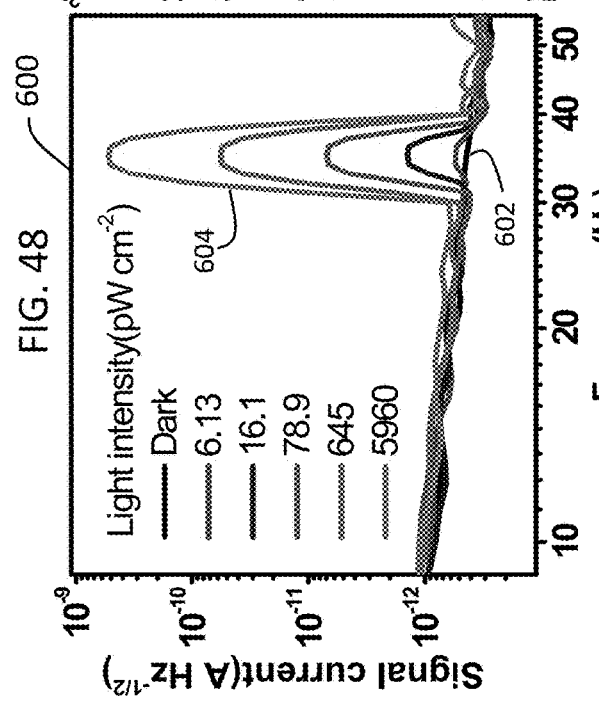
FIG. 48 is a graph showing the photodetector response to chopped light with intensity from 6000 to 6 pW/cm$^2$.

Referring to FIG. 48, a graph 600 shows measurement values of the noise signal current under various light intensities. Curve 602 represents the relationship between the noise signal current and frequency under a dark condition. Curve 604 represents the relationship between the noise signal current and frequency when the light intensity is 5960 pW cm$^{-2}$. The noise signal current can be used to determine the noise equivalent power. The figure shows that the noise equivalent power is 6.13 pW/cm$^2$, which is close to theoretical calculated value.

Figure 49:
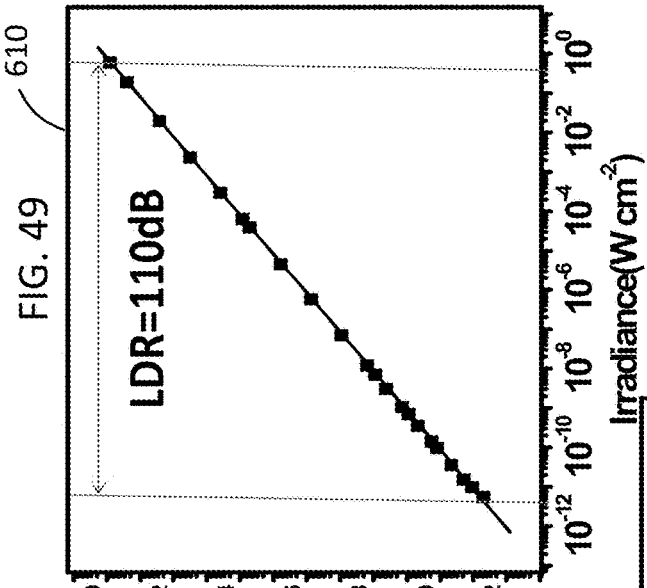
FIG. 49 is a graph showing photocurrent output versus the light intensity.

The linear dynamic range is determined by measuring the photocurrent density under various irradiance conditions by illuminating the photodetector using a light emitting diode (LED) having a central wavelength equal to 890 nm and modulated at 35 Hz using a lock-in amplifier. Referring to FIG. 49, a graph 610 shows that the photocurrent increases linearly from 5.5 pW/cm$^2$ to 0.6 W/cm$^2$, resulting in a large linear dynamic range of 110 dB.

Figure 50:
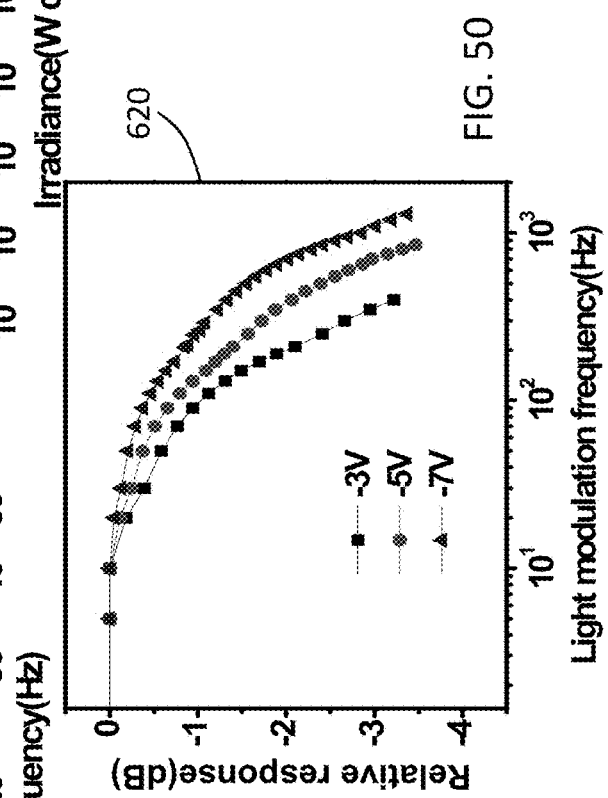
FIG. 50 is a graph showing the photo response at various light modulation frequencies for various bias voltages.

Referring to FIG. 50, a graph 620 shows the relationship between relative response and light modulation frequency. The response speed was measured using the 3-dB cut-off frequency method. The graph 620 indicates that the 3-dB cut-off frequency values are 350 Hz, 650 Hz, and 1050 Hz for bias voltages of −3V, −5V, and −7V, respectively.

Although some examples have been discussed above, other implementations and applications are also within the scope of the following claims. As discussed above, the photodetector includes a transparent electrode, an active layer composed of nanoparticles blended with a semiconducting polymer, buffer layers, and a contact cathode. These components can be made from various materials described below. For example, although the photodetectors 220 and 500 in FIGS. 23 and 40 use cadmium telluride quantum dots and lead sulfide quantum dots, respectively, other materials that can trap charges can also be used. In some examples, electron trapping quantum dots or nanoparticles may be used, while in other examples, hole trapping quantum dots or nanoparticles may be used. An electron trap has a trap depth larger than the thermal activation energy of electrons, which is about 26 meV at room temperature. Thus, if particles have charge traps in which the trap depths are larger than 26 meV, the particles can be used to increase the gain of the photodetector 220 or 500.

For example, the nanoparticles may be selected from, but not limited to, zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2); cadmium selenide (CdSe), lead selenide (PbSe), cadmium telluride (CdTe), lead telluride (PbTe), Si, Ge, InAs, InSb, Pb$_{1-x}$Sn$_x$Te, Hg$_{1-x}$Cd$_x$Te, InAsSb, InNSb, InBiTe, InTlSb; or super lattices including: InAs/GaInSb, HgTe/CdTe, carbon nanomaterials (graphene quantum dots, carbon nanotube, fullerene). The nanoparticles can be solution or vacuum deposited particles.

Instead of using nanoparticles, organic electron trapping material (or organic electron acceptor material) may also be used. For example, the electron acceptor material may be selected from, but not limited to, a fullerene and derivatives thereof, a perylene derivative, a 2,7-dicyclohexyl benzo, phenanthroline derivative, a 1,4-diketo-3,6-dithienylpyrrolo

[3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, and combinations thereof, [6,6]-phenyl C61-butyric acid methyl ester (PCBM), [6,6]-phenyl C61-butyric acid methyl ester (PC70BM), [6,6]-(4-fluoro-phenyl)-C61-butyric acid methyl ester (FPCBM), carbon 60 (C60), carbon 70 (C70), carbon nanotube (CNT), a carbon onion, and combinations thereof.

What is claimed is:

1. A method of operating a photodetector, the method comprising:
providing a bias voltage from a power supply, and applying the bias voltage across a cathode and an anode of a photodetector, the photodetector having an active layer disposed between the cathode and the anode, the active layer comprising an electron donor material, a first electron acceptor material, and a second material that includes organic electron trapping particles; and
detecting light by transmitting the light through the anode to the active layer, absorbing the light in the active layer, and increasing a current flowing through the photodetector;
wherein the organic electron trapping particles modify energy band levels near an interface between the active layer and at least one of the anode or cathode, resulting in photoconductive gain such that a number of charges collected at the anode or cathode is larger than a number of photons detected by the photodetector.

2. The method of claim 1 in which the active layer has a thickness in a range between 100 nm to 500 nm.

3. The method of claim 2 in which the electron donor material and the first electron acceptor material are selected to enable the photodetector to detect UV light and visible light.

4. The method of claim 1 in which the active layer has a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

5. The method of claim 4 in which detecting light comprises detecting light having a wavelength greater than the second wavelength and not detecting light having a wavelength smaller than the first wavelength.

6. The method of claim 5 in which the first wavelength is 600 nm and the second wavelength is 630 nm.

7. The method of claim 5 in which the first wavelength is 800 nm and the second wavelength is 850 nm.

8. The method of claim 1 in which the active layer has a thickness in a range between 3 µm to 4 µm.

9. The method of claim 8 in which the electron donor material and the first electron acceptor material are selected to enable the photodetector to detect light having a wavelength in a range from 630 nm to 800 nm and have negligible response to light having a wavelength in a range from 400 nm to 600 nm.

10. The method of claim 9 in which the electron donor material comprises poly(3-hexylthiophene) (P3HT) and the first electron acceptor material comprises [6,6]-phenyl C61-butyric acid methyl ester (PCBM).

11. The method of claim 10 in which the active layer comprises cadmium tellurium quantum dots.

12. The method of claim 11, comprising upon absorbing light at the active layer, producing electrons and holes from an interaction of the light and materials in the active layer, and trapping the electrons using the cadmium telluride quantum dots.

13. The method of claim 11 in which the photodetector has a peak external quantum efficiency that is greater than 100%.

14. The method of claim 8 in which the electron donor material and the first electron acceptor material are selected to enable the photodetector to detect light having a wavelength in a range from 850 nm to 950 nm and have negligible response to light having a wavelength in a range from 400 nm to 800 nm.

15. The method of claim 14 in which the electron donor material comprises poly[2,7-(5,5-bis-(3,7-dimethyloctyl)-5H-dithieno[3,2-b:2',3'-d]pyran)-alt-4,7-(5,6-difluoro-2,1,3-benzothia diazole)] (PDTP-DFBT) and the first electron acceptor material comprises phenyl-C71-butyric-acid-methyl ester ($PC_{71}BM$).

16. The method of claim 15 in which the active layer comprises lead sulfide quantum dots.

17. The method of claim 16, comprising upon absorbing light at the active layer, producing electrons and holes from an interaction of the light and materials in the active layer, and trapping the holes using the lead sulfide quantum dots.

18. The method of claim 15 in which an external quantum efficiency spectrum of the photodetector has a peak at about 890 nm.

19. The method of claim 8 in which the photodetector has a peak external quantum efficiency that is greater than 100% with a full-width at half-maxima of less than 100 nm.

20. The method of claim 8 in which the photodetector has a peak external quantum efficiency that is greater than 100% with a full-width at half-maxima of less than 50 nm.

21. The method of claim 1, comprising reducing a dark current of the photodetector when there is no light by using a first buffer layer to block conduction of electrons, the first buffer layer being disposed between the active layer and the anode, and using a second buffer layer to block conduction of holes, the second buffer layer being disposed between the active layer and the cathode.

22. A method of operating a photodetector, the method comprising:
providing a bias voltage from a power supply, and applying the bias voltage across a cathode and an anode of a photodetector, the photodetector having an active layer disposed between the cathode and the anode, the active layer comprising an electron donor material, a first electron acceptor material, and a second material that includes organic charge trapping particles that electrons;
when the photodetector is not illuminated by light, operating the photodetector in a first mode comparable to a photodiode having a rectifying Schottky contact; and
when the photodetector is illuminated by light, operating the photodetector in a second mode comparable to a photoconductor having an Ohmic contact.

23. The method of claim 22 in which the active layer has a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

24. The method of claim 23, comprising detecting light having a wavelength greater than the second wavelength and not detecting light having a wavelength smaller than the first wavelength.

25. The method of claim 24 in which the first wavelength is 600 nm and the second wavelength is 630 nm.

26. The method of claim 24 in which the first wavelength is 800 nm and the second wavelength is 850 nm.

27. The method of claim 22 in which the second material comprises lead sulfide (PbS) quantum dots.

28. The method of claim 27, comprising upon absorbing light at the active layer, producing electrons and holes from an interaction of the light and materials in the active layer, and trapping the holes using the lead sulfide quantum dots.

29. The method of claim 22 in which the second material comprises cadmium telluride (CdTe) quantum dots.

30. The method of claim 29, comprising upon absorbing light at the active layer, producing electrons and holes from an interaction of the light and materials in the active layer, and trapping the electrons using the cadmium telluride (CdTe) quantum dots.

31. The method of claim 22, comprising, when the photodetector is illuminated by light, transmitting the light through the anode to the active layer, absorbing the light in the active layer, and increasing a current flowing through the photodetector.

32. The method of claim 22, comprising, when the photodetector is not illuminated by light, reducing a dark current of the photodetector by using a first buffer layer to block conduction of electrons, the first buffer layer being disposed between the active layer and the anode, and using a second buffer layer to block conduction of holes, the second buffer layer being disposed between the active layer and the cathode.

33. The method of claim 22 in which the electron donor material comprises poly(3-hexylthiophene) (P3HT), and the first electron acceptor material comprises [6,6]-phenyl C61-butyric acid methyl ester (PCBM).

34. The method of claim 22 in which the electron donor material comprises poly[2,7-(5,5-bis-(3,7-dimethyloctyl)-5H-dithieno[3,2-b:2',3'-d]pyran)-alt-4,7-(5,6-difluoro-2,1,3-benzothia diazole)] (PDTP-DFBT) and the first electron acceptor material comprises phenyl-C71-butyric-acid-methyl ester ($PC_{71}BM$).

35. An apparatus comprising:
a power supply to provide a bias voltage; and
a photodetector comprising:
an anode;
a cathode, in which the power supply is configured to apply the bias voltage across the anode and the cathode;
an active layer disposed between the anode and the cathode, the active layer comprising an electron donor material, a first electron acceptor material, and a second material that includes organic electron trapping particles;
a first buffer layer disposed between the active layer and the anode; and
a second buffer layer disposed between the active layer and the cathode, in which the first buffer layer blocks conduction of electrons and the second buffer layer blocks conduction of holes to reduce a dark current through the photodetector when the photodetector is not illuminated by light.

36. The apparatus of claim 35 in which the active layer has a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

37. The apparatus of claim 36 in which the photodetector is configured to detect light having a wavelength greater than the second wavelength and not detect light having a wavelength smaller than the first wavelength.

38. The apparatus of claim 37 in which the first wavelength is 600 nm and the second wavelength is 630 nm.

39. The apparatus of claim 37 in which the first wavelength is 800 nm and the second wavelength is 850 nm.

40. The apparatus of claim 35 in which the at least electron trapping particles comprises lead sulfide (PbS) quantum dots.

41. The apparatus of claim 35 in which the electron donor material comprises poly(3-hexylthiophene) (P3HT), and the first electron acceptor material comprises [6,6]-phenyl C61-butyric acid methyl ester (PCBM).

42. The apparatus of claim 35 in which the electron donor material comprises poly[2,7-(5,5-bis-(3,7-dimethyloctyl)-5H-dithieno[3,2-b:2',3'-d]pyran)-alt-4,7-(5,6-difluoro-2,1,3-benzothia diazole)] (PDTP-DFBT), and the first electron acceptor material comprises phenyl-C71-butyric-acid-methyl ester ($PC_{71}BM$).

43. The apparatus of claim 35 in which the second material comprises lead sulfide quantum dots and the photodetector has a peak external quantum efficiency that is greater than 100% with a full-width at half-maxima of less than 100 nm.

44. The apparatus of claim 35 in which the second material comprises lead sulfide quantum dots and the photodetector has a peak external quantum efficiency that is greater than 100% with a full-width at half-maxima of less than 50 nm.

45. The apparatus of claim 35 in which the second material comprises cadmium telluride quantum dots and the photodetector has a peak external quantum efficiency that is greater than 100%.

46. The apparatus of claim 35 in which the photodetector is configured to detect light having a wavelength in a range from about 630 nm to 900 nm and disregard light having a wavelength from about 400 nm to about 600 nm.

47. The apparatus of claim 35 in which the first buffer layer comprises at least one of an organic materials, self-assembled monolayers (SAMs), poly(3,4-ethylenedioxithiophene) (PEDOT) doped with poly(styrene sulfonicacid) (PSS), 4,4'-bis[(ptrichlorosilylpropylphenyl)phenylamino] biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctyl-fluorene)-co-N-(4-(1-methylpropyl)phenyl)diphenylamine] (PFT), 4,4'-bis[(p-trichlorosilylpropylphenyl) phenylamino] biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, $Cu_2O$, CuSCN/P3HT, or Au nanoparticles.

48. The apparatus of claim 35 in which the second buffer layer comprises at least one of LiF, $LiCoO_2$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFP-NBr), or poly(ethylene oxide) (PEO).

49. An apparatus comprising:
a power supply to provide a bias voltage; and
a photodetector array comprising:
a plurality of anode lines that are individually selectable;
a plurality of cathode lines that are individually selectable, in which the power supply is configured to apply the bias voltage across a selected anode line and a selected cathode line; and
an active layer disposed between the anode lines and cathode lines, the active layer comprising an electron donor material, a first electron acceptor material, and a second material that includes organic trapping particles, in which each intersection of one of the anode lines and one of the cathode lines form an individually selectable photodetector.

50. The apparatus of claim 49 in which the active layer has a thickness that is greater than a sum of a first penetration depth and a first charge drift length, and smaller than a sum of a second penetration depth and a second charge drift length, in which the first penetration depth corresponds to a distance that light having a wavelength smaller than a first wavelength that passes the anode can penetrate into the active layer, the first charge drift length corresponds to a distance that charge carriers generated by the light having a wavelength smaller than the first wavelength can travel before recombination, the second penetration depth corresponds to a distance that light having a wavelength greater than a second wavelength that passes the anode can penetrate into the active layer, and the second charge drift length corresponds to a distance that charge carriers generated by the light having a wavelength greater than the second wavelength can travel before recombination.

51. The apparatus of claim 50 in which the photodetector array is configured to detect light having a wavelength greater than the second wavelength and not detect light having a wavelength smaller than the first wavelength.

52. The apparatus of claim 51 in which the first wavelength is 600 nm and the second wavelength is 630 nm.

53. The apparatus of claim 51 in which the first wavelength is 800 nm and the second wavelength is 850 nm.

54. The apparatus of claim 49 in which the at least one of electron trapping particles or hole trapping particles comprises at least one of cadmium telluride (CdTe) quantum dots or lead sulfide (PbS) quantum dots.

55. The apparatus of claim 49, comprising:
a first buffer layer disposed between the active layer and the anode lines; and
a second buffer layer disposed between the active layer and the cathode lines, the first buffer layer having a higher hole conductivity compared to that of the second buffer layer, the second buffer layer having a higher electron conductivity compared to that of the first buffer layer.

56. The apparatus of claim 49, comprising a controller configured to receive an address signal and select one of the photodetectors based on the address signal.

* * * * *